(12) United States Patent
Kim et al.

(10) Patent No.: US 11,353,932 B2
(45) Date of Patent: Jun. 7, 2022

(54) HINGE MODULE INCLUDING DETENT STRUCTURE AND FOLDABLE ELECTRONIC DEVICE INCLUDING THE HINGE MODULE

(71) Applicant: Samsung Electronics Co., Ltd., Gyeonggi-do (KR)

(72) Inventors: Jongyoon Kim, Gyeonggi-do (KR); Jungjin Kim, Gyeonggi-do (KR); Chungkeun Yoo, Gyeonggi-do (KR); Jongmin Kang, Gyeonggi-do (KR); Suman Lee, Gyeonggi-do (KR); Hyunggeun Lee, Gyeonggi-do (KR)

(73) Assignee: Samsung Electronics Co., Ltd

( * ) Notice: Subject to any disclaimer, the term of this patent is extended or adjusted under 35 U.S.C. 154(b) by 303 days.

(21) Appl. No.: 16/793,758

(22) Filed: Feb. 18, 2020

(65) Prior Publication Data
US 2020/0267244 A1 Aug. 20, 2020

(30) Foreign Application Priority Data

Feb. 19, 2019 (KR) .................. 10-2019-0019560
May 28, 2019 (KR) .................. 10-2019-0062226

(51) Int. Cl.
*G06F 1/16* (2006.01)
*H04M 1/02* (2006.01)
(Continued)

(52) U.S. Cl.
CPC ............. *G06F 1/1681* (2013.01); *E05D 7/00* (2013.01); *E05D 11/1064* (2013.01);
(Continued)

(58) Field of Classification Search
CPC .... G06F 1/1641; G06F 1/1652; G06F 1/1681; H04M 1/022; H04M 1/0268; H05K 5/0226; E05D 7/00; E05D 11/1064
See application file for complete search history.

(56) References Cited

U.S. PATENT DOCUMENTS 6,952,340 B2 10/2005 Son et al.
8,854,834 B2 10/2014 O'Connor et al.
(Continued)

FOREIGN PATENT DOCUMENTS

CA 2 193 056 6/1997
CA 2 756 821 5/2012
(Continued)

OTHER PUBLICATIONS

International Search Report dated Jun. 10, 2020 issued in counterpart application No. PCT/KR2020/002101, 9 pages.
(Continued)

*Primary Examiner* — Nidhi Thaker
(74) *Attorney, Agent, or Firm* — The Farrell Law Firm, P.C.

(57) ABSTRACT

A foldable electronic device includes a foldable housing including a hinge structure, a first housing structure, a second housing structure, and a hinge housing, a flexible display, and a first detent structure. The first detent structure includes a first member connected to the first housing structure, a second member connected with the second housing structure, a first ball and a second ball disposed in the first member, and an elastic member that is located in the first member between the first ball and the second ball and that presses the first ball and the second ball outward.

17 Claims, 39 Drawing Sheets

(51) Int. Cl.
  *E05D 11/10* (2006.01)
  *E05D 7/00* (2006.01)
  *H05K 5/02* (2006.01)
  *H05K 5/00* (2006.01)

(52) U.S. Cl.
  CPC .......... *G06F 1/1641* (2013.01); *G06F 1/1652* (2013.01); *H04M 1/022* (2013.01); *H04M 1/0268* (2013.01); *H05K 5/0226* (2013.01); *H05K 5/0013* (2013.01); *H05K 5/0086* (2013.01)

(56) References Cited

U.S. PATENT DOCUMENTS

| | | | |
|---|---|---|---|
| 9,173,288 | B1 | 10/2015 | Kim |
| 9,665,126 | B2 | 5/2017 | O'Connor et al. |
| 9,720,455 | B2 | 8/2017 | Jang |
| 9,784,406 | B1 | 10/2017 | Lin |
| 9,915,086 | B2 * | 3/2018 | Kato .......... E05D 11/087 |
| 9,992,888 | B2 | 6/2018 | Moon et al. |
| 10,054,990 | B1 * | 8/2018 | Harmon .......... G06F 1/1679 |
| 10,082,838 | B1 * | 9/2018 | Hong .......... E05D 7/00 |
| 10,231,347 | B2 | 3/2019 | Seo et al. |
| 10,303,223 | B2 * | 5/2019 | Park .......... E05D 3/122 |
| 10,433,438 | B2 | 10/2019 | Moon et al. |
| 10,440,840 | B2 | 10/2019 | Ochi et al. |
| 10,845,850 | B1 * | 11/2020 | Kang .......... H04M 1/022 |
| 2004/0090742 | A1 | 5/2004 | Son et al. |
| 2008/0187225 | A1 | 8/2008 | Katsuyama |
| 2009/0070961 | A1 | 3/2009 | Chung et al. |
| 2012/0120627 | A1 | 5/2012 | O'Connor et al. |
| 2012/0149438 | A1 | 6/2012 | Kwon |
| 2014/0373338 | A1 | 12/2014 | O'Connor et al. |
| 2016/0299539 | A1 | 10/2016 | Jang |
| 2018/0024596 | A1 | 1/2018 | Park et al. |
| 2018/0049329 | A1 * | 2/2018 | Seo .......... G06F 1/1641 |
| 2018/0210496 | A1 * | 7/2018 | Lin .......... H04M 1/0214 |
| 2018/0279489 | A1 | 9/2018 | Ochi et al. |
| 2018/0324964 | A1 * | 11/2018 | Yoo .......... G06F 1/1656 |
| 2019/0032380 | A1 | 1/2019 | Wu et al. |
| 2019/0380218 | A1 | 12/2019 | Moon et al. |
| 2020/0097051 | A1 * | 3/2020 | Liu .......... H04M 1/0216 |
| 2020/0409422 | A1 * | 12/2020 | Wang .......... G06F 1/1652 |

FOREIGN PATENT DOCUMENTS

| | | |
|---|---|---|
| EP | 1418487 | 5/2004 |
| EP | 3 349 422 | 7/2018 |
| EP | 2 187 350 | 5/2020 |
| JP | 2012-129968 | 7/2012 |
| KR | 10-1646690 | 8/2016 |
| KR | 1020180010557 | 1/2018 |
| KR | 2018-0018007 | 2/2018 |
| KR | 1020180029590 | 3/2018 |
| KR | 1020200067799 | 6/2020 |
| KR | 1020200091740 | 7/2020 |
| KR | 1020200117773 | 10/2020 |
| KR | 1020200129880 | 11/2020 |

OTHER PUBLICATIONS

Chinese Office Action dated Nov. 11, 2021 issued in counterpart application No. 202080015541.5, 5 pages.
Korean Notice of Allowance dated Nov. 29, 2021 issued in counterpart application No. 10-2021-0112848, 4 pages.
European Search Report dated Dec. 8, 2021 issued in counterpart application No. 20760185.7-1203, 13 pages.
European Search Report dated Dec. 10, 2021 issued in counterpart application No. 21193856.8-1203, 9 pages.
Chinese Notice of Allowance dated Jan. 26, 2022 issued in counterpart application No. 202080015541.5, 4 pages.

* cited by examiner

HINGE MODULE INCLUDING DETENT STRUCTURE AND FOLDABLE ELECTRONIC DEVICE INCLUDING THE HINGE MODULE

CROSS-REFERENCE TO RELATED APPLICATION(S)

This application is based on and claims priority under 35 U.S.C. § 119 to Korean Patent Application Nos. 10-2019-0019560 and No. 10-2019-0062226, which were filed in the Korean Intellectual Property Office on Feb. 19, 2019, and May 28, 2019, respectively, the entire disclosure of each of which is incorporated by herein reference.

BACKGROUND

1. Field

The disclosure relates generally to a foldable electronic device.

2. Description of Related Art

A portable electronic device, such as a smartphone, may provide various functions, such as a telephone call, video playback, or Internet searching, based on various types of applications. A user may want to use the aforementioned functions through a wider screen. However, portability may be inhibited with an increase in screen size. Accordingly, a foldable electronic device capable of increasing portability has been developed.

In the foldable electronic device, a hinge structure may be connected with housing structures adjacent thereto, and when the housing structures rotate through (i.e., more than) a predetermined angle, the hinge structure may perform a rotary motion while supporting the housing structures. When a plurality of hinge structures, including a plurality of gears, are applied to support hinge motions of the housing structures, the hinge motions of the housing structures may be unnatural and unpleasant for a user of the foldable electronic device. In this regard, it may be advantageous to reduce the number of hinge structures without weakening the collective force provided by the hinge structures.

SUMMARY

The present disclosure has been made to address the above-mentioned problems and disadvantages, and to provide at least the advantages described below.

An aspect of the disclosure is to provide a hinge module including a detent structure and various types of hinge structures to stably support hinge motions of housing structures, and a foldable electronic device including the hinge module.

Another aspect of the disclosure is to provide a hinge module including a detent structure for allowing a foldable electronic device to maintain a specified angle depending on hinge motions of housing structures and to provide a feeling of detent to a user to allow the user to clearly recognize the hinge motions.

Another aspect of the disclosure is to provide a foldable electronic device including the hinge module.

In accordance with an aspect of the disclosure, an electronic device is provided, which includes a foldable housing including a hinge structure, a first housing structure that is connected to the hinge structure and includes a first surface and a second surface opposite to the first surface, a second housing structure that is connected to the hinge structure and includes a third surface and a fourth surface opposite to the third surface, and a hinge housing, in which the first housing structure is foldable about the hinge structure with the second housing structure, the first surface faces the third surface in a folded state, and the first surface and the third surface face the same direction in an unfolded state. Between the folded state and the unfolded state, the first housing structure is rotatable about a first axis extending along the hinge structure and the second housing structure is rotatable about a second axis parallel to the first axis. The electronic device further includes a flexible display including a first area disposed on the first housing structure and a second area disposed on the second housing structure, in which the first area and the second area form the first surface and the third surface. In addition, the electronic device further includes a first detent structure disposed in the hinge housing, the first detent structure including a first member that is connected to the first housing structure and includes a first through-hole and a second through-hole that are aligned along a third axis that is spaced apart from and parallel to the first axis and the second axis, a second member that is connected with the second housing structure and formed to receive part of the first member in the unfolded state and includes a first recess or a first opening that faces the first through-hole and a second recess or a second opening that faces the second through-hole, a first ball coupled with the first through-hole and disposed between the first through-hole and the first recess or the first opening in the unfolded state, a second ball coupled with the second through-hole and disposed between the second through-hole and the second recess or the second opening in the unfolded state, and a first elastic member that is located in the first member between the first ball and the second ball and that presses the first ball and the second ball outward.

In accordance with another aspect of the disclosure, a hinge module to which a first housing structure and a second housing structure are connected to perform a hinge motion is provided. The hinge module includes a hinge housing and a first detent structure mounted in the hinge housing. The first detent structure includes a first plate coupling part connected with the first housing structure and a second plate coupling part connected with the second housing structure. The first plate coupling part includes a first coupling body and support portions that are connected with the first coupling body, spaced apart from each other by a predetermined distance, and have mounting areas formed in predetermined positions. The second plate coupling part includes a second coupling body, a mounting body connected to the second coupling body, fixing holes formed on opposite sides of the mounting body, mounting parts mounted in the fixing holes, and an elastic member that is mounted in the mounting body and presses the mounting parts toward the mounting areas when the first housing structure and the second housing structure are in an unfolded state.

In accordance with another aspect of the disclosure, a hinge module to which a first housing structure and a second housing structure are connected to perform a hinge motion is provided. The hinge module includes a hinge housing, a plurality of detent structures that are mounted in the hinge housing and provide a feeling of detent to a user in a specified angle range in the hinge motion of the first housing structure and the second housing structure, a first hinge structure and a second hinge structure mounted in the hinge housing and driven independently of each other, each of the first hinge structure and the second hinge structure being independently connected with the first housing structure and the second housing structure, and a third hinge structure that is mounted in the hinge housing and is connected with the first housing structure and the second housing structure and includes an interlocking gear.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
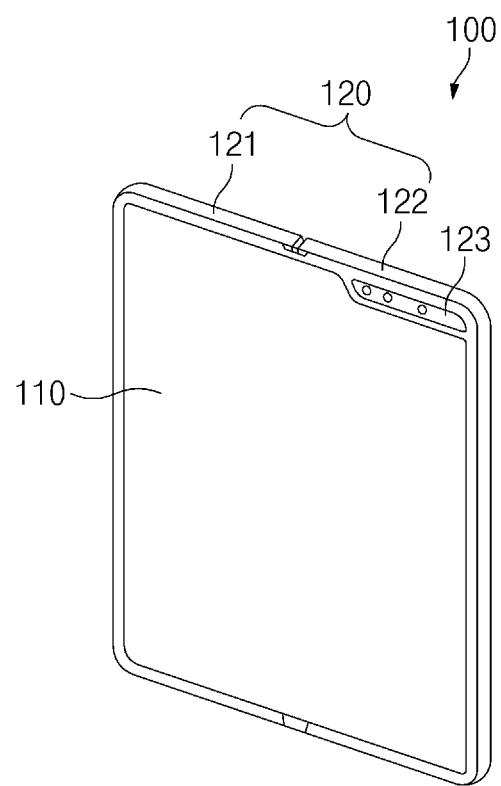
FIG. 1A is a view illustrating the front exterior of a foldable electronic device in a first state, according to an embodiment.

Hereinafter, various embodiments of the disclosure may be described with reference to accompanying drawings. Accordingly, those of ordinary skill in the art will recognize that modifications, equivalents, and/or alternatives on the various embodiments described herein can be variously made without departing from the scope and spirit of the disclosure. With regard to description of drawings, similar components may be marked by similar reference numerals.

In the disclosure, the expressions "have", "may have", "include" and "comprise", or "may include" and "may comprise" used herein indicate existence of corresponding features (e.g., components such as numeric values, functions, operations, or parts) but do not exclude presence of additional features.

In the disclosure, the expressions "A or B", "at least one of A or/and B", or "one or more of A or/and B", and the like may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used in the disclosure may be used to refer to various components regardless of the order and/or the priority and to distinguish the relevant components from other components, but do not limit the components. For example, "a first user device" and "a second user device" indicate different user devices regardless of the order or priority. For example, without departing the scope of the disclosure, a first component may be referred to as a second component, and similarly, a second component may be referred to as a first component.

It will be understood that when a component (e.g., a first component) is referred to as being "(operatively or communicatively) coupled with/to" or "connected to" another component (e.g., a second component), it may be directly coupled with/to or connected to the other component or an intervening component (e.g., a third component) may be present. In contrast, when a component (e.g., a first component) is referred to as being "directly coupled with/to" or "directly connected to" another component (e.g., a second component), it should be understood that there are no intervening component (e.g., a third component).

According to the situation, the expression "configured to" used in the disclosure may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other parts. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

Terms used in the disclosure are used to describe specified embodiments and are not intended to limit the scope of the disclosure. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of the disclosure. In some cases, even if terms are terms which are defined in the disclosure, they may not be interpreted to exclude embodiments of the disclosure.

An electronic device according to various embodiments of the disclosure may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices. According to various embodiments, the wearable device may include at least one of an accessory type (e.g., watches, rings, bracelets, anklets, necklaces, glasses, contact lens, or head-mounted-devices (HMDs)), a fabric or garment-integrated type (e.g., an electronic apparel), a body-attached type (e.g., a skin pad or tattoos), or a bio-implantable type (e.g., an implantable circuit).

Hereinafter, electronic devices according to various embodiments will be described with reference to the accompanying drawings. In the disclosure, the term "user" may refer to a person who uses an electronic device or may refer to a device (e.g., an artificial intelligence electronic device) that uses the electronic device.

Figure 1B:
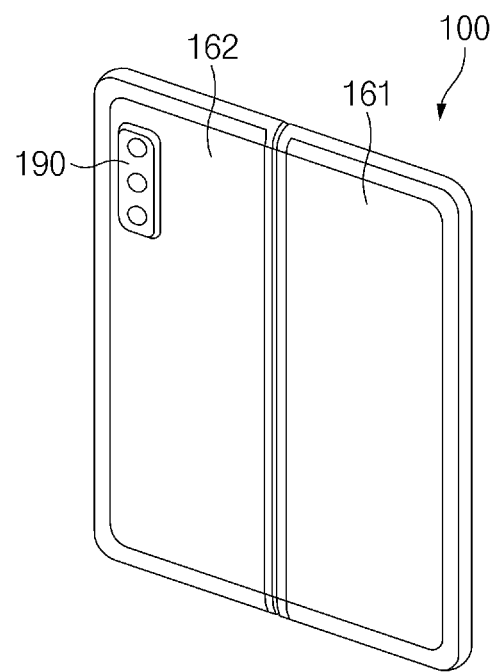
FIG. 1B is a view illustrating the rear exterior of the foldable electronic device in the first state, according to an embodiment.
Figure 1C:
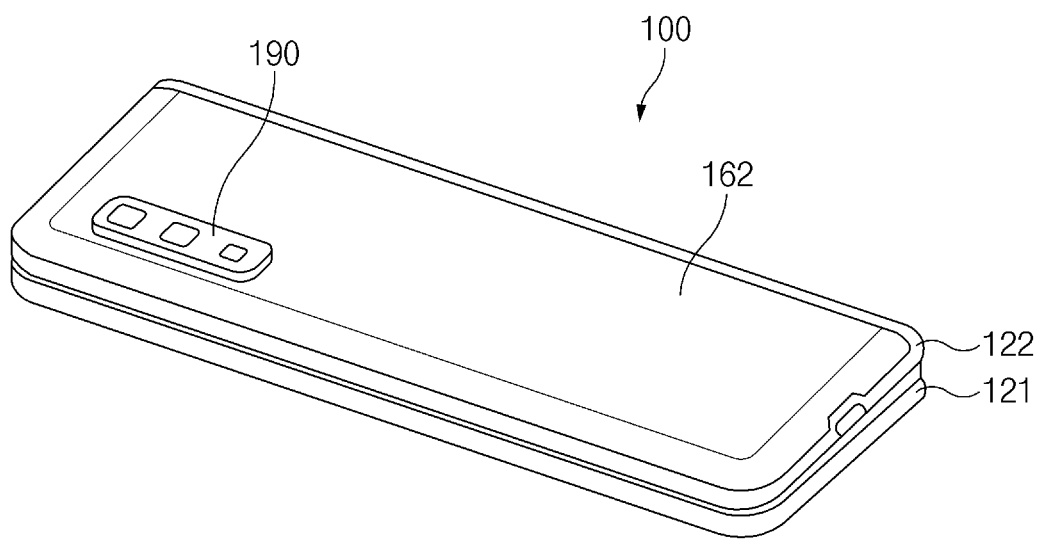
FIG. 1C is a view illustrating an example of the exterior of the foldable electronic device in a second state, according to an embodiment.
Figure 1D:
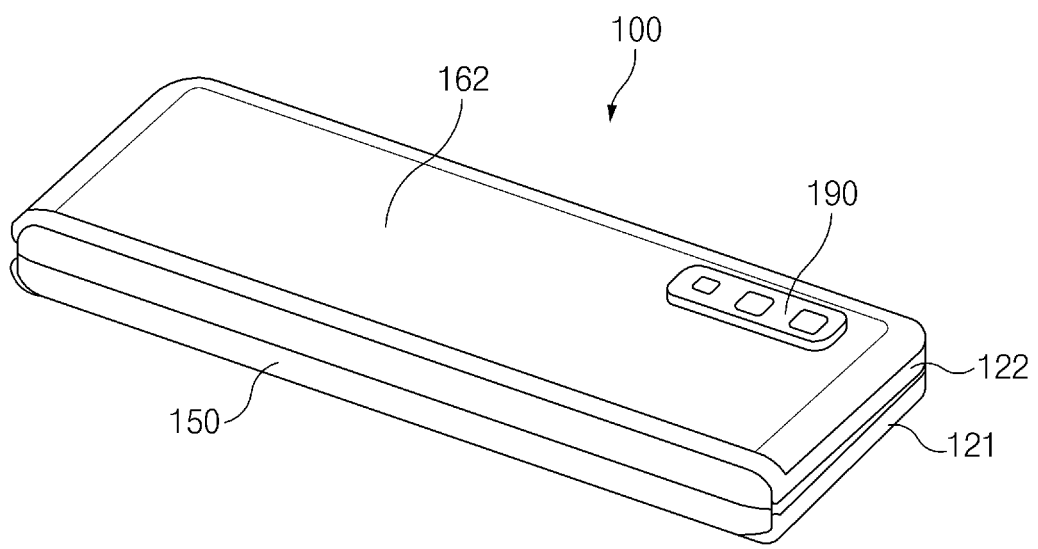
FIG. 1D is a view illustrating an example of the exterior of the foldable electronic device in the second state, according to an embodiment.

FIG. 1A is a view illustrating the front exterior of a foldable electronic device in a first state, according to an embodiment. FIG. 1B is a view illustrating the rear exterior of the foldable electronic device in the first state, according to an embodiment. FIG. 1C is a view illustrating an example of the exterior of the foldable electronic device in a second state, according to an embodiment. FIG. 1D is a view illustrating an example of the exterior of the foldable electronic device in the second state, according to an embodiment.

Referring to FIGS. 1A-1D, the foldable electronic device 100 includes a housing 120 including a first housing structure 121 and a second housing structure 122, a display 110 (e.g., a flexible display), a first cover 161, a second cover 162, a hinge housing 150 having a hinge structure disposed therein, and a sensor module 190. FIGS. 1A and 1B illustrate the front side and the rear side of the foldable electronic device 100 in the first state (e.g., a flat state or an unfolded state), and FIGS. 1C and 1D are perspective views including the upper and lower sides (e.g., the left and right sides) of the foldable electronic device 100 in the second state (e.g., a folded state).

Depending on an arrangement, the first housing structure 121 may be disposed so as to be continuous with the second housing structure 122 (e.g., when the central portion of the display 110 is flat or when the housing 120 is in a flat state), or it may be disposed side by side with the second housing structure 122. Alternatively, when the central portion of the display 110 is folded, one side of the first housing structure 121 may face one side of the second housing structure 122.

At least part of the first housing structure 121 may be formed of a metallic material, or at least part of the first housing structure 121 may be formed of a non-metallic material. For example, the first housing structure 121 may be formed of a material having a predetermined stiffness to support at least part of the display 110. One area (or a first portion) of the display 110 may be disposed on a portion of the front side of the first housing structure 121. The first housing structure 121 may have an empty space therein, or may be coupled with the first cover 161 to form an empty space. Electronic components (e.g., a printed circuit board, and/or at least one processor, at least one memory, and a battery mounted on the printed circuit board) that are required to drive the display 110 may be disposed in the empty space. The periphery of the first housing structure 121 may surround a periphery on one side of the display 110.

Depending on an arrangement, the second housing structure 122 may be disposed side by side with the first housing structure 121, or may be disposed such that at least one side of the second housing structure 122 faces one side (e.g., a side on which the display 110 is disposed) of the first housing structure 121. The second housing structure 122 may be formed of the same material as that of the first housing structure 121. The second housing structure 122 may be disposed horizontally or vertically symmetric to the first housing structure 121, and at least part of the remaining area of the display 110 other than the area disposed on the first housing structure 121 may be disposed and supported on the front side of the second housing structure 122. Similar to the first housing structure 121, the second housing structure 122 may have an empty space therein or may be coupled with the second cover 162 to form an empty space. Electronic components required to drive the display 110 may be disposed in the empty space. The periphery of the second housing structure 122 may surround a periphery on an opposite side of the display 110.

The foldable electronic device 100 may include, on one side of the second housing structure 122, a sensor arrangement area 123 in which at least one sensor associated with operating a specific function of the foldable electronic device 100 is disposed. For example, at least one of a proximity sensor, an illuminance sensor, an iris sensor, an image sensor (e.g., a camera), or a fingerprint sensor may be disposed in the sensor arrangement area 123. The sensor arrangement area 123 may be located on the rear side of the foldable electronic device 100 when the at least one sensor is disposed on the rear side of the foldable electronic device 100.

Depending on the folded or flat state of the foldable electronic device 100, the hinge housing 150 may be hidden by one side of the first housing structure 121 and one side of the second housing structure 122 (e.g., a flat state of the housing 120), or may be exposed to the outside (e.g., a folded state of the housing 120). For example, as illustrated in FIGS. 1A and 1B, the hinge housing 150 may be hidden by the first housing structure 121 and the second housing structure 122 when the first housing structure 121 and the second housing structure 122 are arranged side by side. As illustrated in FIGS. 1C and 1D, the hinge housing 150 may be exposed to the outside (e.g., to outside the foldable electronic device 100) between lateral portions of the first housing structure 121 and the second housing structure 122 when one side of the first housing structure 121 and one side of the second housing structure 122 face each other.

At least part of the display 110 may be provided in a foldable manner. The display 110 may include a first area disposed on the first housing structure 121, a second area disposed on the second housing structure 122, and a central area within a predetermined range with respect to the area adjacent to the first housing structure 121 and the second housing structure 122. At least part of the central area may be flexible.

The sensor module 190 may be disposed in a predetermined area on the rear side of the foldable electronic device 100. The sensor module 190 may include at least one of an image sensor, an illuminance sensor, a heart rate sensor, and a fingerprint sensor. In FIGS. 1B-1D, the sensor module 190 includes a plurality of image sensors. However, the disclosure is not limited thereto. The sensor module 190 may include a light emitting device (LED) (e.g., a lamp) that is associated with supporting a flash function.

Figure 2:
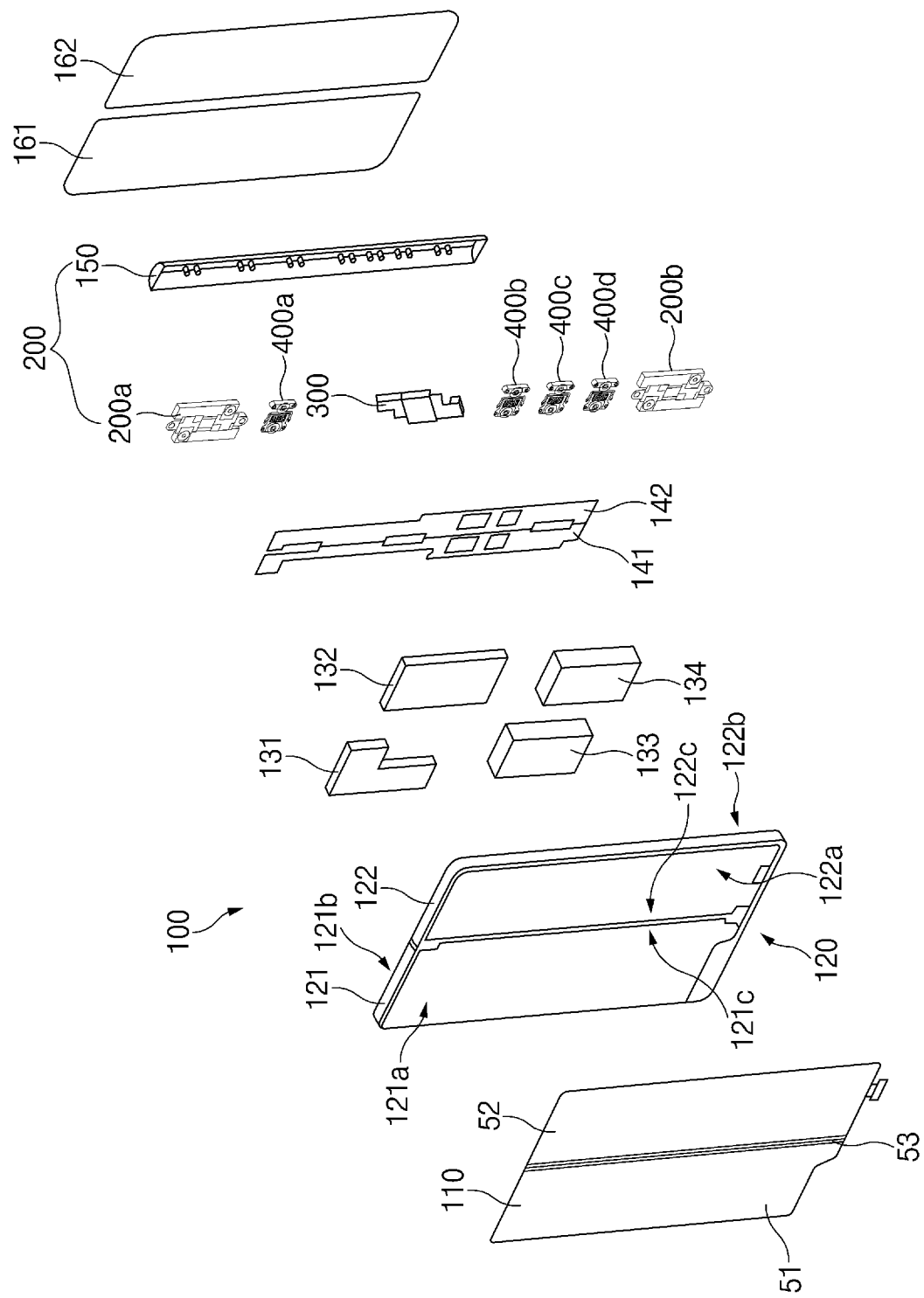
FIG. 2 is an exploded perspective view of the foldable electronic device, according to an embodiment.

FIG. 2 is an exploded perspective view of the foldable electronic device, according to an embodiment.

Referring to FIG. 2, the foldable electronic device 100 includes the display 110, the housing 120, a first printed circuit board 131 and a second printed circuit board 132, a first battery 133, a second battery 134, hinge plates 141 and 142, a hinge module 200, the first cover 161 and the second cover 162.

The display 110 includes a first area 51, a second area 52, and a central area 53. The central area 53 may include a predetermined area that is located on the central portion of the inside of the display 110 while the display 110 is folded. At least part of the first area 51 may be attached to the first housing structure 121. At least part of the second area 52 may be attached to the second housing structure 122. The central area 53 may be disposed so as not to be fixed (or attached) to the first housing structure 121 and the second housing structure 122. Accordingly, the central area 53 may be moved without being attached to the first housing structure 121 and the second housing structure 122 while the display 110 is folded or unfolded.

The first housing structure 121 includes a first surface 121a and a second surface 121b opposite to the first surface 121a, and the second housing structure 122 may include a third surface 122a and a fourth surface 122b opposite to the third surface 122a. The first housing structure 121 and the second housing structure 122 may be folded about the hinge module 200 within a specified angle range (i.e., up to a predetermined angle range). When the display 110 is folded (or the first housing structure 121 and the second housing structure 122 are stacked on each other), the third surface 122a may face the first surface 121a, and in the state in which the display 110 is unfolded, the first surface 121a and the third surface 122a may face the same direction, and a first peripheral portion 121c of the first housing structure 121 may be connected with a second peripheral portion 122c of the second housing structure 122. The display 110 (or the flexible display layer) may be disposed across at least part of the first surface 121a and at least part of the third surface 122a. The display 110 may be folded at the first peripheral portion 121c and the second peripheral portion 122c or in adjacent areas of the first peripheral portion 121c and the second peripheral portion 122c. The sensor arrangement area 123 may be disposed on one side of the second housing structure 122.

The first printed circuit board 131 may be disposed between the second surface 121b of the first housing structure 121 and the first cover 161. The second printed circuit board 132 may be disposed between the fourth surface 122b of the second housing structure 122 and the second cover 162. Alternatively, the first printed circuit board 131 and the second printed circuit board 132 may be integrated into one printed circuit board and may be disposed between the second surface 121b of the first housing structure 121 and the first cover 161 or between the fourth surface 122b of the second housing structure 122 and the second cover 162. Various electronic components required to drive the foldable electronic device 100 may be disposed on the first printed circuit board 131 and the second printed circuit board 132. For example, components, such as a memory, at least one processor, communication circuitry, an antenna, a microphone, a speaker, at least one sensor and an electronic component associated with driving the at least one sensor, and a camera, may be mounted on at least one of the first printed circuit board 131 and the second printed circuit board 132.

The first battery 133 may be disposed between the second surface 121b of the first housing structure 121 and the first cover 161. The second battery 134 may be disposed between the fourth surface 122b of the second housing structure 122 and the second cover 162. The first battery 133 and the second battery 134 may supply power required to drive the foldable electronic device 100. The first battery 133 and the second battery 134 may supply power to components, such as at least one of the first printed circuit board 131 and the second printed circuit board 132, the display 110, and at least one sensor. Although the foldable electronic device 100 includes the plurality of batteries 133 and 134, the disclosure is not limited thereto. For example, the foldable electronic device 100 may include only one battery.

The hinge plates 141 and 142 may include the first hinge plate 141 coupled with the first housing structure 121 and one side of the hinge module 200 and the second hinge plate 142 coupled with the second housing structure 122 and an opposite side of the hinge module 200. For example, one side of the first hinge plate 141 may be fixed to the periphery of the first housing structure 121 that is adjacent to the second housing structure 122, and an opposite side of the first hinge plate 141 may be fixed to a portion of each of hinge structures 200a, 300, and 200b and a portion of each of detent structures 400a, 400b, 400c, and 400d.

The detent structures 400a, 400b, 400c, and 400d may be components that allow a mechanical device to temporarily stop, or allow the mechanical device to stop at a specified pressure or less and/or operate at more than the specified pressure. The detent structures 400a, 400b, 400c, and 400d may be components that enable a mounting function at a specified (i.e., a predetermined) angle depending on hinge motions of the first housing structure 121 and the second housing structure 122. The detent structures 400a, 400b, 400c, and 400d may stop rotation of the first housing structure 121 and the second housing structure 122 when the internal angle between the first housing structure 121 and the second housing structure 122 reaches a specified angle. When a force with a specified magnitude or more is applied, the first housing structure 121 and the second housing structure 122 may be unfolded with a specified angle in a folded state or may be folded with the specified angle in a flat state.

While a user folds or unfolds the first housing structure 121 or the second housing structure 122, the force generated by folding or unfolding the housing structures 121 and 122 may be transmitted to at least a portion of each of the hinge structures 200a, 200b, and 300, and at least a portion of each of the detent structures 400a, 400b, 400c, and 400d. For example, one side of the second hinge plate 142 may be fixed to the periphery of the second housing structure 122 that is adjacent to the first housing structure 121, and an opposite side of the second hinge plate 142 may be fixed to the remaining portion of each of the hinge structures 200a, 300, and 200b and the remaining portion of each of the detent structures 400a, 400b, 400c, and 400d. The force (or pressure) applied by the user to fold or unfold the first housing structure 121 or the second housing structure 122 may be transmitted to the remaining portion of each of the hinge structures 200a, 200b, and 300 and the remaining portion of each of the detent structures 400a, 400b, 400c, and 400d.

The hinge module 200 may include the hinge housing 150, the first hinge structure 200a, the second hinge structure 200b, the third hinge structure 300, and the detent structures 400a, 400b, 400c, and 400d.

The hinge housing 150 may have a semi-cylindrical (or semi-elliptical) structure that is closed at both ends. The hinge housing 150 may have an empty space therein in which the first hinge structure 200a, the second hinge structure 200b, the third hinge structure 300, and the detent structures 400a, 400b, 400c, and 400d are mounted. The hinge housing 150 may be formed to have a length that corresponds to the length of the display 110 in the direction of one axis thereof (e.g., a long axis) or the length of the first housing structure 121 in the direction of one axis thereof (e.g., a long axis). The hinge housing 150 may have a semi-circular, semi-elliptical, or partially-curved cross-section. The hinge housing 150 may include at least one boss 151 (e.g., a protrusion for screw coupling) that is used to mount and fix at least one of the hinge structures 200a, 200b, and 300 and the detent structures 400a, 400b, 400c, and 400d.

The first hinge structure 200a may be disposed at one point of the hinge housing 150 that is symmetric to the second hinge structure 200b with respect to the central portion of the hinge housing 150. For example, the first hinge structure 200a may be disposed to be biased to an upper side with respect to the central portion of the illustrated hinge housing 150. The first hinge structure 200a may be disposed adjacent to the upper end of the hinge housing 150. A portion of the first hinge structure 200a may be fixed to the hinge housing 150, and other portions of the first hinge structure 200a may be coupled to the hinge plates 141 and 142. For example, one side of the first hinge structure 200a may be coupled with one side of the first hinge plate 141, and an opposite side of the first hinge structure 200a may be coupled to one side of the second hinge plate 142. The first hinge structure 200a may perform hinge motion to correspond to rotary motions of the hinge plates 141 and 142 coupled thereto. Two sub-hinge structures of the first hinge structure 200a may be alternately disposed and may perform hinge motions independently of hinge motions of the hinge plates 141 and 142. At least part of the first hinge structure 200a may be formed of a metallic material.

The second hinge structure 200b may be disposed at an opposite point of the hinge housing 150 that is symmetric to the first hinge structure 200a with respect to the central portion of the hinge housing 150. Alternatively, the second hinge structure 200b may be disposed to be biased to (e.g., in the direction of) a lower side with respect to the central portion of the hinge housing 150. The second hinge structure 200b may be disposed adjacent to the lower end of the hinge housing 150. A portion of the second hinge structure 200b may be fixed to the hinge housing 150, and other portions of the second hinge structure 200b may be coupled to the hinge plates 141 and 142. For example, one side of the second hinge structure 200b may be coupled with an opposite side of the first hinge plate 141, and an opposite side of the second hinge structure 200b may be coupled to an opposite side of the second hinge plate 142. The second hinge structure 200b may perform hinge motion to correspond to rotary motions of the hinge plates 141 and 142 coupled thereto. Like the first hinge structure 200a, the second hinge structure 200b may include two sub-hinge structures, and the two sub-hinge structures of the second hinge structure 200b may be alternately disposed and may perform hinge motions independently of hinge motions of the hinge plates 141 and 142. The second hinge structure 200b may be formed of the same material as that of the first hinge structure 200a. The second hinge structure 200b may have substantially the same structure and shape as the first hinge structure 200a, but may differ from the first hinge structure 200a in terms of the position on the hinge housing 150.

The third hinge structure 300 may be disposed on the central portion of the hinge housing 150. A portion of the third hinge structure 300 may be fixed to the hinge housing 150, and other portions of the third hinge structure 300 may be connected to the first hinge plate 141 and the second hinge plate 142. The third hinge structure 300 may transmit force through interlocking gears such that the first hinge plate 141 and the first housing structure 121 coupled to the first hinge plate 141 (or the second hinge plate 142 and the second housing structure 122 coupled to the second hinge plate 142) perform hinge motion together with the second hinge plate 142 and the second housing structure 122 coupled to the second hinge plate 142 (or the first hinge plate 141 and the first housing structure 121 coupled to the first hinge plate 141).

The detent structures 400a, 400b, 400c, and 400d may be disposed at predetermined positions in the hinge housing 150. The first detent structure 400a may be disposed between the first hinge structure 200a and the third hinge structure 300. The second to fourth detent structures 400b, 400c, and 400d may be disposed between the second hinge structure 200b and the third hinge structure 300.

The hinge module 200 may include one, two or more detent structures. The detent structures 400a, 400b, 400c, and 400d may have the same structure. Additionally, the detent structures 400a, 400b, 400c, and 400d may have the same structure and size, but may be disposed in different directions in the hinge housing 150.

The first cover 161 may be disposed on the rear surface of the first housing structure 121 to cover at least part of the second surface 121b of the first housing structure 121. The first cover 161 may be disposed to cover a portion of the hinge module 200 (e.g., one side of the hinge housing 150) that is disposed between the first housing structure 121 and the second housing structure 122. The first cover 161 may have rounded corners, may have an empty space inside, or may be fastened to the second surface 121b of the first housing structure 121 to form an empty space between the first housing structure 121 and the first cover 161. For example, the first cover 161 may have a structure with a rectangular bottom surface and sidewalls formed on an upper side and left and right sides of the bottom surface.

The second cover 162 may be disposed adjacent to the first cover 161 and may be fastened to the fourth surface 122b of the second housing structure 122 to cover at least part of the second housing structure 122 (e.g., at least part of the fourth surface 122b). The second cover 162 may be disposed to cover the remaining portion of the hinge structure 200 (e.g., an opposite side of the hinge housing 150) that is partly hidden by the first cover 161. The second cover 162 may have rounded corners, similar to the first cover 161. The second cover 162 may have an empty space inside, or may be fastened to the fourth surface 122b of the second housing structure 122 to form an empty space between the second housing structure 122 and the second cover 162. In this regard, the second cover 162 may have a structure with a rectangular bottom surface and sidewalls formed on a lower side, and left and right sides of the bottom surface.

Although the first hinge structure 200a and the second hinge structure 200b are disposed at the opposite ends of the hinge housing 150 with respect to the central portion of the hinge housing 150, and the third hinge structure 300 is disposed between the first hinge structure 200a and the second hinge structure 200b, the disclosure is not limited thereto. For example, one of the first hinge structure 200a or the second hinge structure 200b which does not include a separate interlocking gear may be disposed in the hinge housing 150. In the foldable electronic device 100, the first hinge structure 200a having a non-interlocking structure may be disposed at one end of the hinge housing 150, and a plurality of hinge structures in the third hinge structure 300 (e.g., an interlocking structure including interlocking gears) may be disposed in a different position (e.g., on the central portion of the hinge housing 150 or at an opposite end of the hinge housing 150).

Figure 3A:
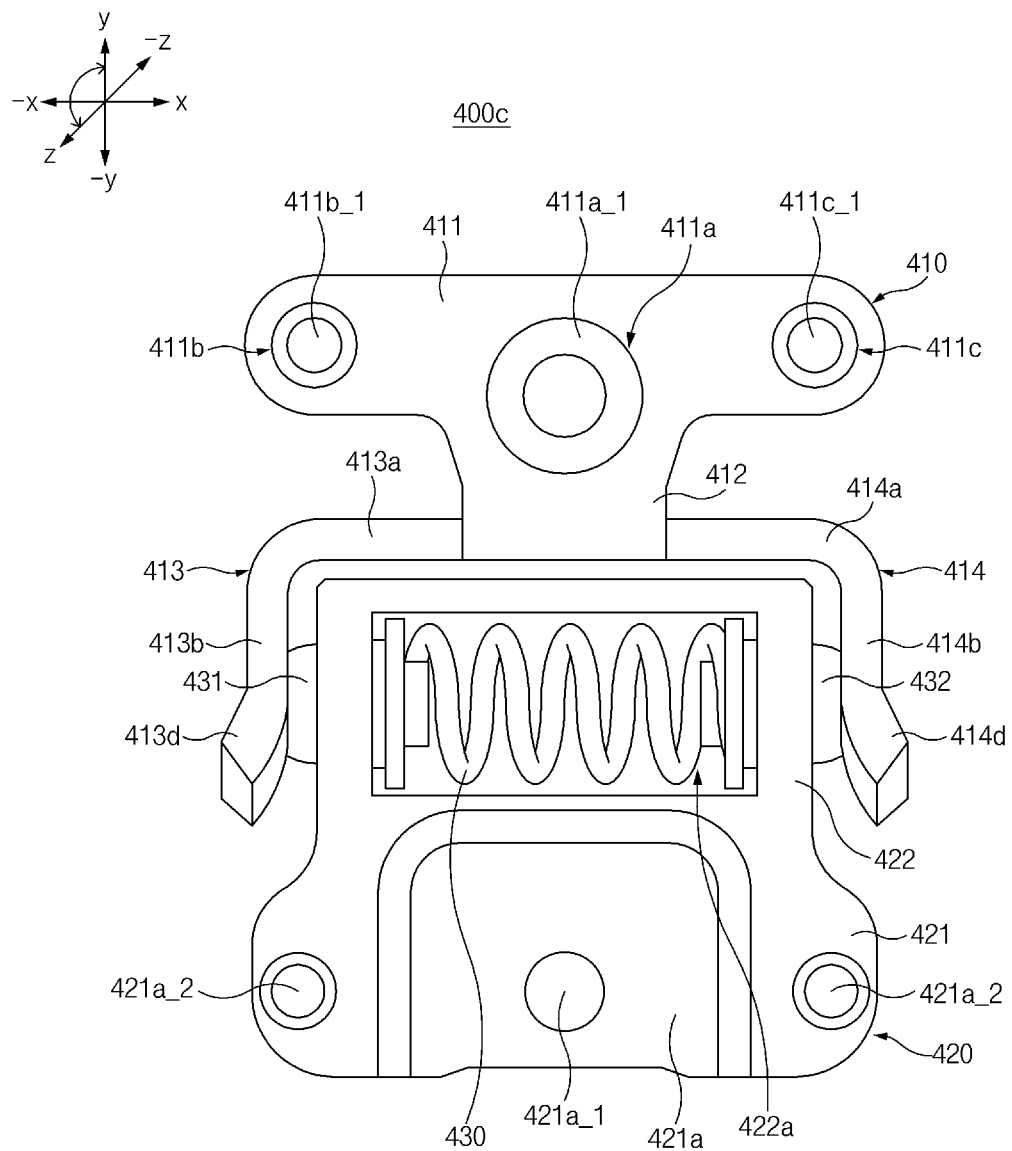
FIG. 3A is a view illustrating a detent structure, according to an embodiment.
Figure 3B:
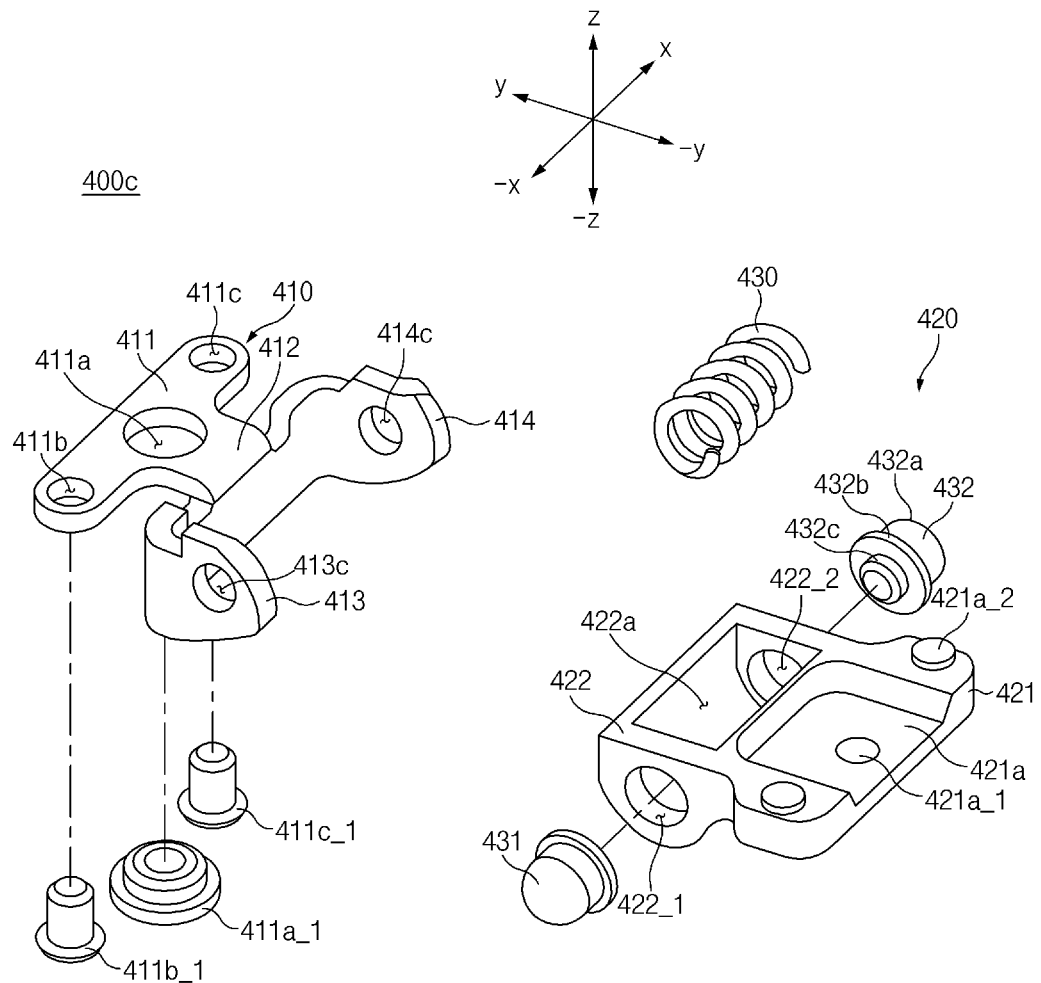
FIG. 3B is an exploded perspective view of the detent structure of FIG. 3A, according to an embodiment.
Figure 4A:
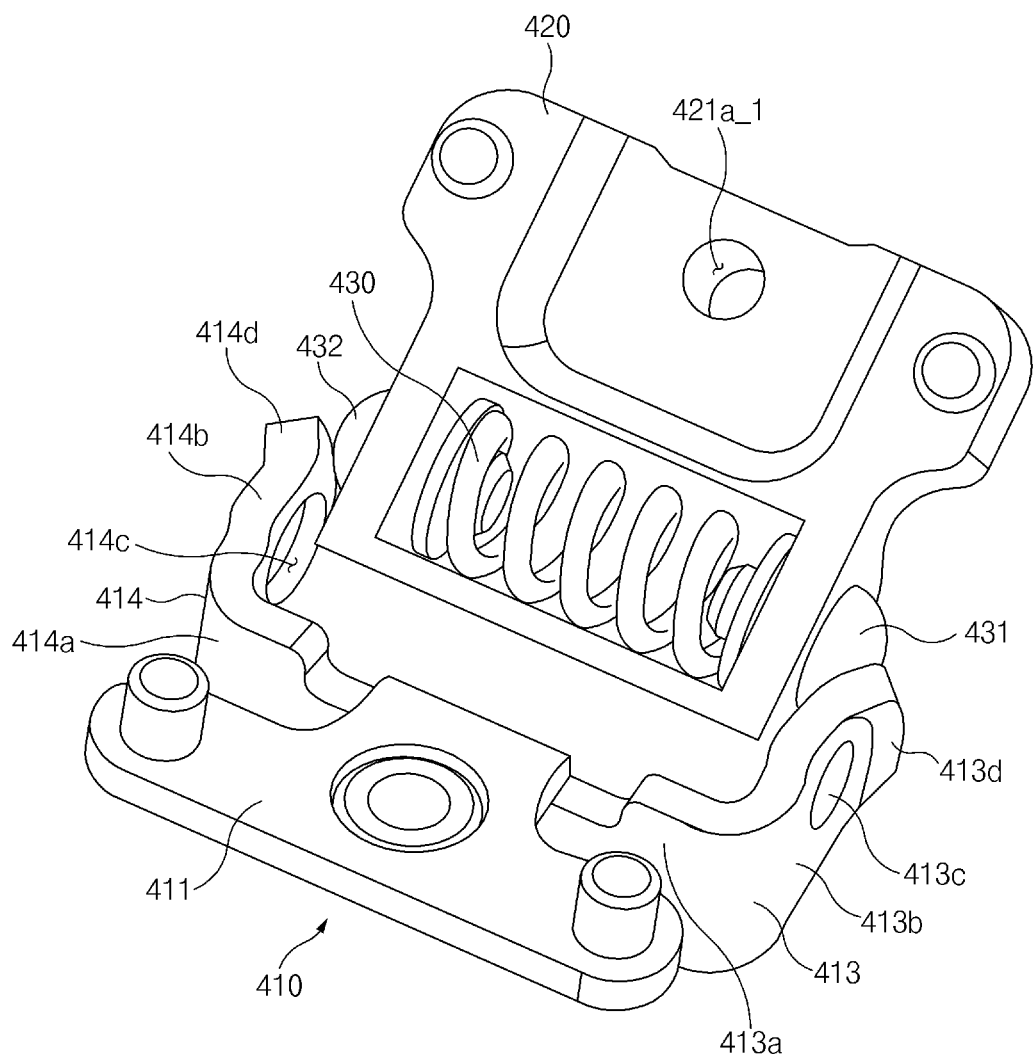
FIG. 4A is a view illustrating a detent structure forming a specified angle according to an embodiment.
Figure 4B:
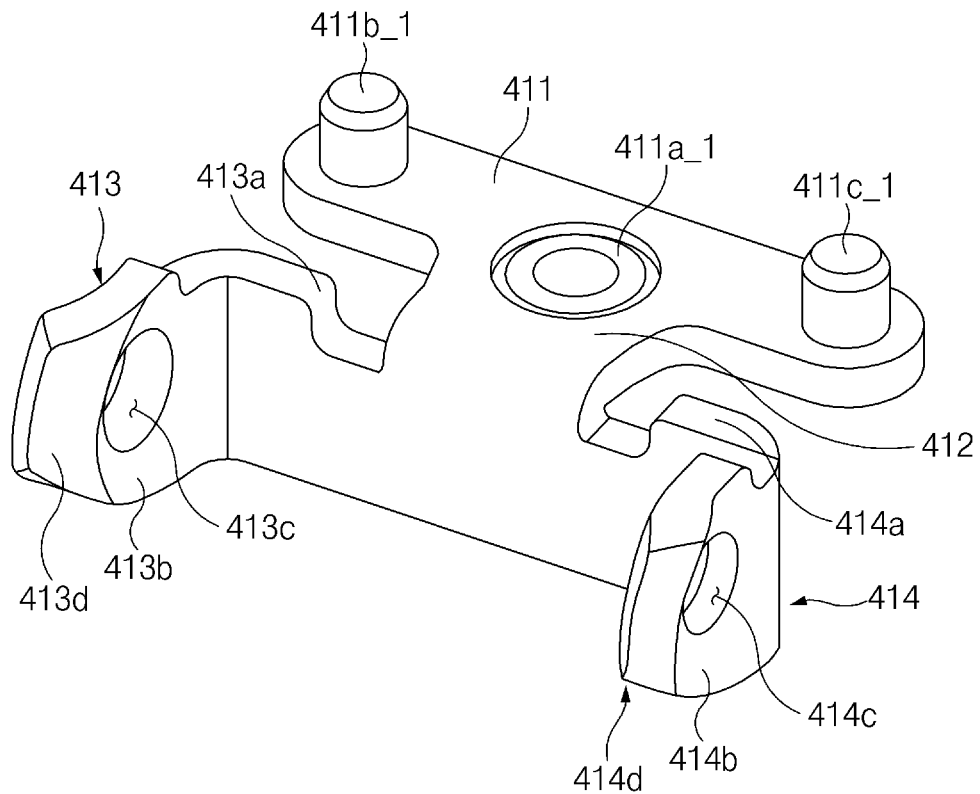
FIG. 4B is a view illustrating a first plate the coupling part of FIG. 4A, according to an embodiment.

FIG. 3A is a view illustrating a detent structure, according to an embodiment. FIG. 3B is an exploded perspective view of the detent structure of FIG. 3A, according to an embodiment. FIG. 4A is a view illustrating a state in which the detent structure forms a specified angle, according to an embodiment. FIG. 4B is a view illustrating a first plate coupling part of FIG. 4A, according to an embodiment.

Referring to FIGS. 3A-4B, the third detent structure 400c includes a first plate coupling part 410 and a second plate coupling part 420. The first detent structure 400a, the second detent structure 400b, and the fourth detent structure 400d may also include a first plate coupling part and a second plate coupling part, similar to the third detent structure 400c.

The first plate coupling part 410 may be coupled with the first housing structure 121 through the first hinge plate 141 and/or coupled with the second housing structure 122 through the second hinge plate 142. At least part of the first plate coupling part 410 may be formed of a metallic material (e.g., stainless steel (SUS), aluminum, or an alloy thereof), or at least part of the first plate coupling part 410 may be formed of a non-metallic material (e.g., a plastic material). The first plate coupling part 410 may include a first coupling body 411, a bridge 412, a first support portion 413, and a second support portion 414.

The first coupling body 411 may have, for example, a bar or rod shape with a predetermined thickness that has a first length in a first axial direction (x, -x) and a second length in a second axial direction (y, -y), and has rounded edges or corners. A first rivet hole 411b may be located in an edge region (i.e., a first edge region) of the first coupling body 411 that faces a first direction (-x), a second rivet hole 411c may be located in an edge region (i.e., a second edge region) of the first coupling body 411 that faces a second direction (x), and a first coupling hole 411a may be located in at least part of the central region of the first coupling body 411. For example, a first rivet 411b_1 may be inserted into the first rivet hole 411b, and a second rivet 411c_1 may be inserted into the second rivet hole 411c. A hole guide 411a_1 may be disposed in the first coupling hole 411a. The first rivet 411b_1 may pass through a hole formed on one side of the first hinge plate 141 (or the second hinge plate 142) and may fix the first hinge plate 141 (or the second hinge plate 142) to the first coupling body 411 by using a rivet process. The second rivet 411c_1 may pass through a hole formed on one side of the second hinge plate 142 (or the first hinge plate 141) and may fix the second hinge plate 142 (or the first hinge plate 141) to the first coupling body 411 by using a rivet process. The hole guide 411a1, after being inserted into the first coupling hole 411a, may be coupled with the first hinge plate 141 placed on the first coupling body 411.

The bridge 412 may have a specified width and may extend from the central portion of the first coupling body 411 by a predetermined length in a third direction (-y). A portion of the first coupling hole 411a may be located on one side of the bridge 412. The first support portion 413 and the second support portion 414 may be connected to an end of the bridge 412.

The first support portion 413 may include one side extending from the bridge 412 and may have an overall inverted "L" shape. The first support portion 413 may include a first wing 413a, a second wing 413b, a first mounting hole 413c, and a first curved portion 413d. The first mounting hole 413c may be formed in the shape of a through-hole or a recess. The first wing 413a may have a predetermined width and may extend from the bridge 412 in the first direction (−x). The second wing 413b may have a predetermined width and may extend from an end of the first wing 413a in the third direction (−y). The first mounting hole 413c may be formed through the second wing 413b (e.g., in the first axial direction (x, −x)) and may have a predetermined size. The first curved portion 413d may be formed in a shape that is curved with a specified curvature from an end of the second wing 413b in the first direction (−x) (e.g., in the same direction as the direction in which the first wing 413a extends from the end of the bridge 412). The first curved portion 413d may allow a first mounting part 431 to be smoothly inserted into the first support portion 413 while the first plate coupling part 410 and the second plate coupling part 420 are coupled together. The first curved portion 413d may serve to guide a movement of the first mounting part 431 toward the first mounting hole 413c while the first mounting part 413 is inserted into the first mounting hole 413c. The first plate coupling part 410 and the second plate coupling part 420 may rotate depending on rotation of the first housing structure 121 and the second housing structure 122, and therefore the first curved portion 413d may be formed to protrude, or to be curved, by a specified height in one direction (e.g., a direction inclined by a specified angle from the −y axis to the −x axis) with respect to the drawings so as to allow the first mounting part 431 to be smoothly inserted into the first support portion 413.

The second support portion 414 may extend from the bridge 412 in the second direction (x) and may have an overall "L" shape that is symmetric to the first support portion 413 with respect to the third axis (−y). The second support portion 414 may include a third wing 414a, a fourth wing 414b, a second mounting hole 414c, and a second curved portion 414d. The second mounting hole 414c may be formed in the shape of a through-hole or a recess. The third wing 414a may have a predetermined width and may extend from the end of the bridge 412 in the second direction (x). The fourth wing 414b may have a predetermined width and may extend from an end of the third wing 414a in the third direction (−y). The second mounting hole 414c may be formed through the fourth wing 414b. The second curved portion 414d may be formed at an end of the fourth wing 414b so as to be symmetric to the first curved portion 413d with respect to the third axis (−y). The fourth wing 414b and the second wing 413b may be disposed to be symmetric to each other with respect to the third axis (−y). With respect to the third axis (−y), the first curved portion 413d and the direction in which the first curved portion 413d is curved may be symmetric to the second curved portion 414d and the direction in which the second curved portion 414d is curved.

The second plate coupling part 420 may be coupled with the second housing structure 122 through the second hinge plate 142. When the first plate coupling part 410 is coupled with the second housing structure 122 through the second hinge plate 142, the second plate coupling part 420 may be coupled with the first housing structure 121 through the first hinge plate 141. The second plate coupling part 420 may be brought into contact with, or spaced apart from, the first plate coupling part 410 depending on the angle between the second housing structure 122 coupled to the second plate coupling part 420 and the first housing structure 121. At least part of the second plate coupling part 420 may be formed of a metallic material or the same material as that of the first plate coupling part 410. At least part of the second plate coupling part 420 may be formed of a metallic material, or at least part of the second plate coupling part 420 may be formed of a non-metallic material (e.g., a plastic material).

The second plate coupling part 420 includes a second coupling body 421, a mounting body 422, an elastic member 430, and mounting parts 431 and 432. The second coupling body 421 and the mounting body 422 may be integrated with each other. The second coupling body 421 and the mounting body 422 may be formed of the same material as that of the first coupling body 411 and/or the support portions 413 and 414.

The second coupling body 421 may have a predetermined thickness and width and may be formed of a predetermined material, for example, a metallic material. The second coupling body 421 may include a plate mounting portion 421a that is formed in a lower position than peripheral portions by a specified height and on which the second hinge plate 142 (or the first hinge plate 141) is mounted, a second coupling hole 421a_1 formed on the plate mounting portion 421a and used to couple the hinge plate, and coupling protrusions 421a_2 formed on the respective peripheral portions and used to couple the hinge plate, the peripheral portions being formed in a higher position than the plate mounting portion 421a by the specified height. The plate mounting portion 421a may be formed with a step by a specified depth (e.g., the thickness of the hinge plate) in one direction (−z) such that the portion to which the first hinge plate 141 or the second hinge plate 142 is coupled does not further protrude upward beyond the peripheral portions. The coupling protrusions 421a_2 may be aligned with recesses or holes formed on the first hinge plate 141 or the second hinge plate 142. The coupling protrusions 421a_2 may prevent a movement of the first hinge plate 141 or the second hinge plate 142 and, when coupling with the first hinge plate 141 or the second hinge plate 142, may guide the first hinge plate 141 or the second hinge plate 142 such that the first hinge plate 141 or the second hinge plate 142 is mounted well on the plate mounting portion 421a.

The mounting body 422 may extend from the second coupling body 421 in a fourth direction (y), and the elastic member 430 and the mounting parts 431 and 432 may be mounted in the mounting body 422. For example, the mounting body 422 may be formed with a step in the same direction (−z) as the direction in which the plate mounting portion 421a is formed with a step, such that the elastic member 430 is mounted in the mounting body 422. The mounting body 422 may be formed in a shape corresponding to the external appearance of the elastic member 430. For example, the mounting body 422 may include an elastic member mounting portion 422a, at least part of which includes a curved surface to correspond to the external appearance of the elastic member 430 in the form of a coil spring. The mounting body 422 may have, in opposite sidewalls thereof, fixing holes 422_1 and 422_2 into which the mounting parts 431 and 432 are fixedly inserted. For example, the mounting body 422 may include the first fixing hole 422_1 that is formed in the sidewall facing the first direction (−x), and may have a larger diameter than a protrusion of the first mounting part 431. The second fixing hole 422_2 that is formed in the sidewall facing the second direction (x) may have a larger diameter than a protrusion of the second mounting part 432.

The elastic member 430 may be mounted in the elastic member mounting portion 422a of the mounting body 422. The elastic member 430 may have a coil spring shape or a plate spring shape. In the elastic member mounting portion 422a, the elastic member 430 may exert elastic force such that the first mounting part 431 and the second mounting part 432 are mounted in the first direction (−x) and the second direction (x).

The mounting parts 431 and 432 may be connected to opposite sides of the elastic member 430 and may be disposed to partly protrude in the first direction (−x) and the second direction (x) through the first fixing hole 422_1 and the second fixing hole 422_2 formed in the mounting body 422. The second mounting part 432 (or the first mounting part 431) may include a protrusion 432a including a curved surface, a flange 432b that is provided at the bottom of the protrusion 432a and having a larger diameter than the second fixing hole 422_2, and/or a column 432c inserted into one side of the elastic member 430. The protrusion 432a may at least partially protrude outside the mounting body 422 through the fixing holes 422_1 and 422_2, and may be brought into contact with the first plate coupling part 410 depending on hinge motions of the housing structures 121 and 122. The flanges 432b of the mounting parts 431 and 432 may serve to support the mounting parts 431 and 432 such that the mounting parts 431 and 432 are not separated from the fixing holes 422_1 and 422_2. The columns 432c may support the elastic member 430 to prevent the mounting parts 431 and 432 from being separated from the elastic member 430 and prevent the elastic member 430 from being separated from the elastic member mounting portion 422a. At least part of at least one of the mounting parts 431 and 432 may be formed of a metallic material, or at least part of at least one of the mounting parts 431 and 432 may be formed of a non-metallic material (e.g., a plastic material).

The mounting parts 431 and 432 may be first brought into contact with the first curved portion 413d and the second curved portion 414d when being brought into contact with the first plate coupling part 410. In this state, the mounting parts 431 and 432 may remain in contact with the curved portions 413d and 414d, in the case where a specified pressure is not added. Accordingly, the first housing structure 121 and the second housing structure 122 may be temporarily fixed at a first specified angle. When the specified pressure or more is added so that the mounting parts 431 and 432 are moved into the mounting body 422 through the fixing holes 422_1 and 422_2, at least part of the second plate coupling part 420 may be moved into the first plate coupling part 410. The mounting parts 431 and 432, when aligned with the mounting holes 413c and 414c, may be at least partially inserted into the mounting holes 413c and 414c while the portions of the mounting parts 431 and 432 pushed into the mounting body 422 are moved outside the fixing holes 422_1 and 422_2 by the elastic member 430. In this case, the first housing structure 121 and the second housing structure 122 may have a flat state.

Figure 5A:
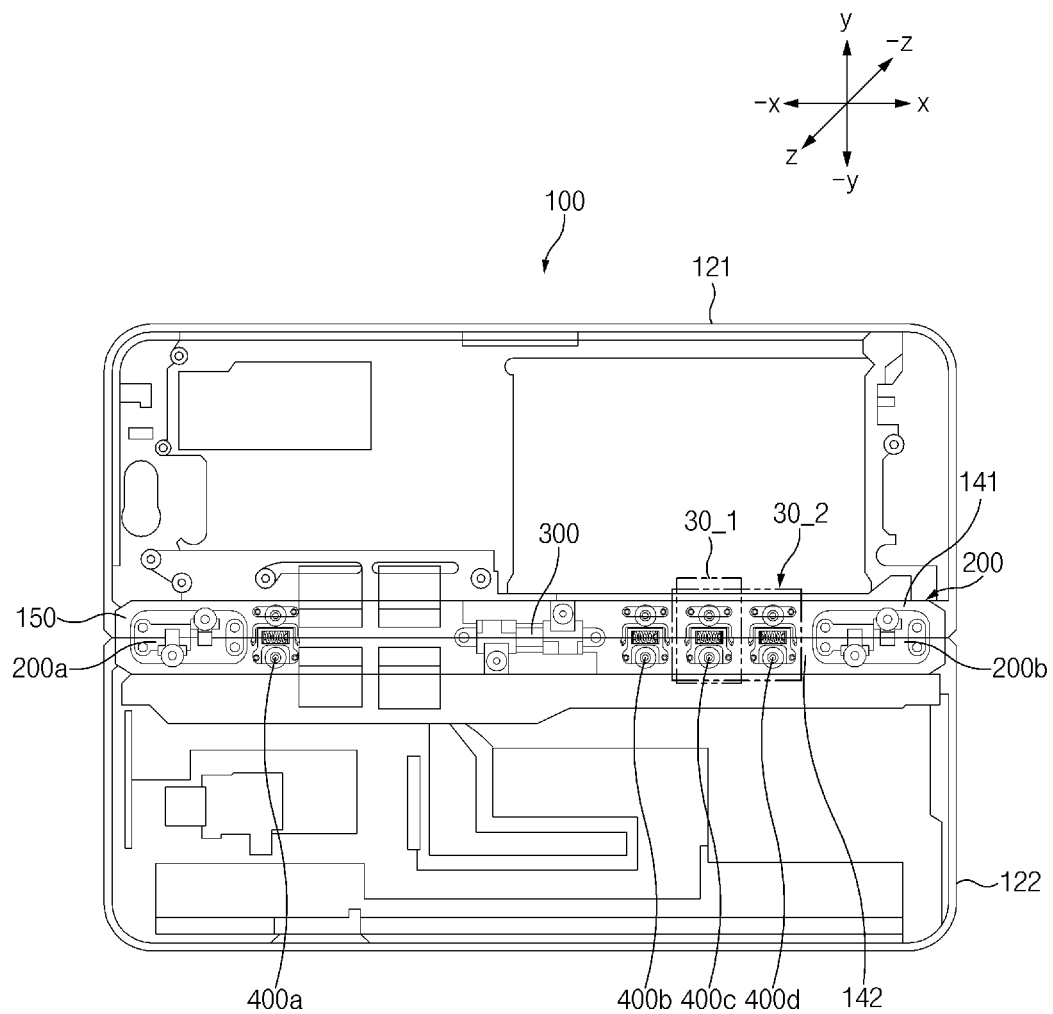
FIG. 5A is a view illustrating some components of the foldable electronic device, according to an embodiment.
Figure 5B:
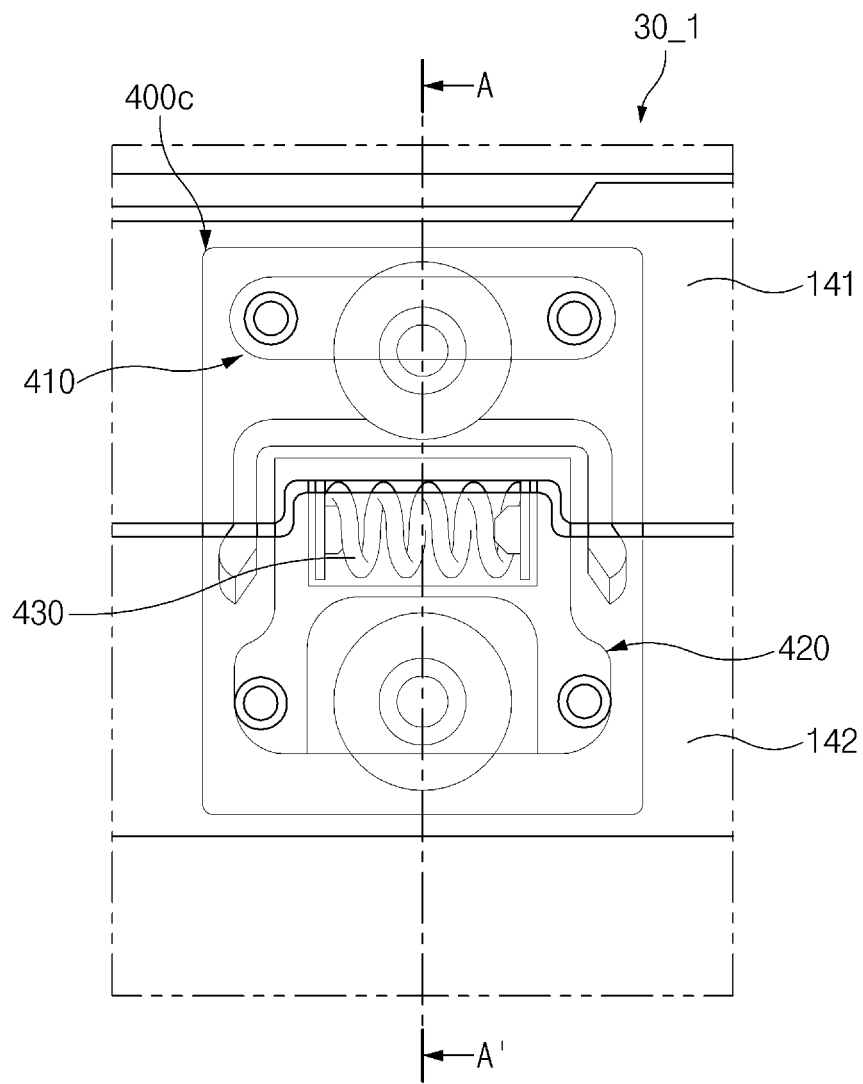
FIG. 5B is a view illustrating a specified first area of FIG. 5A, according to an embodiment.
Figure 5C:
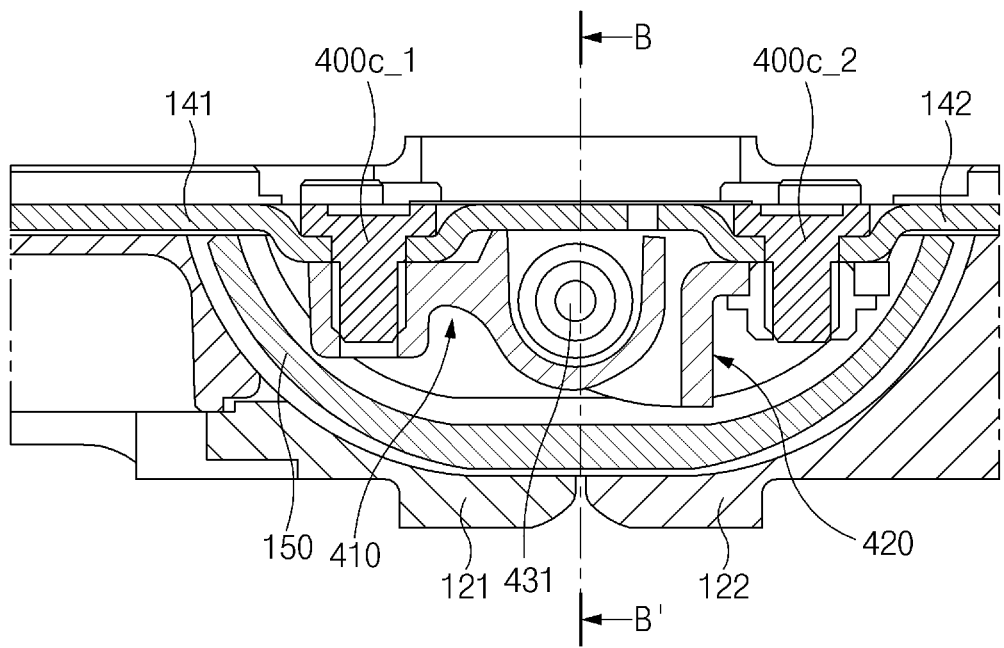
FIG. 5C is a sectional view taken along line A-A' of FIG. 5B, according to an embodiment.
Figure 5D:
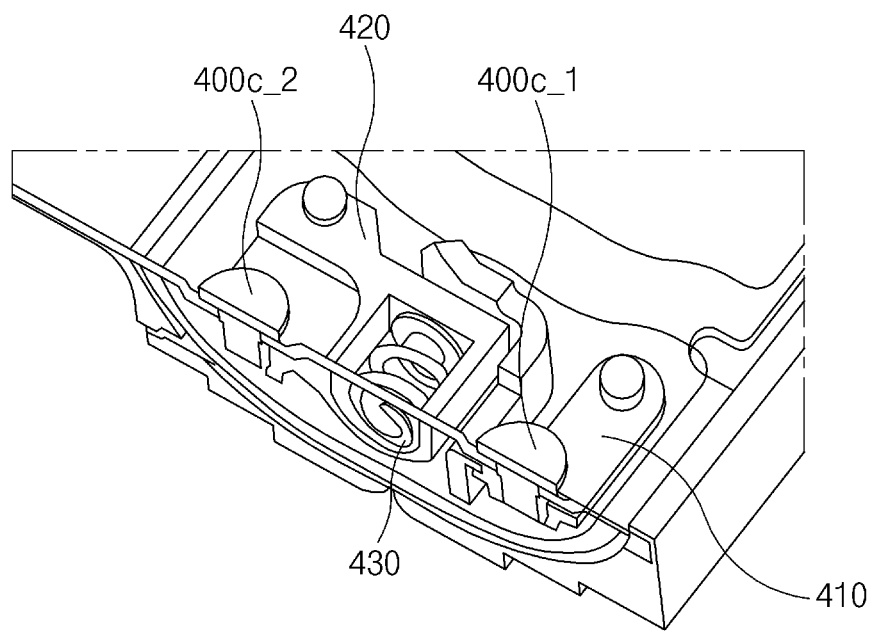
FIG. 5D is a sectional perspective view taken along line B-B' of FIG. 5C, according to an embodiment.

FIG. 5A is a view illustrating some components of the foldable electronic device, according to an embodiment. FIG. 5B is a view illustrating a specified first area 30_1 of FIG. 5A, according to an embodiment. FIG. 5C is a sectional view taken along line A-A' of FIG. 5B, according to an embodiment. FIG. 5D is a sectional perspective view taken along line B-B' of FIG. 5C, according to an embodiment.

Referring to FIG. 5A, the foldable electronic device 100 includes the first housing structure 121, the second housing structure 122, and the hinge module 200. The foldable electronic device 100 illustrated in FIG. 5A exemplifies a form in which the display 110 is removed from the foldable electronic device 100 described above with reference to FIG. 1A.

The first housing structure 121 may be coupled with the first hinge plate 141. The first housing structure 121 may be disposed on one side of the hinge module 200, for example, on an upper side with respect to FIG. 5A. The printed circuit board 131 or the battery 133 described above with reference to FIG. 2 may be mounted in the first housing structure 121, and the first area 51 of the display 110 may be disposed on the first housing structure 121.

The second housing structure 122 may be coupled with the second hinge plate 142. The second housing structure 122 may be disposed on an opposite side of the hinge module 200, for example, on a lower side with respect to FIG. 5A. The printed circuit board 132 or the battery 134 described above with reference to FIG. 2 may be mounted in the second housing structure 122, and the second area 52 of the display 110 may be disposed on the second housing structure 122.

The hinge module 200 may include the hinge housing 150, the first hinge structure 200a, the second hinge structure 200b, the third hinge structure 300, and the detent structures 400a, 400b, 400c, and 400d. The hinge module 200 may have a specified length in the horizontal direction and may have a semi-elliptical cross-sectional shape.

The first hinge structure 200a may be disposed on a left side with respect to FIG. 5A, and the second hinge structure 200b may be disposed on a right side. The third hinge structure 300 may be disposed between the first hinge structure 200a and the second hinge structure 200b or in the center of the hinge housing 150.

Signal wiring (e.g., a flexible printed circuit board (FPCB)) may be disposed between the first detent structure 400a and the third hinge structure 300 to electrically connect electronic components placed in the first housing structure 121 and electronic components placed in the second housing structure 122. For example, a place where the signal wiring is placed may be assigned on one side of the hinge module 200.

The first detent structure 400a may be disposed between the first hinge structure 200a and the third hinge structure 300. The second detent structure 400b, the third detent structure 400c, and the fourth detent structure 400d may be disposed between the third hinge structure 300 and the second hinge structure 200b. The first detent structure 400a may be disposed adjacent to the first hinge structure 200a. The second detent structure 400b may be disposed adjacent to the third hinge structure 300. The fourth detent structure 400d may be disposed adjacent to the second hinge structure 200b. The third detent structure 400c may be disposed between the second detent structure 400b and the fourth detent structure 400d.

The detent structures 400a, 400b, 400c, and 400d may be formed in substantially the same structure. Each of the detent structures 400a, 400b, 400c, and 400d may include a first plate coupling part 410, mounting parts 431 and 432, an elastic member 430, and a second plate coupling part 420 that is coupled with the first plate coupling part 410. Arrangements of the detent structures 400a, 400b, 400c, and 400d may differ from one another.

For example, the first detent structure 400a may be disposed in the hinge housing 150, the first plate coupling part may be fixed to the first hinge plate 141, and the second plate coupling part may be fixed to the second hinge plate 142. The second detent structure 400b may be disposed in the hinge housing 150, the first plate coupling part may be fixed to the second hinge plate 142, and the second plate coupling part may be fixed to the first hinge plate 141. The third detent structure 400c may have the same arrangement form as the first detent structure 400a. The fourth detent structure 400d may have the same arrangement form as the second detent structure 400b. The first detent structure 400a and the fourth detent structure 400d may have the same arrangement state, and the second detent structure 400b and the third detent structure 400c may have the same arrangement state. As described above, the plate coupling parts of the detent structures 400a, 400b, 400c, and 400d may be disposed in zigzags on the hinge housing 150 so as to be located in different positions, thereby providing a feeling of operation and a feeling of stability to a user.

Referring to FIGS. 5B-5D, the third detent structure 400c includes the first plate coupling part 410 mounted in the hinge housing 150 and fixed to the first hinge plate 141. For example, at least part of the first hinge plate 141 may be placed on the first plate coupling part 410, and the first hinge plate 141 and the first plate coupling part 410 may be coupled by a first coupling member 400c_1. The first coupling member 400c_1 may include a screw. As the first housing structure 121 and the first hinge plate 141 rotate, the first plate coupling part 410 may rotate together by a specified angle.

The third detent structure 400c may include the second plate coupling part 420 mounted in the hinge housing 150 and fixed to the second hinge plate 142. The second hinge plate 142 may be placed on the second plate coupling part 420, and the second hinge plate 142 and the second plate coupling part 420 may be coupled by a second coupling member 400c_2. The second plate coupling part 420 may perform a hinge motion to correspond to rotation of the second housing structure 122 and the second hinge plate 142.

In the case where the first housing structure 121 and the second housing structure 122 have a flat state, the first plate coupling part 410 and the second plate coupling part 420 may be disposed such that at least parts thereof are brought into contact with each other. In this operation, the elastic force of the elastic member 430 disposed in the second plate coupling part 420 may be exerted in the first direction (−x) or the second direction (x) of the hinge housing 150. The elastic member 430 may allow the first mounting part 431 (or the second mounting part 432) to protrude in the direction in which the second plate coupling part 420 and the first plate coupling part 410 are brought into contact with each other, and the first mounting part 431 (or the second mounting part 432) may move into the second plate coupling part 420 while being brought into contact with the wings of the first plate coupling part 410 and may thereafter be mounted in the recess or hole formed on the first plate coupling part 410. Each of the mounting parts 431 and 432 may include the column 432c on which an end of the elastic member 430 is mounted, the protrusion 432a extending from the column 432c and having at least a portion formed in a hemispherical shape and mounted on a mounting area, and the flange 432b formed between the protrusion 432a and the column 432c and configured to prevent the elastic member 430 from being separated from the fixing hole 422_2.

The plate coupling parts 410 and 420 of the detent structures 400a, 400b, 400c, and 400d may be separated from each other in the state in which the first housing structure 121 and the second housing structure 122 are folded, and the plate coupling parts 410 and 420 may be coupled together while the first housing structure 121 and the second housing structure 122 perform hinge motion from the folded state to a flat state. In this operation, the mounting parts 431 and 432 pressed in the predetermined directions by the elastic member 430 may be mounted in, or separated from, the recesses or holes, and the detent structures 400a, 400b, 400c, and 400d may provide a constant feeling of detent to a user.

Figure 6:
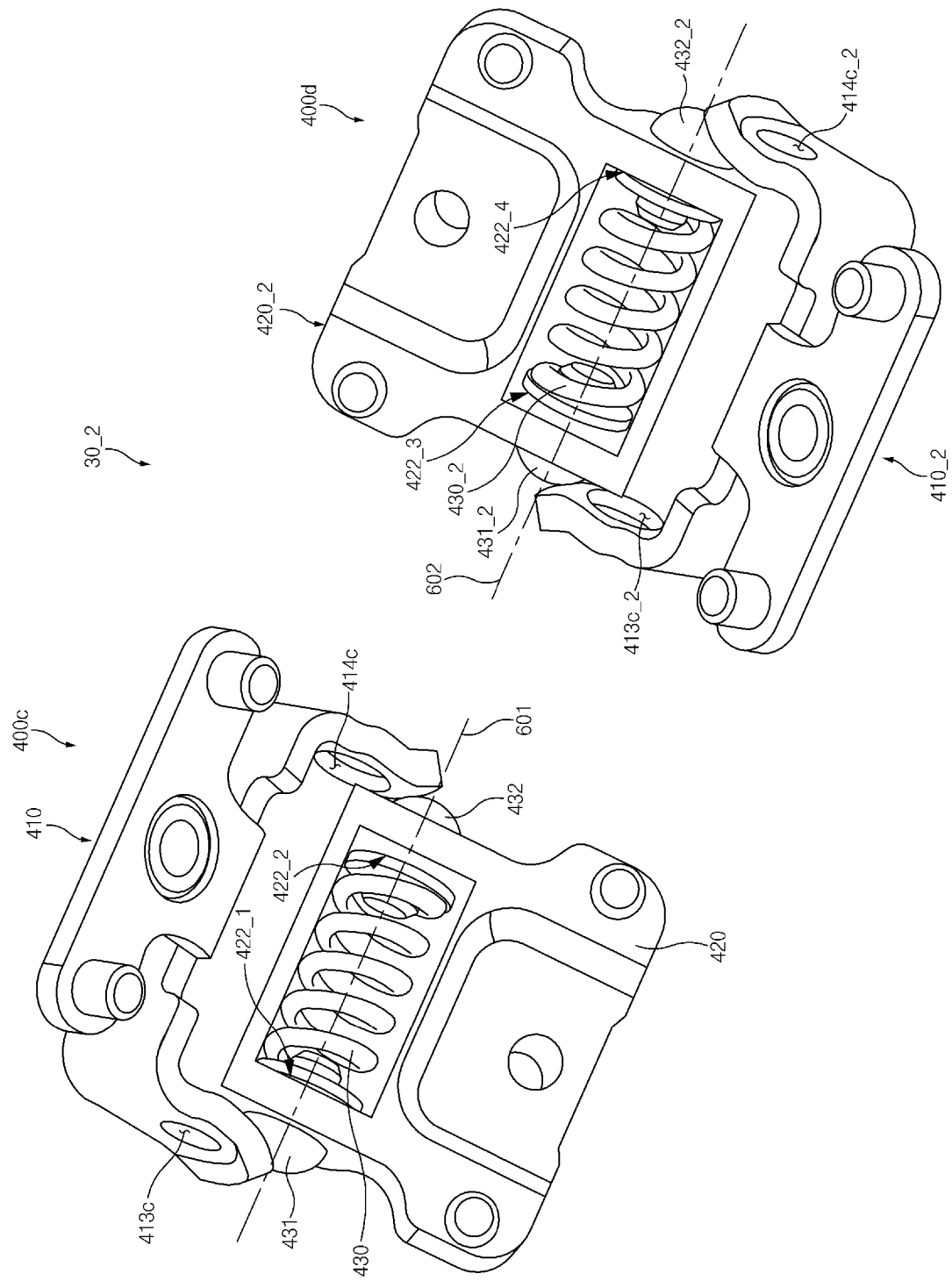
FIG. 6 is a view illustrating arrangements of a plurality of detent structures, according to an embodiment.

FIG. 6 is a view illustrating arrangements of a plurality of detent structures, according to an embodiment. FIG. 6 illustrates operational states of the detent structures 400c and 400d (e.g., corresponding to an area 30_2 of FIG. 5A) in the state in which the first housing structure 121 and the second housing structure 122 form a predetermined internal angle therebetween (e.g., 120 degrees or 140 degrees).

Referring to FIGS. 5A and 6, the hinge module 200 includes a plurality of detent structures. The plurality of detent structures included in the hinge module 200 may have arrangement states in which plate coupling parts are disposed in different positions as illustrated in FIG. 6. The fourth detent structure 400d disposed adjacent to the third detent structure 400c may include a third plate coupling part 410_2 and a fourth plate coupling part 420_2. The third plate coupling part 410_2 may have substantially the same shape or structure as the first plate coupling part 410 of the third detent structure 400c, and the fourth plate coupling part 420_2 may have substantially the same shape or structure as the second plate coupling part 420 of the third detent structure 400c. The first plate coupling part 410 of the third detent structure 400c may be disposed on an upper side with respect to FIG. 5A and may be coupled with the first hinge plate 141, and the second plate coupling part 420 may be disposed on a lower side with respect to FIG. 5A, and may be coupled with the second hinge plate 142. The third plate coupling part 410_2 of the fourth detent structure 400d may be connected to the second housing structure 122 through the second hinge plate 142, and the fourth plate coupling part 420_2 may be connected to the first housing structure 121 through the first hinge plate 141.

The first plate coupling part 410 of the third detent structure 400c may include the first mounting hole 413c and the second mounting hole 414c and may be connected to the first housing structure 121. The first mounting hole 413c and the second mounting hole 414c may be formed in the shape of a recess (e.g., a mounting recess).

The second plate coupling part 420 of the third detent structure 400c may include the first fixing hole 422_1 and the second fixing hole 422_2 and may be connected to the second housing structure 122. The second plate coupling part 420 may include a third virtual axis 601, and the third virtual axis 601 may be spaced apart from a first virtual axis about which the first housing structure 121 rotates and a second virtual axis about which the second housing structure 122 rotates and may be arranged parallel to the first fixing hole 422_1 and the second fixing hole 422_2.

The first plate coupling part 410 may include the first mounting hole 413c (or, a recess or opening) that is located in the area facing the first fixing hole 422_1 in a flat state of the housing structures 121 and 122 and the second mounting hole 414c (or, a recess or opening) that is located in the area facing the second fixing hole 422_2. The first plate coupling part 410 may have a structure in which at least part of the second plate coupling part 420 is received, and may be connected with the first housing structure 121.

In the flat state of the housing structures 121 and 122, the third detent structure 400c may include the first mounting part 431 coupled with the first fixing hole 422_1 and disposed between the first fixing hole 422_1 and the first mounting hole 413c, the second mounting part 432 coupled with the second fixing hole 422_2 and disposed between the second fixing hole 422_2 and the second mounting hole 414c, and the elastic member 430 located in the second plate coupling part 420 between the first mounting part 431 and the second mounting part 432 and configured to press the first mounting part 431 and the second mounting part 432 outward.

The fourth detent structure 400*d* may include the third plate coupling part 410_2, the fourth plate coupling part 420_2, a third mounting part 431_2, a fourth mounting part 432_2, and a second elastic member 430_2.

The fourth plate coupling part 420_2 may be connected to the first housing structure 122 and may include a third fixing hole 422_3 and a fourth fixing hole 422_4 that are arranged with respect to a fourth virtual axis 602 that is spaced apart from the first virtual axis related to hinge motion of the first housing structure 121, the second virtual axis related to hinge motion of the second housing structure 122, and the third virtual axis 601. The third plate coupling part 410_2 may include a third mounting hole 413*c*_2 (or, a recess or opening) that faces the third fixing hole 422_3 in the flat state of the housing structures 121 and 122, and a fourth mounting hole 414*c*_2 (or, a recess or opening) that faces the fourth fixing hole 422_4. The third plate coupling part 410_2 may have a structure in which at least part of the fourth plate coupling part 420_2 is received (i.e., connected with), and may be connected to the second housing structure 122. The third mounting hole 413*c*_2 and the fourth mounting hole 414*c*_2 formed in the third plate coupling part 410_2 may be formed in the shape of a mounting recess.

In the flat state of the housing structures 121 and 122, the third mounting part 431_2 may be coupled with the third fixing hole 422_3 and may be disposed between the third fixing hole 422_3 and the third mounting hole 413*c*_2. In the flat state of the housing structures 121 and 122, the fourth mounting part 432_2 may be coupled with the fourth fixing hole 422_4 and may be disposed between the fourth fixing hole 422_4 and the fourth mounting hole 414*c*_2. The second elastic member 430_2 may be located in the fourth plate coupling part 420_2 between the third mounting part 431_2 and the fourth mounting part 432_2 and may be disposed to press the third mounting part 431_2 and the fourth mounting part 432_2 outward.

When the plurality of detent structures are arranged, a plate coupling part of one detent structure that includes an elastic member may be disposed in a different position from a plate coupling part of another detent structure that includes an elastic member, and therefore the detent structures may be disposed in zigzags in the hinge housing 150 when viewed with respect to the position of the elastic members.

The detent structures 400*a*, 400*b*, 400*c*, and 400*d* may be arranged in various types of formations. For example, a first type of arrangement may be one in which the second plate coupling part 420 including the elastic member 430 is connected to the second housing structure 122 through the second hinge plate 142 and the first plate coupling part 410 including the support portions 413 and 414 surrounding at least part of the second plate coupling part 420 is connected to the first housing structure 121 through the first hinge plate 141. A second type of arrangement may be one in which the second plate coupling part 420 including the elastic member 430 is connected to the first housing structure 121 through the first hinge plate 141 and the first plate coupling part 410 including the support portions 413 and 414 surrounding at least part of the second plate coupling part 420 is connected to the second housing structure 122 through the second hinge plate 142.

In the case where the first detent structure 400*a* is arranged in the first type of arrangement, the second detent structure 400*b* is arranged in the second type of arrangement, the third detent structure 400*c* may be arranged in the first type of arrangement, and the fourth detent structure 400*d* may be arranged in the second type of arrangement.

Additionally, the first detent structure 400*a* may be arranged in the first type of arrangement, the second detent structure 400*b* may be arranged in the first type of arrangement, the third detent structure 400*c* may be arranged in the second type of arrangement, and the fourth detent structure 400*d* may be arranged in the second type of arrangement. In the case where the first detent structure 400*a* is arranged in the first type of arrangement, the second detent structure 400*b* may be arranged in the second type of arrangement, the third detent structure 400*c* may be arranged in the second type of arrangement, and the fourth detent structure 400*d* may be arranged in the first type of arrangement.

The detent structures 400*a*, 400*b*, 400*c*, and 400*d* may have different arrangements to the above-described types of arrangements. For example, the fourth detent structure 400*d* may be arranged in the first type of arrangement, the third detent structure 400*c* may be arranged in the second type of arrangement, the second detent structure 400*b* may be arranged in the first type of arrangement, and the first detent structure 400*a* may be arranged in the second type of arrangement.

The fourth detent structure 400*d* may be arranged in the first type of arrangement, the third detent structure 400*c* may be arranged in the first type of arrangement, the second detent structure 400*b* may be arranged in the second type of arrangement, and the first detent structure 400*a* may be arranged in the second type of arrangement.

The fourth detent structure 400*d* may be arranged in the second type of arrangement, the third detent structure 400*c* may be arranged in the first type of arrangement, the second detent structure 400*b* may be arranged in the first type of arrangement, and the first detent structure 400*a* may be arranged in the second type of arrangement. Additionally, The detent structures 400*a*, 400*b*, 400*c*, and 400*d* may all be arranged in the same direction (e.g., in the first type of arrangement or in the second type of arrangement).

Figure 7A:
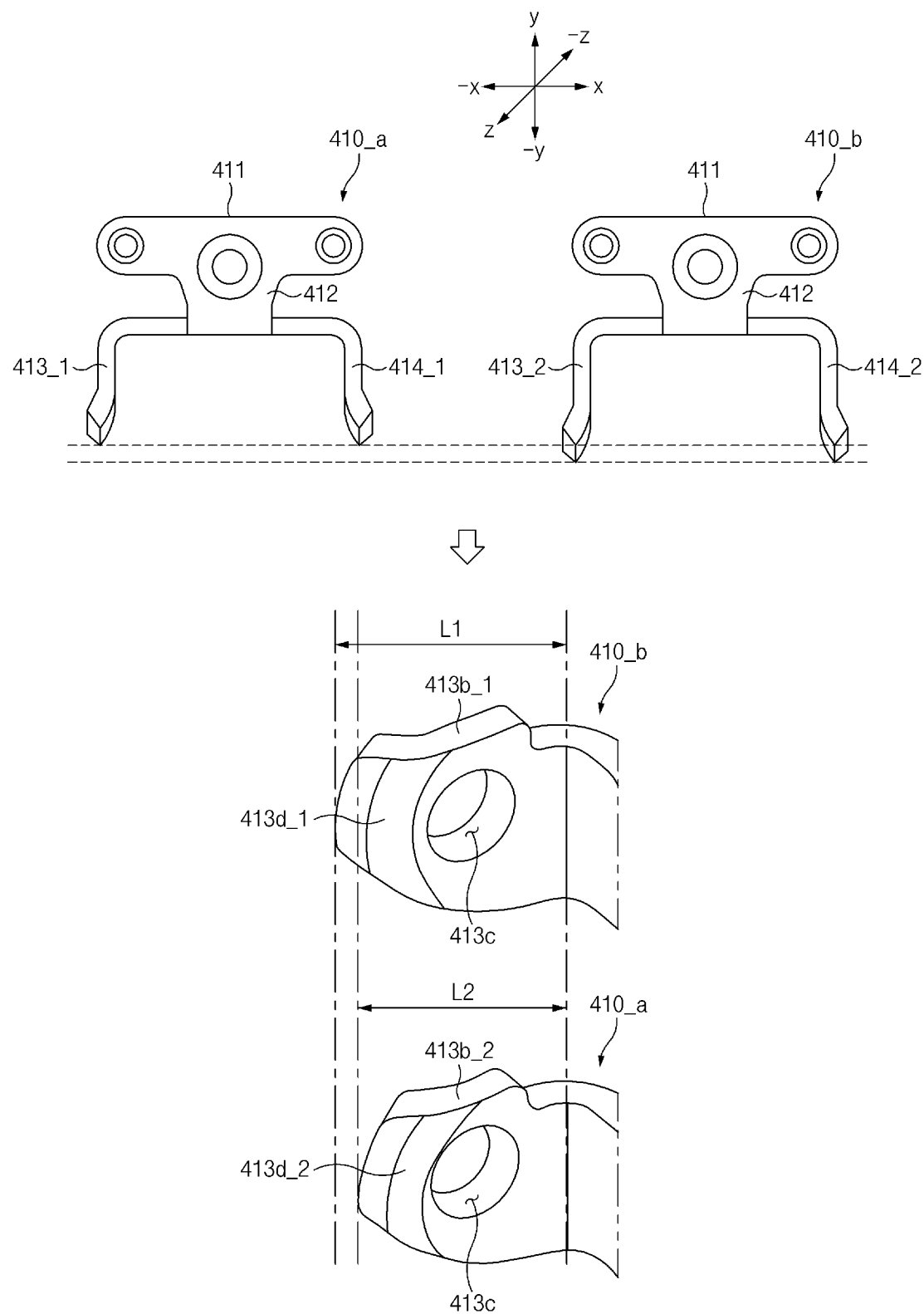
FIG. 7A is a view illustrating first plate coupling parts, according to an embodiment.
Figure 7B:
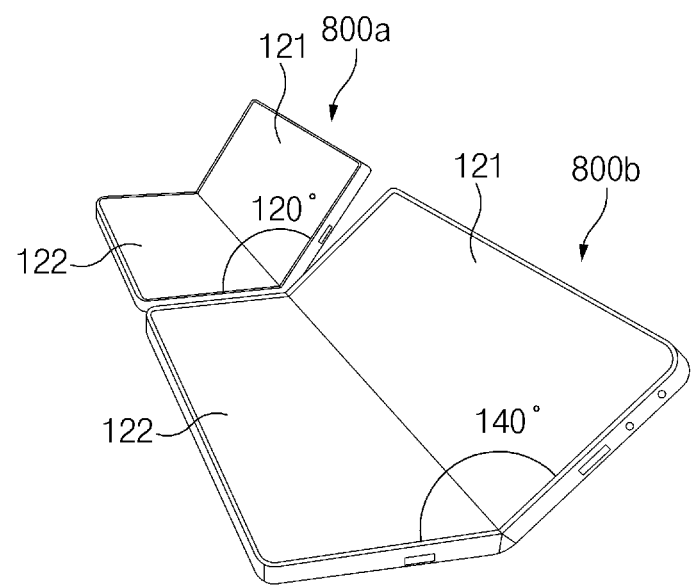
FIG. 7B is a view illustrating states in which foldable electronic devices form specified angles, according to an embodiment.

FIG. 7A is a view illustrating first plate coupling parts, according to an embodiment. FIG. 7B is a view illustrating states in which foldable electronic devices form specified angles, according to an embodiment.

Referring to FIGS. 7A-7B, a first plate coupling part 410_*a* of a first type includes the first coupling body 411, the bridge 412, a first support portion 413_1 of a first type, and/or a second support portion 414_1 of a first type. The first support portion 413_1 of the first type and the second support portion 414_1 of the first type may include a curved portion having a specified length and a specified size. The first support portion 413_1 of the first type and the second support portion 414_1 of the first type may be designed such that the internal angle between the first housing structure 121 and the second housing structure 122 of a first foldable electronic device 800*a* is equal to a first specified angle (e.g., 120 degrees) when the first support portion 413_1 of the first type and the second support portion 414_1 of the first type are brought into contact with the mounting parts 431 and 432 of the second plate coupling part 420. The first foldable electronic device 800*a* may maintain the first specified angle within a predetermined pressure, thereby providing a mounting function at a specific angle. The predetermined pressure may vary depending on the elastic force of the elastic member 430, the curvatures of the mounting parts 431 and 432 or the shapes of the mounting areas.

A first plate coupling part 410_*b* of a second type may include the first coupling body 411, the bridge 412, a first support portion 413_2 of a second type, and a second support portion 414_2 of a second type. The first coupling body 411 and the bridge 412 of the first plate coupling part 410_*b* of the second type may have a configuration the same as, or similar to, the configuration of the first coupling body 411 and the bridge 412 of the first plate coupling part 410_*a* of the first type.

The first support portion 413_2 of the second type and the second support portion 414_2 of the second type may include a curved portion having a specified length and a specified size. The first support portion 413_2 of the second type and the second support portion 414_2 of the second type may be designed such that the internal angle between the first housing structure 121 and the second housing structure 122 of a second foldable electronic device 800*b* is equal to a second specified angle (e.g., 140 degrees) when the first support portion 413_2 of the second type and the second support portion 414_2 of the second type are brought into contact with the mounting parts 431 and 432 of the second plate coupling part 420. The first support portion 413_1 of the first type (or the second support portion 414_1 of the first type) may include a curved portion 413*d*_1 of a first type with a first length L1. The first support portion 413_2 of the second type (or the second support portion 414_2 of the second type) may include a curved portion 413*d*_2 of a second type with a second length L2 (e.g., the second length L2 being shorter than the first length L1).

To differently design a temporarily fixed angle of the first foldable electronic device 800*a* including the first plate coupling part 410_*a* of the first type and a temporarily fixed angle of the second foldable electronic device 800*b* including the first plate coupling part 410_*b* of the second type, the first support portion 413_1 of the first type (or the second support portion 414_1 of the first type) may include a wing 413*b*_1 of a first type with a first length, and the first support portion 413_2 of the second type (or the second support portion 414_2 of the second type) may include a wing 413*b*_2 of a second type with a second length.

Although the wings 413*b*_1 and 413*b*_2 and the curved portions 413*d*_1 and 413*d*_2 described above have different lengths depending on the types thereof, the disclosure is not limited thereto. In the first foldable electronic device 800*a* temporarily fixed at the first specified angle and the second foldable electronic device 800*b* temporarily fixed at the second specified angle, at least one of the wings 413*b*_1 and 413*b*_2 and the curved portions 413*d*_1 and 413*d*_2 may be implemented in a different form. In this case, the time when the mounting parts 431 and 432 are brought into contact with the curved portions 413*d*_1 and 413*d*_2 may vary depending on the lengths of the support portions, and therefore the temporarily fixed angles of the foldable electronic devices 800*a* and 800*b* may be implemented differently.

Figure 8A:
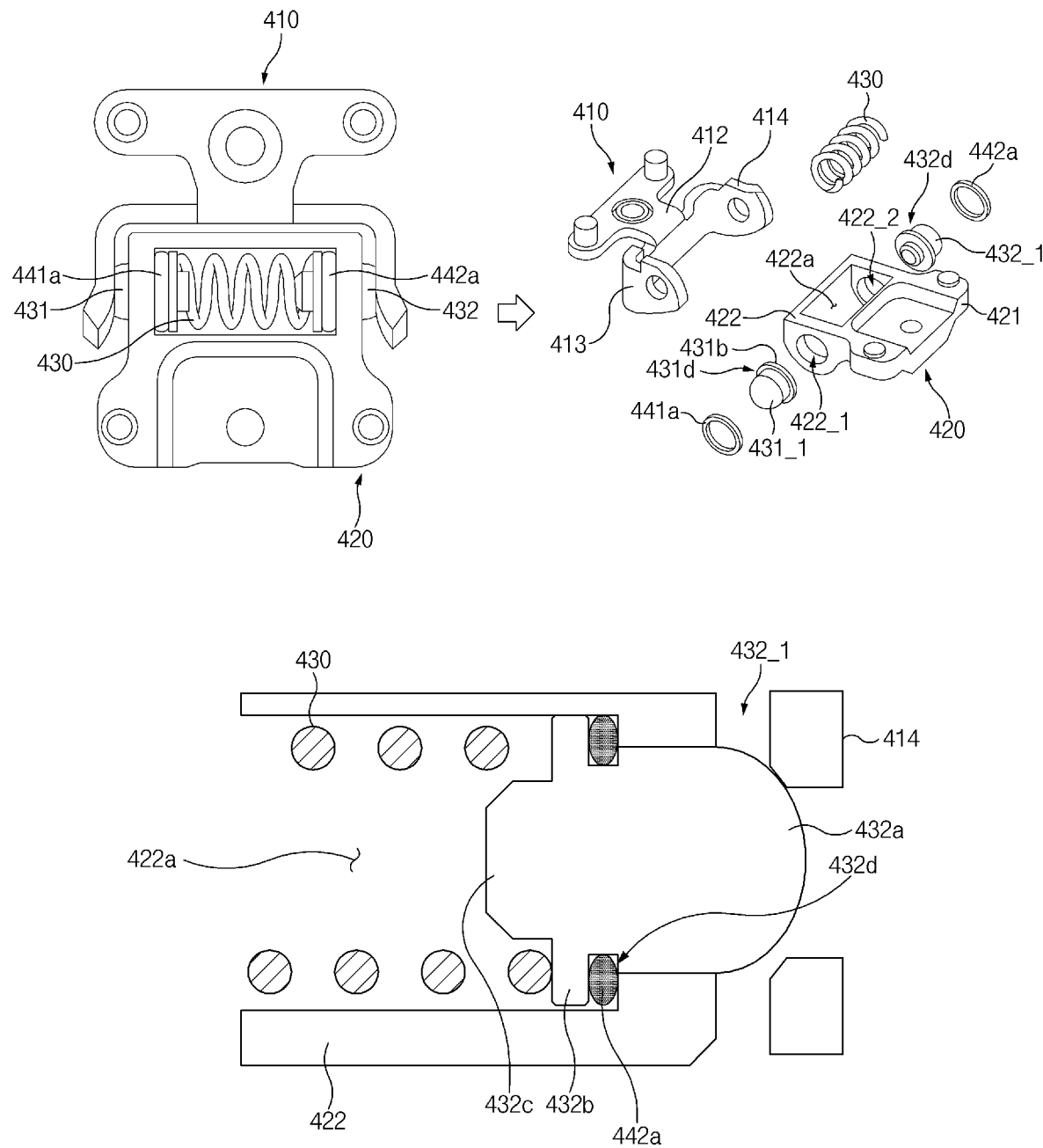
FIG. 8A is a view illustrating a shock-absorbing structure of the detent structure, according to an embodiment.

FIG. 8A is a view illustrating a shock-absorbing structure of the detent structure, according to an embodiment. The detent structure employing the shock-absorbing structure may be at least one of the plurality of detent structures 400*a*, 400*b*, 400*c*, and 400*d*.

Referring to FIG. 8A, the detent structure employing the shock-absorbing structure includes the first plate coupling part 410 and the second plate coupling part 420.

The first plate coupling part 410 may have substantially the same structure and configuration as the first plate coupling part described above with reference to FIG. 3A. For example, the first plate coupling part 410 may include the first coupling body 411, the bridge 412, the first support portion 413, and the second support portion 414.

The second plate coupling part 420 may have a configuration the same as, or similar to, that of the second plate coupling part described above with reference to FIG. 3A, and may exclude some components. The second plate coupling part 420 may include the second coupling body 421, the mounting body 422, and the elastic member 430. Furthermore, the second plate coupling part 420 may include mounting parts 431_1 and 432_1 that are disposed in the mounting body 422 and that at least partially protrude outward through the fixing holes 422_1 and 422_2 formed in the mounting body 422 and shock-absorbing members 441*a* and 442*a* that are mounted on the mounting parts 431_1 and 432_1 and that absorb shock generated while the mounting parts 431_1 and 432_1 are brought into contact with the mounting body 422.

The second coupling body 421 may have a predetermined thickness and width and may be formed of a predetermined material, e.g., a metallic material. The second coupling body 421 may be a component that is the same as, or similar to, the second coupling body described above with reference to FIG. 3A.

The mounting body 422 may extend from the second coupling body 421 in the fourth direction (y) and may have the elastic member mounting portion 422*a* formed therein in which the elastic member 430, the mounting parts 431_1 and 432_1, and the shock-absorbing members 441*a* and 442*a* are mounted. For example, the mounting body 422 may have an empty space formed therein in which the elastic member 430 is mounted, and may include, at the top thereof, an opening through which the elastic member 430, the mounting parts 431_1 and 432_1, and the shock-absorbing members 441*a* and 442*a* are mounted in the mounting body 422. The mounting body 422 may have, in the opposite sidewalls thereof, the fixing holes 422_1 and 422_2 to which the mounting parts 431_1 and 432_1 are fixed and through which at least parts of the mounting parts 431_1 and 432_1 protrude outside the mounting body 422.

The elastic member 430 may be mounted in the empty space of the mounting body 422. The elastic member 430 may have the form of a coil spring. The elastic member 430 may be inserted into the mounting body 422 and thereafter be disposed to push the mounting parts 431_1 and 432_1 and the shock-absorbing members 441*a* and 442*a* in opposite directions. Accordingly, the elastic member 430 may be formed to be shorter than the elastic member described above with reference to FIG. 3A.

The mounting parts 431_1 and 432_1 may be connected to opposite sides of the elastic member 430 and may be disposed to partly protrude in the first direction (−x) and the second direction (x) through the first fixing hole 422_1 and the second fixing hole 422_2 that are formed in the mounting body 422. For example, the second mounting part 432_1 (or the first mounting part 431_1) may include the protrusion 432*a* including a curved surface, the flange 432*b* that is provided at the bottom of the protrusion 432*a* and that has a larger diameter than the second fixing hole 422_2, the column 432*c* inserted into one side of the elastic member 430, and a ring groove 432*d* in which the shock-absorbing member 442*a* (or the shock-absorbing member 441*a*) is disposed. The ring grooves 431*d* and 432*d* in which the shock-absorbing members 441*a* and 442*a* are mounted may be disposed adjacent to the flanges 431*b* and 432*b*. The shock-absorbing members 441*a* and 442*a* in a ring shape may be mounted in the ring grooves 431*d* and 432*d*.

The shock-absorbing members 441*a* and 442*a* may be fixed to the ring grooves 431*d* and 432*d* formed in front of the flanges 431*b* and 432*b*. The shock-absorbing members 441*a* and 442*a* may be disposed inside the mounting body 422 so as to be adjacent to the flanges 431*b* and 432*b* of the mounting parts 431_1 and 432_1. At least part of each of the shock-absorbing members 441*a* and 442*a* may be formed of an elastic material, or at least part of each of the shock-absorbing members 441a and 442a may be formed of a material capable of absorbing external shock, for example, rubber, flexible plastic, fiber, or a combination thereof.

The shock-absorbing members 441a and 442a may be disposed between the inner surfaces around the fixing holes 422_1 and 422_2 of the mounting body 422 and the flanges 431b and 432b of the mounting parts 431_1 and 432_1 and may absorb shock generated when the mounting parts 431_1 and 432_1, which are moved into the mounting body 422 during a detent operation, are brought into contact with the inner surfaces around the fixing holes 422_1 and 422_2 of the mounting body 422 while returning to the original positions. Accordingly, the shock-absorbing members 441a and 442a may reduce noise or shock generated when the mounting parts 431_1 and 432_1 are brought into contact with the fixing holes 422_1 and 422_2, thereby suppressing noise and preventing damage to the mounting parts 431_1 and 432_1.

Figure 8B:
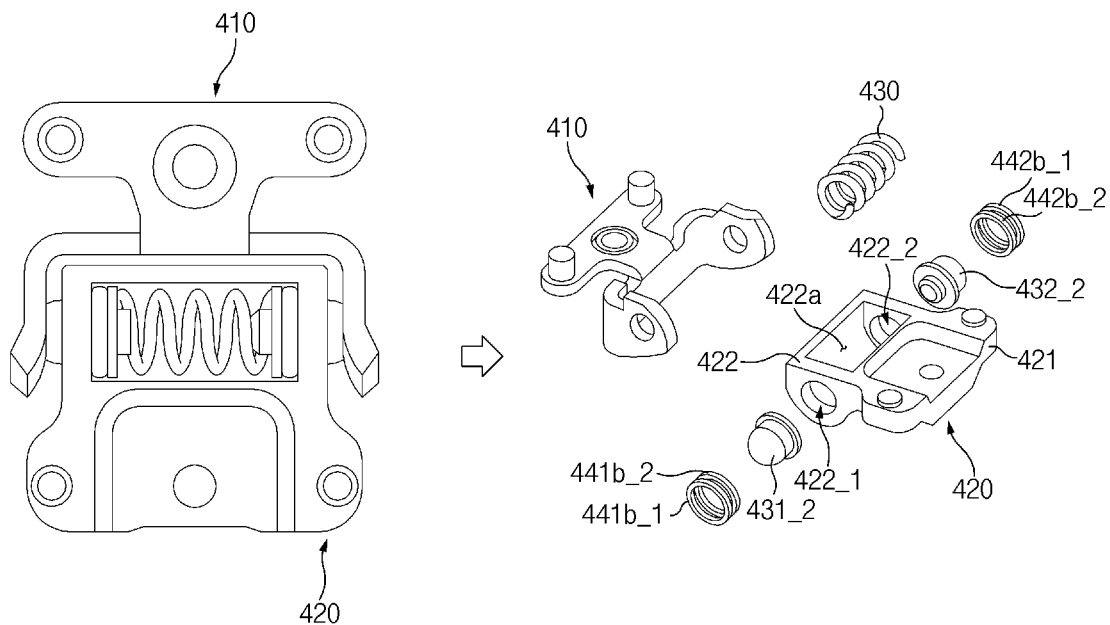
FIG. 8B is a view illustrating an example of the shock-absorbing structure of the detent structure, according to an embodiment.
Figure 8B:
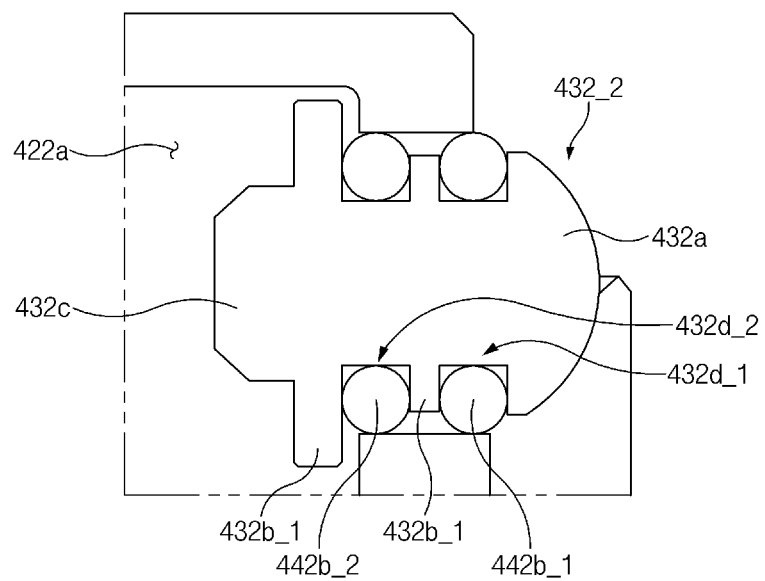

FIG. 8B is a view illustrating an example of the shock-absorbing structure of the detent structure, according to an embodiment.

Referring to FIG. 8B, the detent structure having the shock-absorbing structure may be a structure the same as, or similar to, the structure of the detent structure described above with reference to FIG. 8A, but may not include mounting parts and shock-absorbing members. The detent structure may include the first plate coupling part 410 and the second plate coupling part 420, and the second plate coupling part 420 may include the second coupling body 421, the mounting body 422 having the elastic member mounting portion 422a formed therein in which the elastic member 430 is mounted, the elastic member 430, mounting parts 431_2 and 432_2 to which a plurality of shock-absorbing members 441b_1, 441b_2, 442b_1, and 442b_2 are coupled, and the fixing holes 422_1 and 422_2 that are formed on opposite sides of the mounting body 422 and through which at least one or more parts of the mounting parts 431_2 and 432_2 are exposed to the outside.

The mounting part 432_2 (or the mounting part 431_2) may include a plurality of ring grooves 432d_1 and 432d_2 and an auxiliary flange 432b_2 formed between a flange 432b_1 located ahead of the column 432c and the protrusion 432a, and the plurality of shock-absorbing members 442b_1 and 442b_2 may be mounted in the ring grooves 432d_1 and 432d_2. The protrusions 432a of the mounting parts 431_2 and 432_2 may be formed to be longer than the protrusions 432a of the mounting parts 431_1 and 432_1 described above with reference to FIG. 8A. The mounting body 422 may be formed to be longer than the mounting body 422 described above with reference to FIG. 8a. Alternatively, the elastic member 430 mounted in the mounting body 422 may be formed to be shorter than the elastic member 430 described above with reference to FIG. 8a.

At least one or more parts of the protrusions 432a of the mounting parts 431_2 and 432_2 on which the shock-absorbing members 441b_1, 441b_2, 442b_1, and 442b_2 are mounted may be located in the fixing holes 422_1 and 422_2 formed in the mounting body 422. At least some of the shock-absorbing members 441b_1, 441b_2, 442b_1, and 442b_2 may be located in the fixing holes 422_1 and 422_2. At least part of each of the shock-absorbing members 441b_1, 441b_2, 442b_1, and 442b_2 may be formed of an elastic material, or at least part of each of the shock-absorbing members 441b_1, 441b_2, 442b_1, and 442b_2 may be formed of a material capable of absorbing external shock, for example, rubber, flexible plastic, fiber, or a combination thereof. Accordingly, the shock-absorbing members 441b_1, 441b_2, 442b_1, and 442b_2 may be brought into contact with the inner walls of the fixing holes 422_1 and 422_2 and may reduce noise and shock generated by contact of the mounting parts 431_2 and 432_2 with the fixing holes 422_1 and 422_2.

Figure 8C:
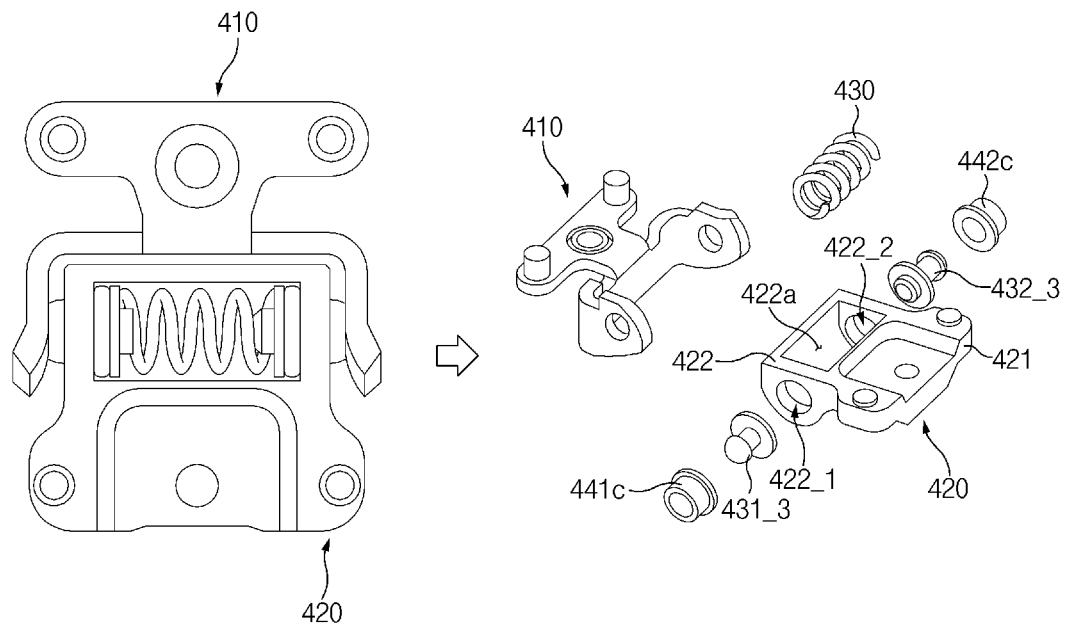
FIG. 8C is a view illustrating an example of the shock-absorbing structure of the detent structure, according to an embodiment.
Figure 8C:
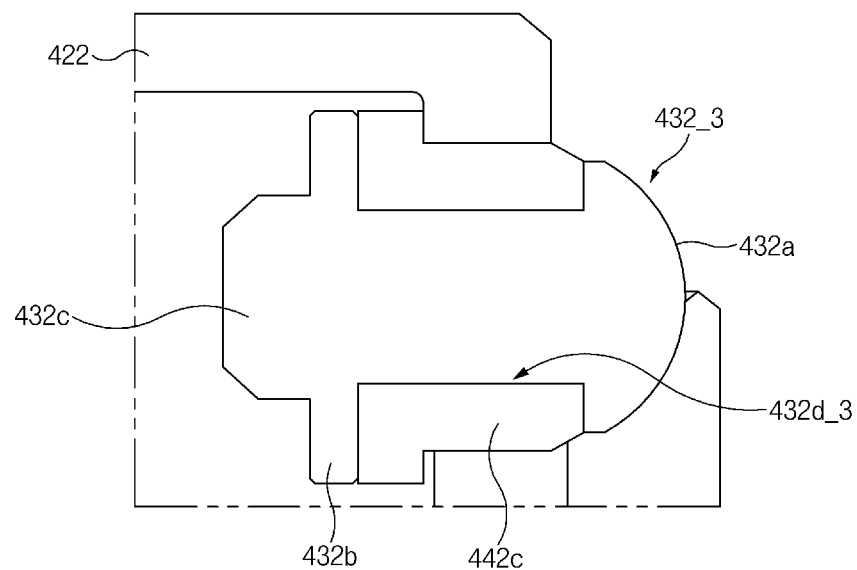

FIG. 8C is a view illustrating an example of the shock-absorbing structure of the detent structure, according to an embodiment.

Referring to FIG. 8C, the detent structure having the shock-absorbing structure may be a structure the same as, or similar to, the structure of the detent structure described above with reference to FIG. 8A, but may not include mounting parts and shock-absorbing members. The detent structure may include the first plate coupling part 410 and the second plate coupling part 420, and the second plate coupling part 420 may include the second coupling body 421, the mounting body 422 having the elastic member mounting portion 422a formed therein in which the elastic member 430 is mounted, the elastic member 430, mounting parts 431_3 and 432_3 to which shock-absorbing members 441c and 442c are coupled, and the fixing holes 422_1 and 422_2 that are formed on opposite sides of the mounting body 422 and through which at least one or more parts of the mounting parts 431_3 and 432_3 are exposed to the outside.

The mounting part 432_3 (or the mounting part 431_3) may include a rail groove 432d_3 that is formed between the flange 432b and the protrusion 432a and that is longer than the fixing hole 422_2 formed in the mounting body 422. The detent structure may include the shock-absorbing members 441c and 442c in a hat shape having a through-hole inside, and the shock-absorbing members 441c and 442c may be mounted in the rail grooves 432d_3 formed on the mounting parts 431_3 and 432_3 and may be brought into contact with the inner surfaces of the fixing holes 422_1 and 422_2. When the mounting parts 431_3 and 432_3 are inserted into the fixing holes 422_1 and 422_2 such that ends of the protrusions 432a are exposed to the outside, the shock-absorbing members 441c and 442c may be brought into contact with at least one or more parts of one or more entrances of the fixing holes 422_1 and 422_2 while being brought into contact with the entire inner surfaces of the fixing holes 422_1 and 422_2. Accordingly, when the mounting parts 431_3 and 432_3, which are moved into the mounting body 422 by a predetermined depth during a detent operation, return to the original positions by an additional detent operation, the shock-absorbing members 441c and 442c may reduce noise and shock caused by contact between the fixing holes 422_1 and 422_2 and the mounting parts 431_3 and 432_3.

Figure 9:
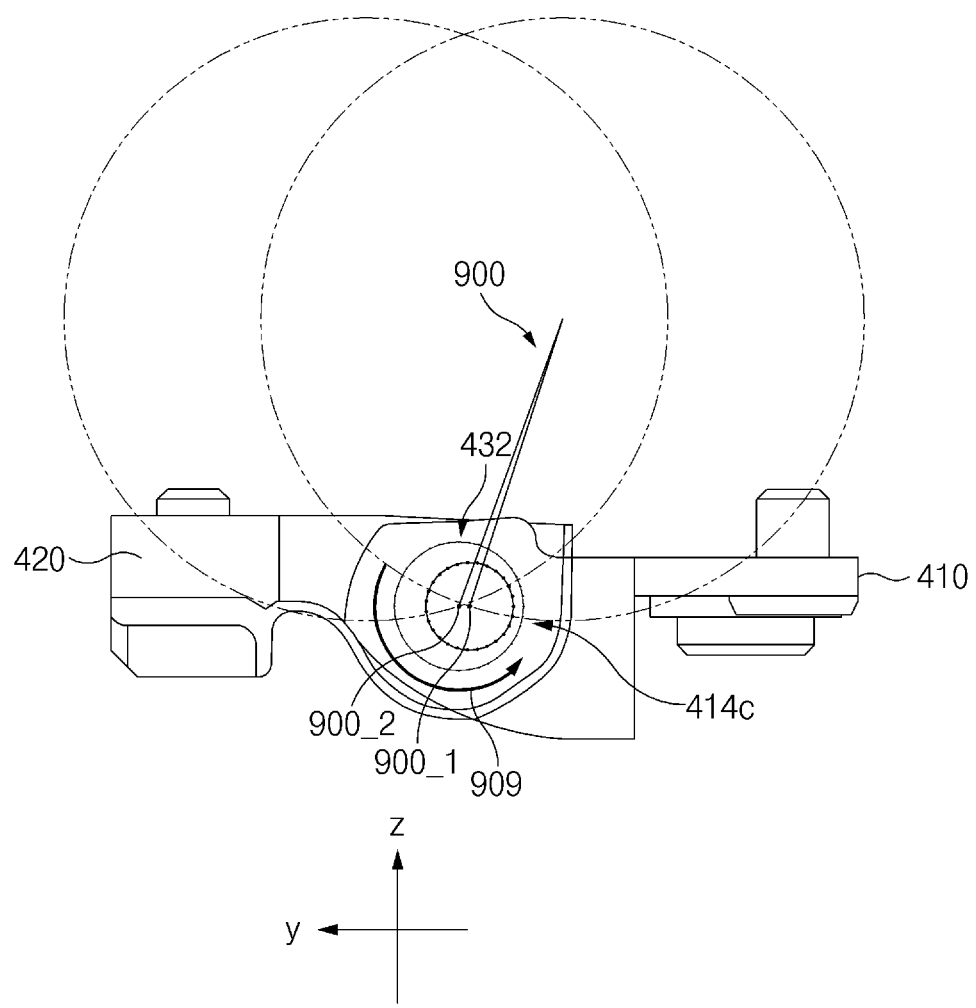
FIG. 9 is a view illustrating a flat state of the detent structure, according to an embodiment.

FIG. 9 is a view illustrating a flat state of the detent structure, according to an embodiment.

Referring to FIG. 9, when the first housing structure and the second housing structure of the foldable electronic device are in a flat state, the first plate coupling part 410 and the second plate coupling part 420 may be fastened with each other, as illustrated. For example, the second mounting part 432 of the second plate coupling part 420 may be mounted in the second mounting hole 414c formed in the first plate coupling part 410. The second mounting hole 414c may have a circular hole shape, and at least part of the second mounting part 432 that is inserted into the second mounting hole 414c may have a hemispherical shape.

The center 900_1 of the second mounting part 432 and the center 900_2 of the second mounting hole 414c may be offset from each other. For example, the first plate coupling part 410 may be eccentrically designed such that the center 900_1 of the second mounting part 432 is eccentrically located off the center 900_2 of the second mounting hole 414c in one direction (e.g. the y direction). Because the second mounting part 432, the protruding portion of which has a hemispherical shape, is disposed to be biased in the one direction (i.e., facing towards the one direction) in the flat state of the foldable electronic device, the second mounting part 432 may be adjacent to the inner circumferential surface of the second mounting hole 414c, and therefore the third detent structure 400c may prevent a movement of the second mounting part 432 of the second plate coupling part 420 in a rotational direction 909.

The third detent structure 400c may support the housing structures 121 and 122 such that the foldable electronic device in the flat state is not additionally bent outward (e.g., in the z direction) such that the display is not bent outward. For example, a robust detent in a flat state of 180 degrees may be implemented by allowing a force to be exerted in a direction 900 during hinge motion of the electronic device.

Figure 10A:
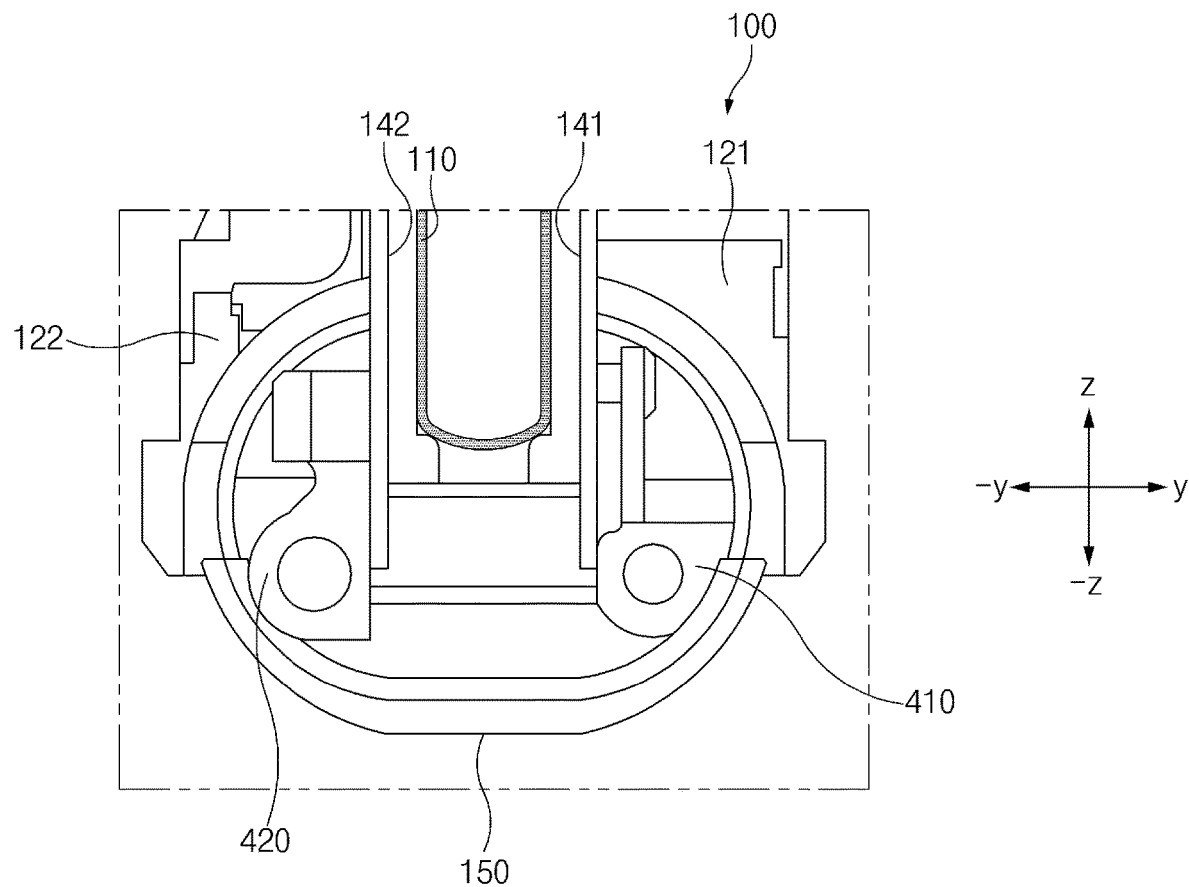
FIG. 10A is a sectional view illustrating an arrangement of the detent structure in the foldable electronic device in the second state, according to an embodiment.
Figure 10B:
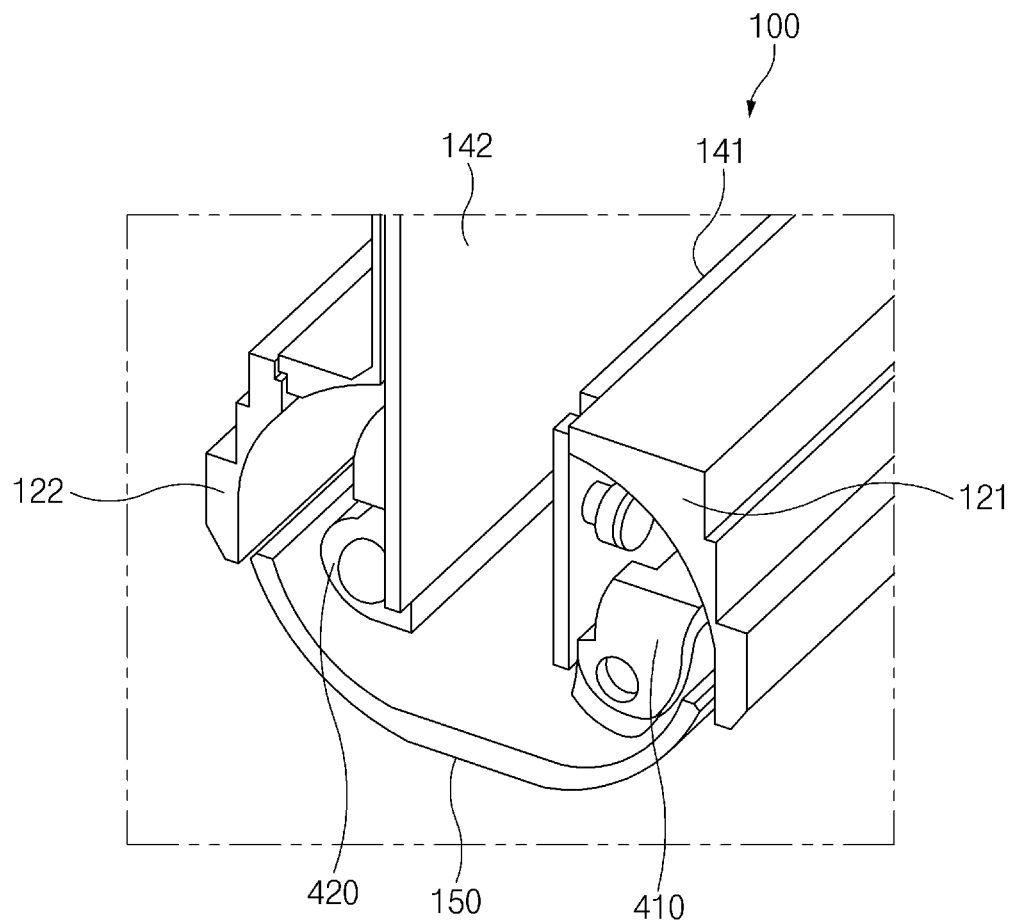
FIG. 10B is a sectional perspective view illustrating the arrangement of the detent structure in the foldable electronic device in the second state, according to an embodiment.

FIG. 10A is a sectional view illustrating an arrangement of the detent structure in the foldable electronic device in the second state, according to an embodiment. FIG. 10B is a sectional perspective view illustrating the arrangement of the detent structure in the foldable electronic device in the second state, according to an embodiment.

Referring to FIGS. 10A and 10B, when the foldable electronic device 100 is in the second state (e.g., a folded state in which the first housing structure 121 and the second housing structure 122 face each other), the first plate coupling part 410 coupled to the first hinge plate 141 may be in an upright position in the hinge housing 150 in one direction (e.g., the z direction). Similarly, the second plate coupling part 420 coupled to the second hinge plate 142 may be in an upright position in the hinge housing 150 in the one direction. Accordingly, the first plate coupling part 410 and the second plate coupling part 420 may face each other in a state of being spaced apart from each other at a predetermined interval. The display 110 may be disposed between the first housing structure 121 and the second housing structure 121, with the central area 53 of the display 110 folded.

Figure 11A:
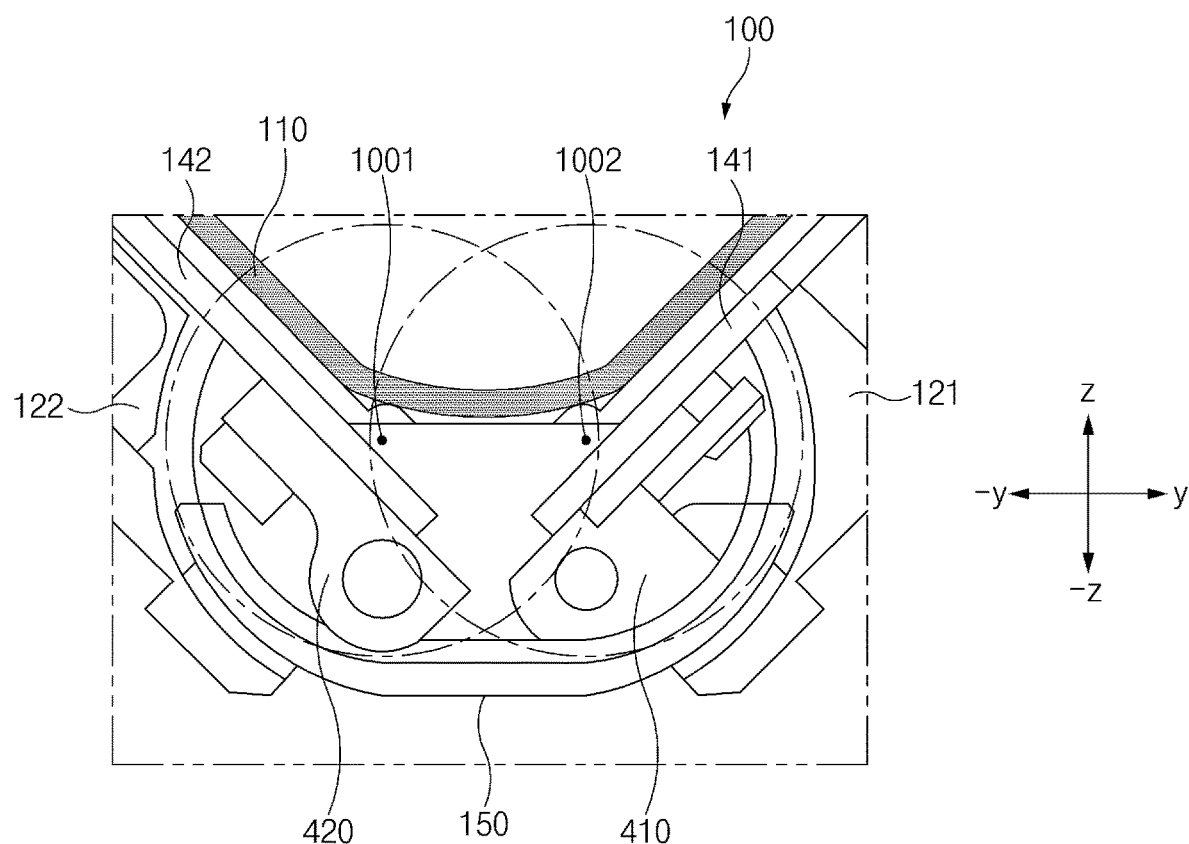
FIG. 11A is a sectional view illustrating an arrangement of the detent structure in the foldable electronic device unfolded to a predetermined angle, according to an embodiment.
Figure 11B:
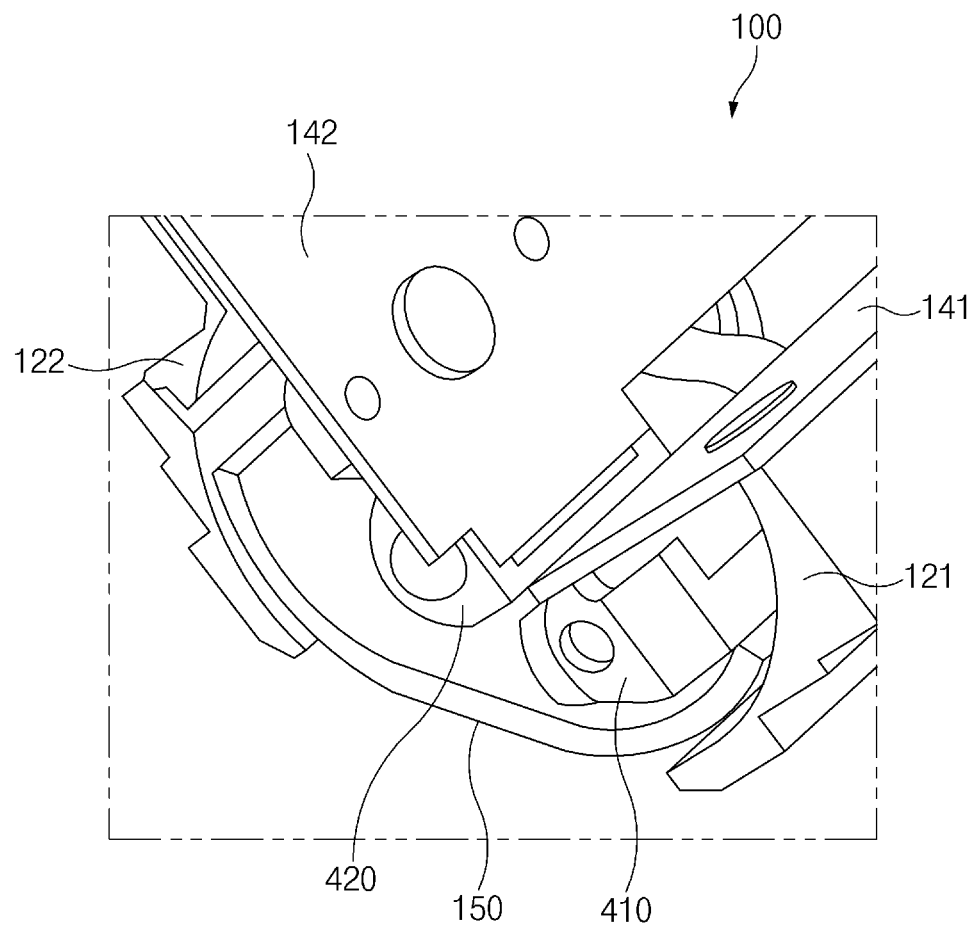
FIG. 11B is a sectional perspective view illustrating the arrangement of the detent structure in the foldable electronic device unfolded to the predetermined angle, according to an embodiment.

FIG. 11A is a sectional view illustrating an arrangement of the detent structure in the foldable electronic device unfolded to a predetermined angle, according to an embodiment. FIG. 11B is a sectional perspective view illustrating the arrangement of the detent structure in the foldable electronic device unfolded to a predetermined angle, according to an embodiment.

Referring to FIGS. 11A and 11B, when the foldable electronic device 100 is unfolded to the predetermined angle (e.g., when the first housing structure 121 and the second housing structure 122 are rotated by a specified angle to change from a folded state to a flat state), the first plate coupling part 410 coupled to the first hinge plate 141 may be changed in the hinge housing 150 from a state of forming a first angle (e.g., about 90 degrees) with the y axis to a state of forming a second angle (e.g., about 45 degrees), which is different from the first angle, with the y axis. Similarly, the second plate coupling part 420 coupled to the second hinge plate 142 may be changed in the hinge housing 150 from a state of forming the first angle (e.g., about 90 degrees) with the y axis to a state of forming the second angle (e.g., about 45 degrees), which is different from the first angle, with the y axis. The first housing structure 121 and the second housing structure 122 may be unfolded with about 45 degrees (or about −45 degrees) in opposite directions in the folded state. Correspondingly, the internal angle between the first plate coupling part 410 and the second plate coupling part 420 may be about 90 degrees. In this operation, the first plate coupling part 410 and the second plate coupling part 420 may be spaced apart from each other at a predetermined interval and may be in an inclined state without being brought into contact with each other. The display 110 may be disposed between the first housing structure 121 and the second housing structure 121, with the central area 53 of the display 110 unfolded in a specified angle range from the folded state. The first plate coupling part 410 connected to the first housing structure 121 through the first hinge plate 141 may rotate about a first virtual axis 1001 in a specified angle range (e.g., 0 degrees to 90 degrees). The second plate coupling part 420 connected to the second housing structure 122 through the second hinge plate 142 may rotate about a second virtual axis 1002 in a specified angle range (e.g., 180 degrees to 90 degrees). The first virtual axis 1001 and the second virtual axis 1002 may be virtually formed above the first hinge plate 141 and the second hinge plat 142.

Figure 12A:
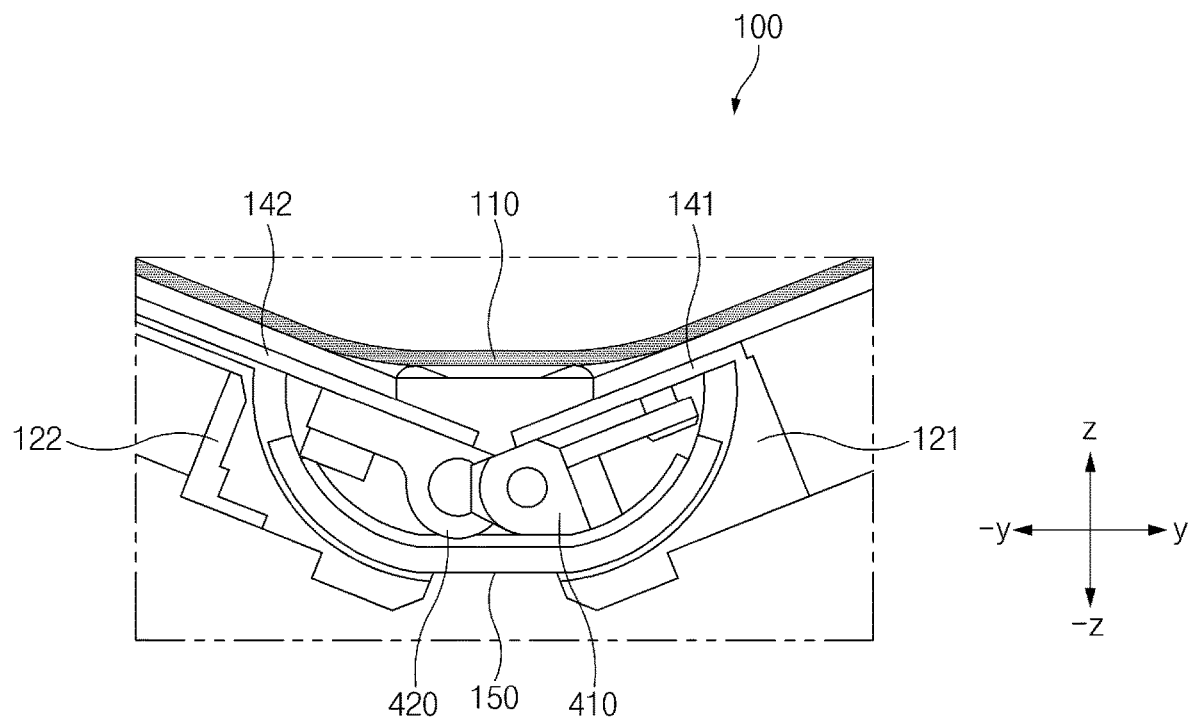
FIG. 12A is a sectional view illustrating an arrangement of the detent structure in the foldable electronic device unfolded to a predetermined angle, according to an embodiment.
Figure 12B:
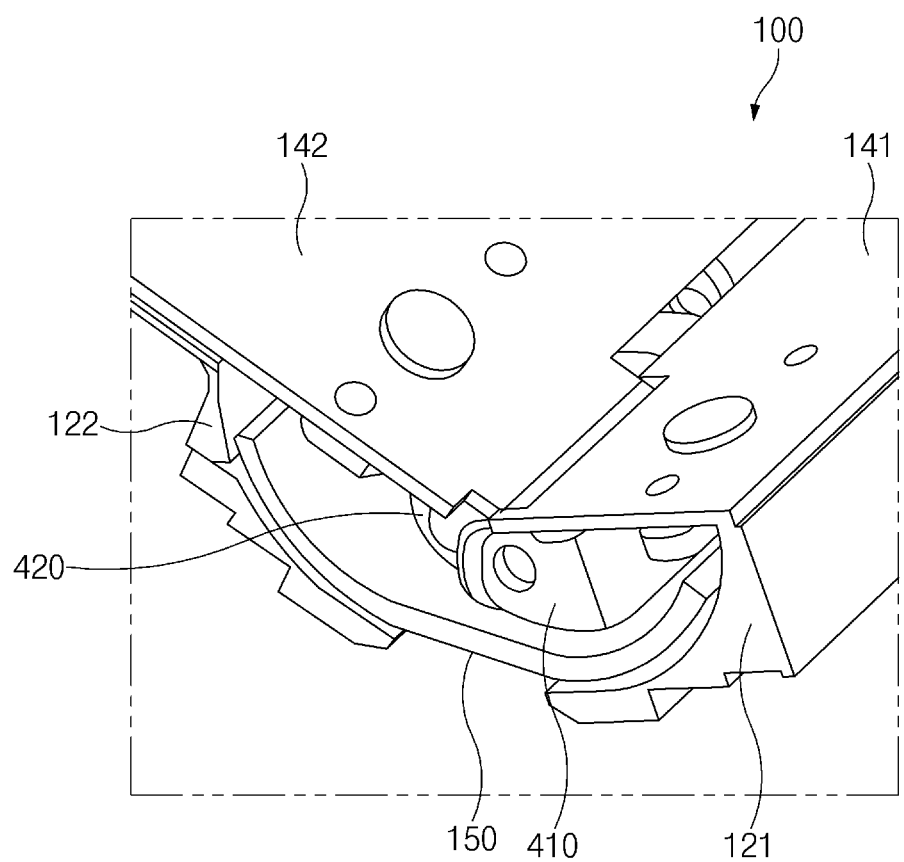
FIG. 12B is a sectional perspective view illustrating the arrangement of the detent structure in the foldable electronic device unfolded to the predetermined angle, according to an embodiment.

FIG. 12A is a sectional view illustrating an arrangement of the detent structure in the foldable electronic device unfolded to a predetermined angle, according to an embodiment. FIG. 12B is a sectional perspective view illustrating the arrangement of the detent structure in the foldable electronic device unfolded to a predetermined angle, according to an embodiment.

Referring to FIGS. 12A and 12B, when the foldable electronic device 100 is unfolded to a predetermined angle (e.g., when the first housing structure 121 and the second housing structure 122 are additionally unfolded from the state of FIGS. 11A and 11B during hinge motion), the first plate coupling part 410 coupled to the first hinge plate 141 may be inclined in the hinge housing 150 by a specified angle (e.g., about 60 degrees or about 70 degrees) from one direction (e.g., the z direction) to the third direction (e.g., −y). Similarly, the second plate coupling part 420 coupled to the second hinge plate 142 may be inclined in the hinge housing 150 by a specified angle (e.g., about −60 degrees or about −70 degrees) from one direction to the fourth direction (e.g., y). The first housing structure 121 and the second housing structure 122 may be unfolded by 60 degrees and −60 degrees (or 70 degrees and −70 degrees) in opposite directions in a folded state (e.g., the state of FIGS. 10A and 10B). Correspondingly, the internal angle between the first plate coupling part 410 and the second plate coupling part 420 may be 120 degrees (or 140 degrees). In this operation, at least part of the first plate coupling part 410 and at least part of the second plate coupling part 420 may be brought into contact with each other. For example, the curved portions 413d and 414d of the first plate coupling part 410 may be brought into contact with the mounting parts 431 and 432 of the second plate coupling part 420. In this state, the foldable electronic device 100 may be temporarily fixed in the current state by the elastic force of the elastic member 430 of the second plate coupling part 420 and the friction between the mounting parts 431 and 432 and the curved portions 413d and 414d. The display 110 disposed on the housing structures 121 and 122 may be unfolded with a larger angle than the folding angle in FIGS. 11A and 11B to correspond to the arrangement angle of the housing structures 121 and 122.

Figure 13A:
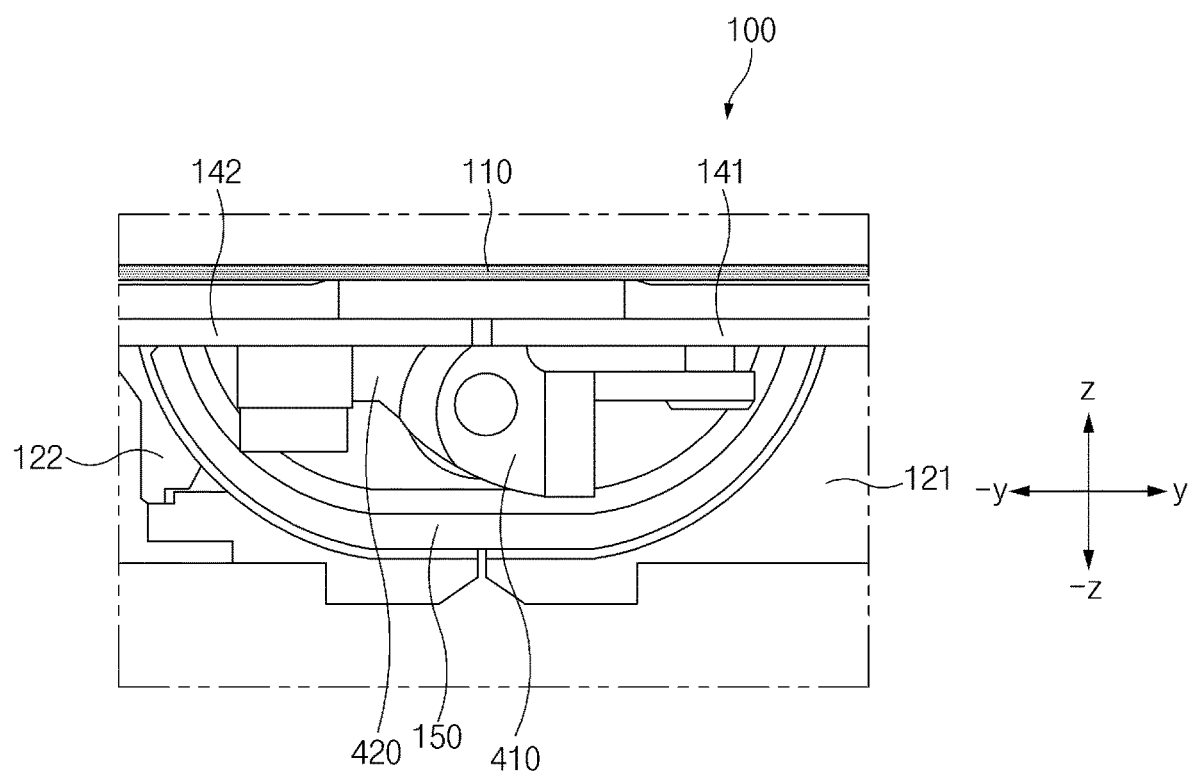
FIG. 13A is a sectional view illustrating an arrangement of the detent structure in the foldable electronic device in the first state, according to an embodiment.
Figure 13B:
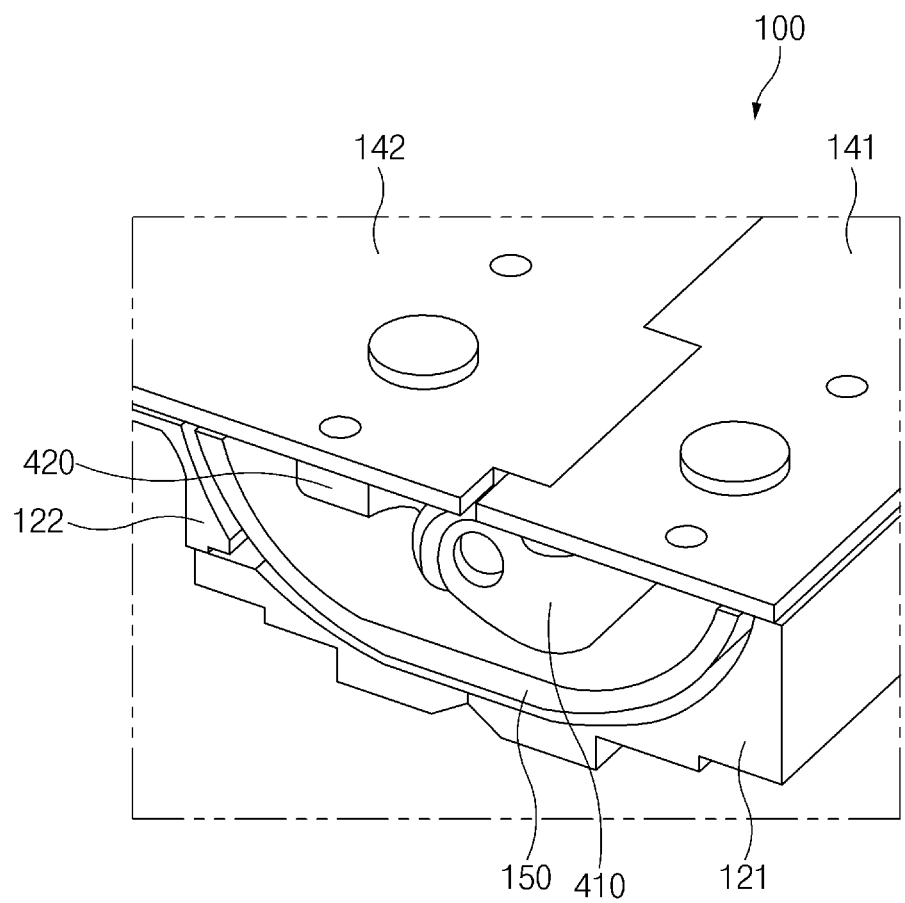
FIG. 13B is a sectional perspective view illustrating the arrangement of the detent structure in the foldable electronic device in the first state, according to an embodiment.

FIG. 13A is a sectional view illustrating an arrangement of the detent structure in the foldable electronic device in the first state, according to an embodiment. FIG. 13B is a sectional perspective view illustrating the arrangement of the detent structure in the foldable electronic device in the first state, according to an embodiment.

Referring to FIGS. 13A and 13B, when the foldable electronic device 100 is in the first state (e.g., when the first housing structure 121 and the second housing structure 122 are in a flat state), the first plate coupling part 410 coupled to the first hinge plate 141 and the second plate coupling part 420 coupled to the second hinge plate 142 may be coupled together and may be located in the hinge housing 150. The mounting parts 431 and 432 of the second plate coupling part 420 may be mounted in the mounting holes 413c and 414c of the first plate coupling part 410. The display 110 may be unfolded 180 degrees to correspond to the housing structures 121 and 122 unfolded 180 degrees.

Figure 14:
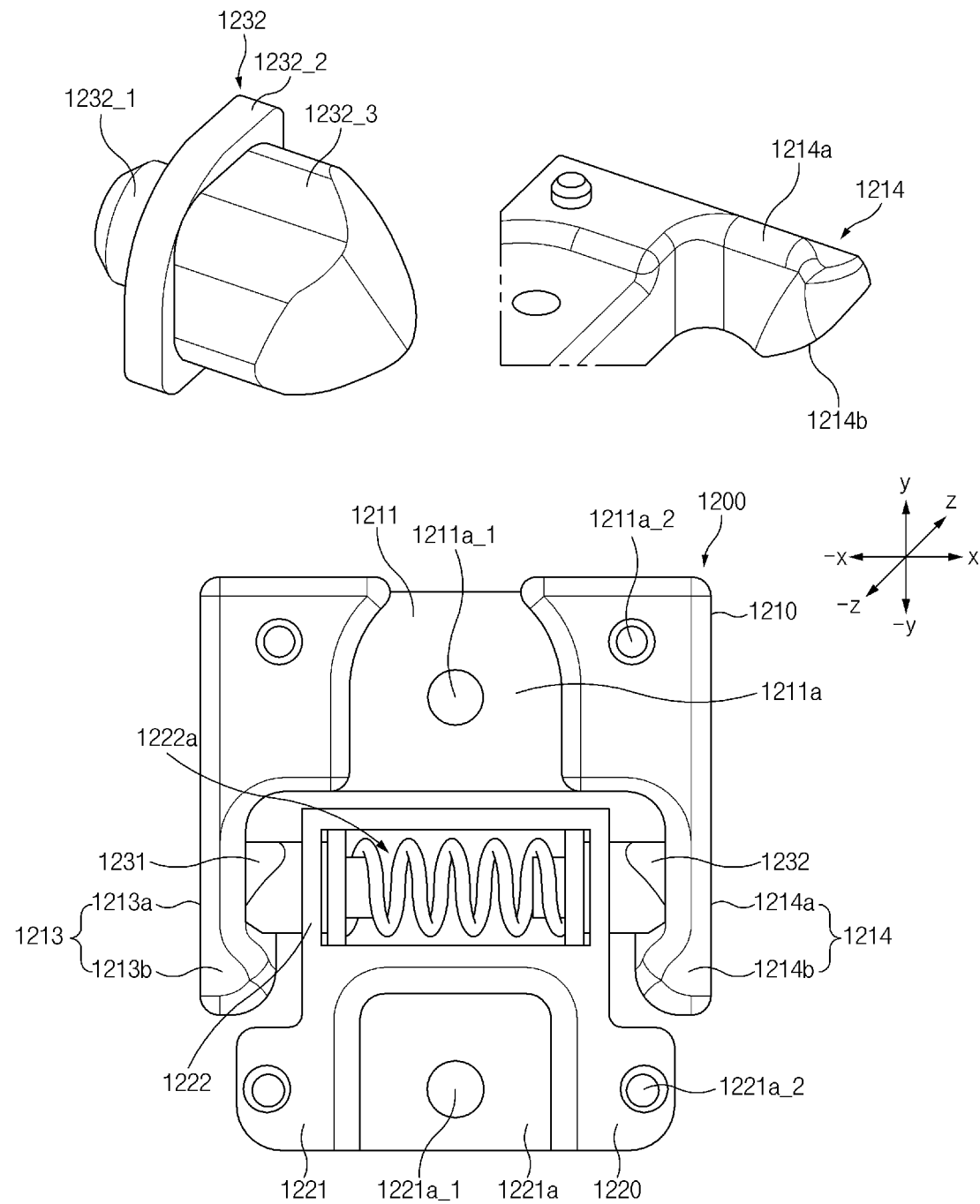
FIG. 14 is a view illustrating a form of the detent structure, according to an embodiment.

FIG. 14 is a view illustrating a form of the detent structure, according to an embodiment.

Referring to FIG. 14, a detent structure 1200 includes a first plate coupling part 1210 and a second plate coupling part 1220.

The first plate coupling part 1210 may include a first coupling body 1211, a first support portion 1213, and/or a second support portion 1214.

The first coupling body 1211 may have a predetermined thickness and surface and may include, in the center thereof, a plate mounting portion 1211a formed with a step so as to be coupled with the first hinge plate 141 (or the second hinge plate 142). A plate coupling hole 1211a_1 used to couple the hinge plate may be disposed on one side of the plate mounting portion 1211a. The first coupling body 1211 may include at least one coupling protrusion 1211_2 that guides the hinge plate while the hinge plate is coupled to the first coupling body 1211.

The first support portion 1213 may extend from one end of the first coupling body 1211 (e.g., the −x direction) in one direction (−y). The first support portion 1213 may include, for example, a first wing 1213a having a predetermined width and extending in the one direction (−y) and a first step 1213b (or a raised portion) extending from an end of the first wing 1213a in the one direction (−y) and protruding inward (e.g., in the x direction) by a specified height. The first step 1213b may have a predetermined slope from top (e.g., the z direction) to bottom (e.g., the −z direction) to smoothly support an inward movement of a first mounting part 1231 of the second plate coupling part 1220 by making contact with the first mounting part 1231 through a rotary motion.

The second support portion 1214 may extend from an opposite end of the first coupling body 1211 (e.g., the x direction) in the one direction (−y). The second support portion 1214 may include, for example, a second wing 1214a having a predetermined width and extending in the one direction (−y) and a second step 1214b (or a raised portion) extending from an end of the second wing 1214a in the one direction (−y) and protruding inward (e.g., in the −x direction) by a specified height. The second support portion 1214 may be disposed to be symmetric to the first support portion 1213 while facing the first support portion 1213. Similar to the first step 1213b, the second step 1213b may have a predetermined slope from top (e.g., the z direction) to bottom (e.g., the −z direction) to smoothly support an inward movement of a second mounting part 1232 of the second plate coupling part 1220 by making contact with the second mounting part 1232 through a rotary motion.

The second plate coupling part 1220 may include a second coupling body 1221, a mounting body 1222, an elastic member 1230, and mounting parts 1231 and 1232. The second coupling body 1221, the mounting body 1222, and the elastic member 1230 may be components that are the same as, or similar to, the second coupling body 421, the mounting body 422, and the elastic member 430 described above with reference to FIG. 4A. For example, the second coupling body 1221 may include a plate mounting portion 1221a, a plate coupling hole 1221a_1, and at least one coupling protrusion 1221a_2.

The mounting parts 1231 and 1232 may include a column 1232_1, a flange 1232_2 that extends from the column 1232_1 and that is fixed to a fixing hole formed in the mounting body 1222, and a protrusion 1232_3 (or a body) in a CAM shape (or, a ridge shape or a shape, at least part of which has a triangular peak shaped cross-section) that protrudes from the flange 1232_2 and has a smaller cross-section than the flange 1232_2 and sloping sides at the distal end. The protrusions 1232_3 may be moved into the first plate coupling part 1210 while being brought into contact with the surfaces of the steps 1213b and 1214b. The support portions 1213 and 1214 of the detent structure 1200 may not have separate mounting holes formed therein, and thus device manufacturing may be further simplified.

All or at least part of at least one of the first plate coupling part 1210, the second plate coupling part 1220, and the mounting parts 1231 and 1232 may be formed of a non-metallic material or a metallic material. At least a partial area of the first plate coupling part 1210 that includes the portions brought into contact with the mounting parts 1231 and 1232 may be formed of a metallic material for stiffness. At least a partial area of mounting holes in which the mounting parts 1231 and 1232 are mounted may be formed of a metallic material for stiffness and wear resistance.

Figure 15A:
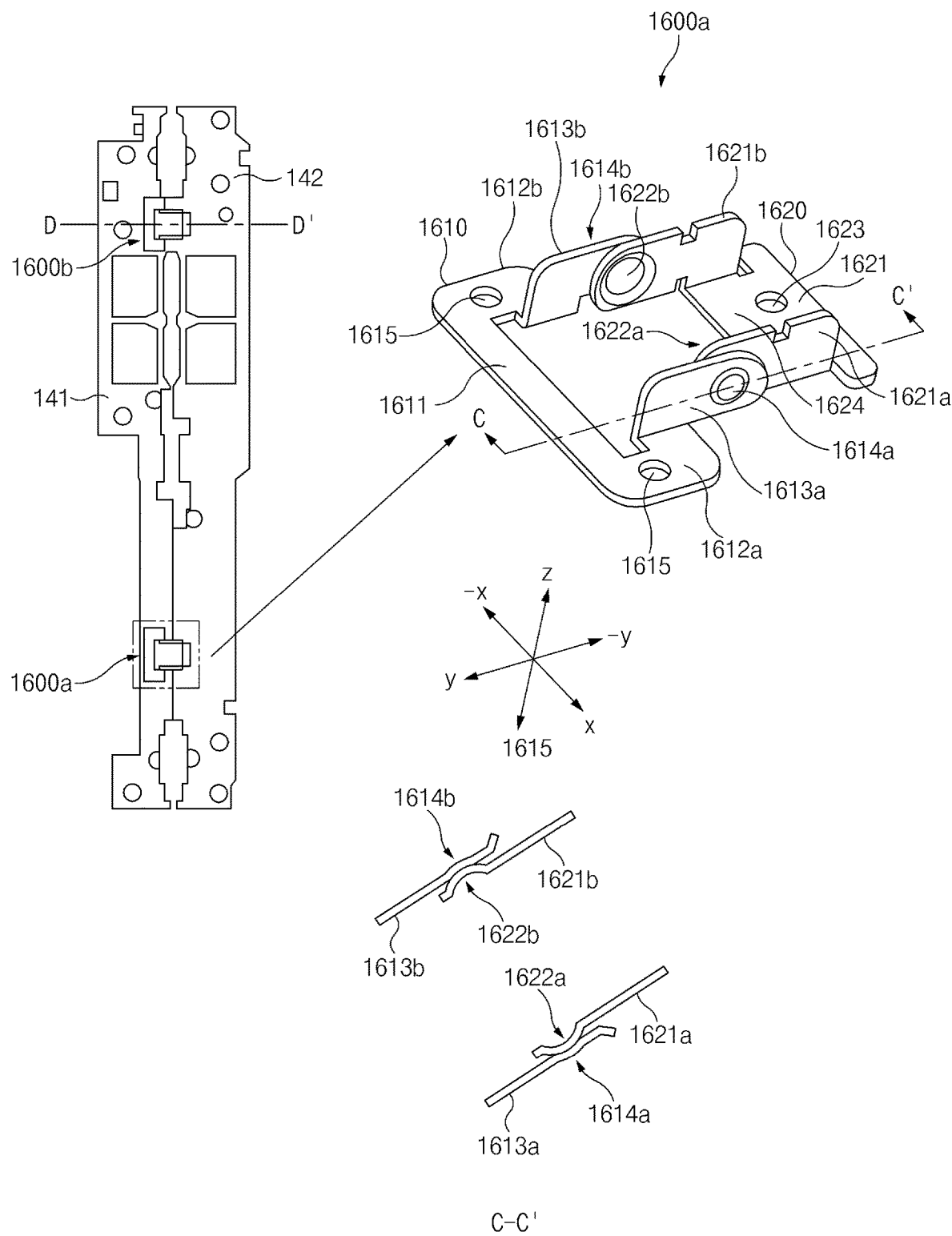
FIG. 15A is a view illustrating a form of the detent structure, according to an embodiment.
Figure 15B:
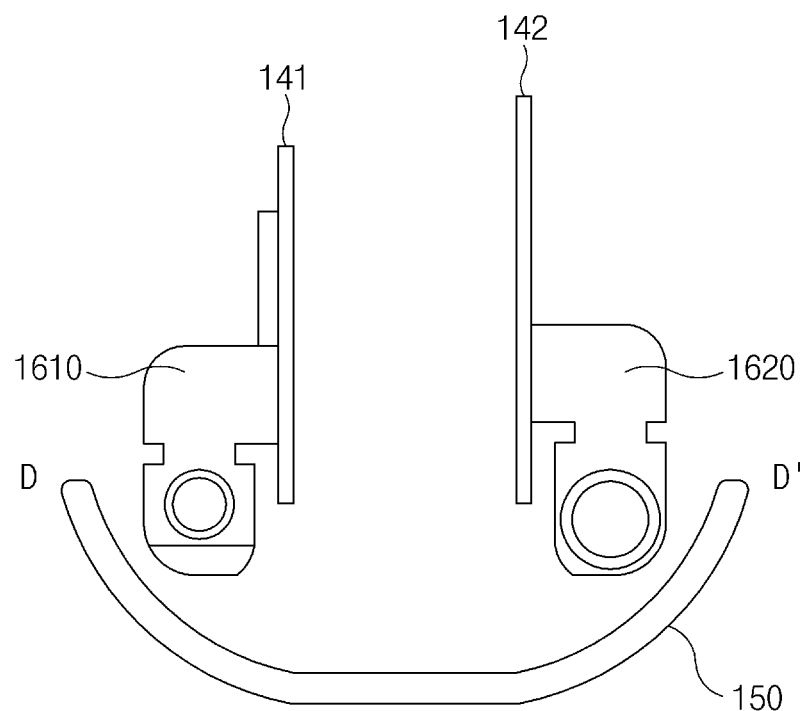
FIG. 15B is a view illustrating a folded state of the detent structure with respect to cutting line D-D' of FIG. 15A, according to an embodiment.

FIG. 15A is a view illustrating a form of the detent structure, according to an embodiment. FIG. 15B is a view illustrating a folded state of the detent structure with respect to cutting line D-D' of FIG. 15A, according to an embodiment.

Referring to FIGS. 15A and 15B, detent structures 1600a and 1600b are connected to the first hinge plate 141 and the second hinge plate 142. The first detent structure 1600a may include a first plate coupling part 1610 connected to the first hinge plate 141 and a second plate coupling part 1620 connected to the second hinge plate 142. At least part of the first plate coupling part 1610 and at least part of the second plate coupling part 1620 may be formed of a metallic material or a non-metallic material (e.g., a plastic material).

The first plate coupling part 1610 may include a first basic body 1611 that is coupled to the first hinge plate 141 and that has a panel shape that is long in one direction (e.g., the first axis (x) or the second axis (−x)), a first wing 1612a and a second wing 1612b that extend from opposite sides of the first basic body 1611 in the third direction (−y), a first mounting part 1613a vertically extending from the first wing 1612a in the upper direction (z), and a second mounting part 1613b vertically extending from the second wing 1612b in the upper direction (z). The first wing 1612a and the second wing 1612b may be disposed to be symmetric to each other with respect to the third axis (the −y axis). The first mounting part 1613a and the second mounting part 1613b may be disposed to be symmetric to each other with respect to the third axis (the −y axis). First coupling holes 1615 used to couple the first hinge plate 141 (or the second hinge plate 142) may be formed in the first basic body 1611. A first recess 1614a used to fasten the second plate coupling part 1620 may be formed on the first mounting part 1613a. One surface of the first recess 1614a may be formed to further protrude beyond the surrounding area. A second recess 1614b used to fasten the second plate coupling part 1620 may be formed on the second mounting part 1613b. One surface of the second recess 1614b may be formed to further protrude beyond the surrounding area. The first recess 1614a and the second recess 1614b may be disposed to face each other. At least a part of the first recess 1614a and the second recess 1614b may include a through-hole formed through the front and the back thereof, or may be formed in the shape of a hole by removing a portion of the protruding part thereof.

The second plate coupling part 1620 may include a second basic body 1621 that is coupled to the second hinge plate 142 (or the first hinge plate 141) and that has a panel shape that is long in one direction (e.g., the direction of the first axis (x) or the second axis (–x)), a bridge 1624 extending from opposite sides of the second basic body 1621 in the direction of the fourth axis (y), and a third mounting part 1621a and a fourth mounting part 1621b that extend from opposite sides of the bridge 1624 in a direction (e.g., the z-axis direction) that is perpendicular to the surface of the bridge 1624. A second coupling hole 1623 used to couple the second hinge plate 142 may be formed in the second basic body 1621. A third recess 1622a fastened with the first recess 1614a formed on the first mounting part 1613a may be formed on the third mounting part 1621a. The third recess 1622a may be formed to be larger than the first recess 1614a. A fourth recess 1622b fastened with the second recess 1614b formed on the second mounting part 1613b may be formed on the fourth mounting part 1621b. The fourth recess 1622b may be formed to be larger than the second recess 1614b. The third recess 1622a and the fourth recess 1622b may be disposed to face each other. At least one of the third recess 1622a and the fourth recess 1622b may be formed in the shape of a hole by removing at least a portion thereof. For example, the third and fourth recesses 1622a and 1622b may be formed in the shape of a hole by maintaining portions of the third and fourth recesses 1622a and 1622b that protrude outside the mounting parts 1621a and 1621b and removing the remaining upper portions of the protrusions.

When the foldable electronic device is in a flat state (e.g., when the first hinge plate 141 and the second hinge plate 142 are arranged side by side), the third mounting part 1621a and the fourth mounting part 1621b may be located between the first mounting part 1613a and the second mounting part 1613b. The interval between the third mounting part 1621a and the fourth mounting part 1621b may be shorter than the interval between the first mounting part 1613a and the second mounting part 1613b. The first to fourth mounting parts 1613a, 1613b, 1621a, and 1621b may have the same thickness or similar thicknesses.

When the foldable electronic device is in a folded state (e.g., when the first hinge plate 141 and the second hinge plate 142 face each other), the first plate coupling part 1610 connected to the first hinge plate 141 and the second plate coupling part 1620 connected to the second hinge plate 142 may face each other. The first mounting part 1613a may be spaced apart from the third mounting part 1621a at a predetermined interval, and the second mounting part 1613b may be spaced apart from the fourth mounting part 1621b at the predetermined interval. The recesses 1614a, 1614b, 1622a, and 1622b may be fastened with, or separated from, each other while the first to fourth mounting parts 1613a, 1613b, 1621a, and 1621b rotate by a specified angle in the hinge housing 150.

The second detent structure 1600b may be arranged in the same direction as, or in a different direction from, the first detent structure 1600a. The first plate coupling part 1610 of the second detent structure 1600b may be connected to the second hinge plate 142, and the second plate coupling part 1620 of the second detent structure 1600b may be connected to the first hinge plate 141.

The hinge module 200 may include the hinge housing 150 and the detent structure 1600a mounted in the hinge housing 150. The detent structure 1600a may include the first plate coupling part 1610 connected with a first housing structure 121 and the second plate coupling part 1620 connected with a second housing structure 122. The first plate coupling part 1610 may include the first basic body 1611, the first wing 1612a and the second wing 1612b that extend from the opposite ends of the first basic body 1611 so as to be perpendicular to the first basic body 1611, the first mounting part 1613a vertically extending from the first wing 1612a, and the second mounting part 1613b vertically extending from the second wing 1612b. The second plate coupling part 1620 may include the second basic body 1621, the bridge 1624 connected to the second basic body 1621, and the third mounting part 1621a and the fourth mounting part 1621b that extend from the opposite edges of the bridge 1624 so as to be perpendicular to the bridge 1624. The first mounting part 1613a and the second mounting part 1613b may have the first recess 1614a and the second recess 1614b formed on the surfaces facing the first mounting part 1613a and the second mounting part 1613b, respectively, and the third mounting part 1621a and the fourth mounting part 1621b may have the third recess 1622a and the fourth recess 1622b formed on the surfaces facing the third mounting part 1621a and the fourth mounting part 1621b, respectively. When the first housing structure and the second housing structure are in a flat state, the first recess 1614a may be fastened with the third recess 1622a, and the second recess 1614b may be fastened with the fourth recess 1621b.

Figure 16A:
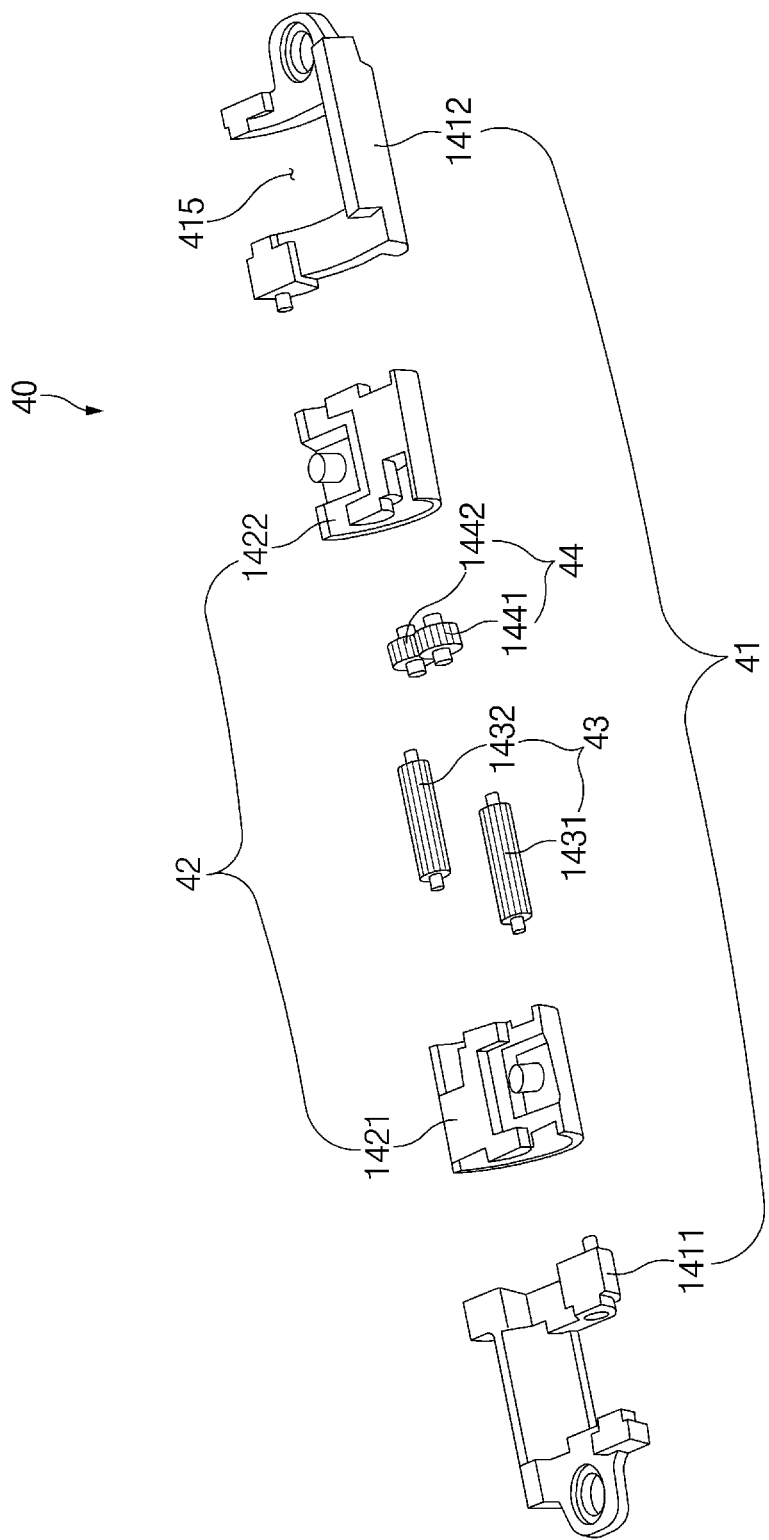
FIG. 16A is an exploded perspective view of a third hinge structure of the foldable electronic device in the second state, according to an embodiment.
Figure 16B:
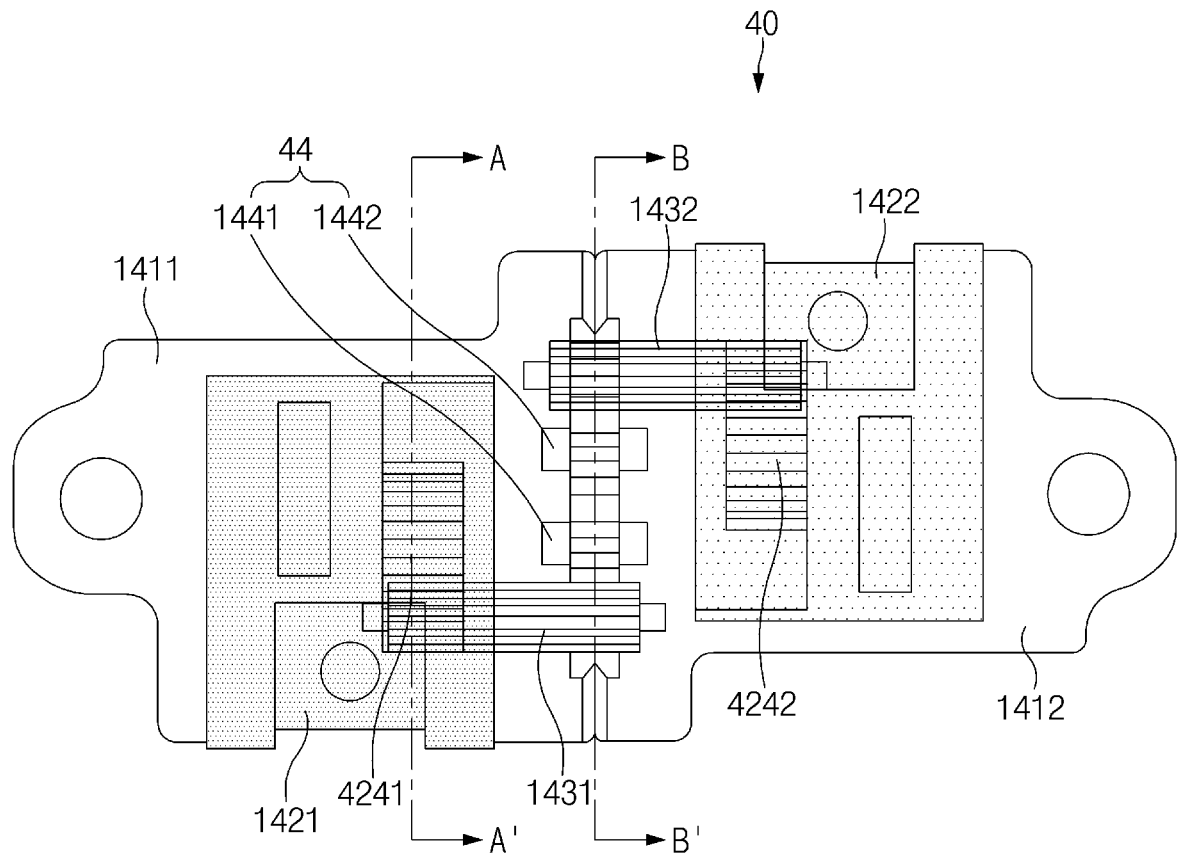
FIG. 16B is a sectional view illustrating an arrangement area of the third hinge structure of the foldable electronic device in the first state, according to an embodiment.

FIG. 16A is an exploded perspective view of a third hinge structure of the foldable electronic device in the second state, according to an embodiment. FIG. 16B is a sectional view illustrating an arrangement area of the third hinge structure of the foldable electronic device in the first state, according to an embodiment.

Referring to FIGS. 16A and 16B, insertion spaces 415, each of which is surrounded by a plurality of inner walls, are formed in main brackets 1411 and 1412 of the third hinge structure 40, and inner brackets 1421 and 1422 may be inserted into the insertion spaces 415. Even though shock is applied to the electronic device (e.g., the foldable electronic device 100), separation of assembled parts may be prevented, and the number of parts may be decreased, which results in a decrease in failure rate.

To achieve this, the third hinge structure 40 for connecting a plurality of housings of the electronic device may include the plurality of main brackets 1411 and 1412 including the insertion spaces 415, each of which is surrounded by the plurality of inner walls, the plurality of inner brackets 1421 and 1422 that are inserted into the insertion spaces 415 and that include internal gears 4241 and 4242 therein and rotate along predetermined rotational paths, and a plurality of main shafts 1431 and 1432 that include gears formed on the outer circumferential surfaces thereof and engaged with the internal gears 4241 and 4242 and that rotate together when the plurality of inner brackets 1421 and 1422 rotate.

The main brackets 1411 and 1412 may be fixed to the hinge housing 150 and may serve as a body of the third hinge structure 40 to which other parts are assembled. The main brackets 1411 and 1412 may include the insertion spaces 415, each of which is surrounded by the plurality of inner walls. The number of main brackets is not limited to two main brackets 1411 and 1412, and a various number of main brackets (e.g., three or more main brackets) may be formed.

The inner brackets 1421 and 1422 may be inserted into the insertion spaces 415 included in the main brackets 1411 and 1412 and may be fixed to the first housing 121 and the second housing 122 to rotate the first housing 121 and the second housing 122. The inner brackets 1421 and 1422 may include the internal gears 4241 and 4242 therein. The number of inner brackets is not limited to two inner brackets 1421 and 1422, and a various number of inner brackets (e.g., three or more inner brackets) may be formed.

The gears may be formed on the outer circumferential surfaces of the main shafts 1431 and 1432 having an elongated shape and may be engaged with the internal gears 4241 and 4242. The main shafts 1431 and 1432 may rotate together when the inner brackets 1421 and 1422 rotate. The number of main shafts is not limited to two, and a various number of main shafts may be formed depending on the number of inner brackets.

The third hinge structure 40 may further include idle gears 1441 and 1442. The idle gears 1441 and 1442 may be engaged with the gears of the main shafts 1431 and 1432 and may connect to the plurality of main shafts 1431 and 1432. Accordingly, the idle gears 1441 and 1442 may transmit the rotary power of the first main shaft 1431 to the second main shaft 1432. The third hinge structure 40 may not include the idle gears 1441 and 1442. In this case, the plurality of main shafts 1431 and 1432 may directly engage with each other.

As illustrated in FIGS. 16A and 16B, the insertion spaces 415, each of which is surrounded by the plurality of inner walls, is formed in the main brackets 1411 and 1412 of the third hinge structure 40, and the inner brackets 1421 and 1422 may be inserted into the insertion spaces 415. The plurality of inner walls may include a pair of inner walls. The pair of inner walls may be disposed on opposite sides of each of the main brackets 1411 and 1412 in the direction of axes of rotation A.R.I of the inner brackets 1421 and 1422. When the first inner bracket 1421 rotates, the rotary power may be sequentially transmitted to the first internal gear 4241, the first main shaft 1431, the first idle gear 1441, the second idle gear 1442, the second main shaft 1432, and the second internal gear 4241, and thus the second inner bracket 1422 may also rotate together.

Figure 17:
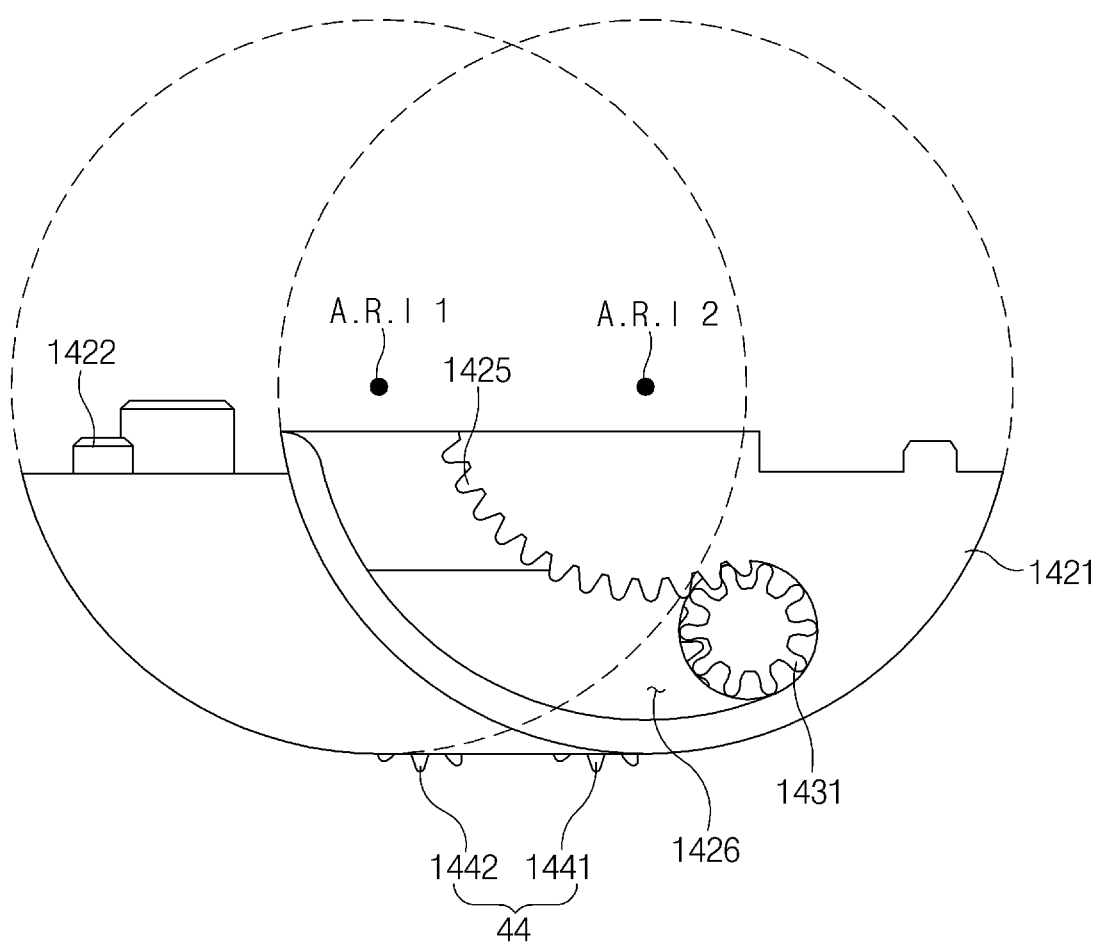
FIG. 17 is a sectional view of the third hinge structure taken along line A-A' of FIG. 16B, according to an embodiment.

FIG. 17 is a sectional view of the third hinge structure 40 taken along line A-A' of FIG. 16B, according to an embodiment.

Referring to FIGS. 16A-17, in the electronic device (e.g., the foldable electronic device 100 of FIG. 2), the first housing structure 121 and the second housing structure 122 are connected to rotate relative to each other. For example, when a user rotates the first housing structure 121 or the second housing structure 122 to fold the electronic device in an unfolded state, the inner bracket 1421 or 1422 fixed to the first housing structure 121 or the second housing structure 122 through the first hinge plate 141 or the second hinge plate 142 may rotate about the axis of rotation A.RI. along a predetermined rotational path. Because the inner brackets 1421 and 1422 are fixed to the first housing structure 121 and the second housing structure 122, the rotational paths of the inner brackets 1421 and 1422 may correspond to the paths along which the first housing structure 121 and the second housing structure 122 are folded or unfolded. Additionally, the axes of rotation A.R.I of the inner brackets 1421 and 1422 may correspond to the axes of rotation of the first housing structure 121 and the second housing structure 122 fixed to the inner brackets 1421 and 1422 and may be parallel to the axis of symmetry of the first housing structure 121 and the second housing structure 122.

Circles with a predetermined radius may be drawn about the axes of rotation A.R.I of the inner brackets 1421 and 1422 as illustrated in FIG. 17. The lower surfaces of the inner brackets 1421 and 1422 may have arc shapes existing on the circles to minimize interference when the inner brackets 1421 and 1422 rotate. For example, the lower surfaces of the inner brackets 1421 and 1422 may have arc shapes with the axes of rotation A.R.I of the inner brackets 1421 and 1422 as the centers thereof.

When the inner brackets 1421 and 1422 rotate, the main shafts 1431 and 1432 may also rotate. The axes of rotation A.M. of the main shafts 1431 and 1432 may correspond to the central axes of the main shafts 1431 and 1432, but may differ from the axes of rotation A.R.I of the inner brackets 1421 and 1422. Accordingly, when the inner brackets 1421 and 1422 rotate, the inner brackets 1421 and 1422 may move away from the main brackets 1411 and 1412 such that the upper surfaces of the inner brackets 1421 and 1422 that are fixed to the hinge plates 141 and 142 have a predetermined angle. In contrast, the main shafts 1431 and 1432 may rotate without moving away from the main brackets 1411 and 1412. Accordingly, when the inner brackets 1421 and 1422 rotate, the main shafts 1431 and 1432 may move relative to the inner brackets 1421 and 1422.

The inner brackets 1421 and 1422 may include movement spaces 1426 in which the main shafts 1431 and 1432 are movable. The rotational paths of the inner brackets 1421 and 1422 may correspond to the travel paths along which the main shafts 1431 and 1432 move in the inner brackets 1421 and 1422, and the directions may be opposite to each other. Accordingly, the movement spaces 1426 may also have arc shapes with the axes of rotation A.R.I of the inner brackets 1421 and 1422 as the centers thereof.

The inner brackets 1421 and 1422 may include the internal gears 4241 and 4242 therein. The internal gears 4241 and 4242 may be engaged with the gears of the main shafts 1432 and 1432. Accordingly, when the inner brackets 1421 and 1422 rotate, the internal gears 4241 and 4242 may rotate the main shafts 1431 and 1432. As illustrated in FIG. 17, the internal gear 4241 may have an arc shape with the axis of rotation A.R.I. 2 of the inner bracket 1421 as the center thereof.

Gear teeth of the internal gears 4241 and 4242 may protrude toward the movement spaces 1426. The gear teeth of the internal gears 4241 and 4242 may protrude away from the inner circumferential surfaces of the movement spaces 1426 in the radial directions with respect to the respective axes of rotations A.R.I 1 and A.R.I 2 of the inner brackets 1421 and 1422. The gear teeth of the internal gears 4241 and 4242 may protrude from the outer circumferential surfaces of the movement spaces 1426 in directions toward the respective axes of rotations A.R.I 1 and A.R.I 2 of the inner brackets 1421 and 1422.

The axis of rotation of the first housing structure 121 and the axis of rotation A.R.I 1 of the first inner bracket 1421 may be the same as each other, and the axis of rotation of the second housing structure 122 and the axis of rotation A.R.I 2 of the second inner bracket 1422 may be the same as each other. The axis of rotation A.R.I 1 of the first inner bracket 1421 may differ from the axis of rotation A.R.I 2 of the second inner bracket 1422. If the axes of rotations of the inner brackets 1421 and 1422, respectively A.R.I 1 and A.R.I 2, are the same as each other, the first inner bracket 1421 and the second inner bracket 1422 may interfere with each other while rotating. Accordingly, the axes of rotation of the first housing structure 121 and the second housing structure 122 may differ from each other.

Figure 18:
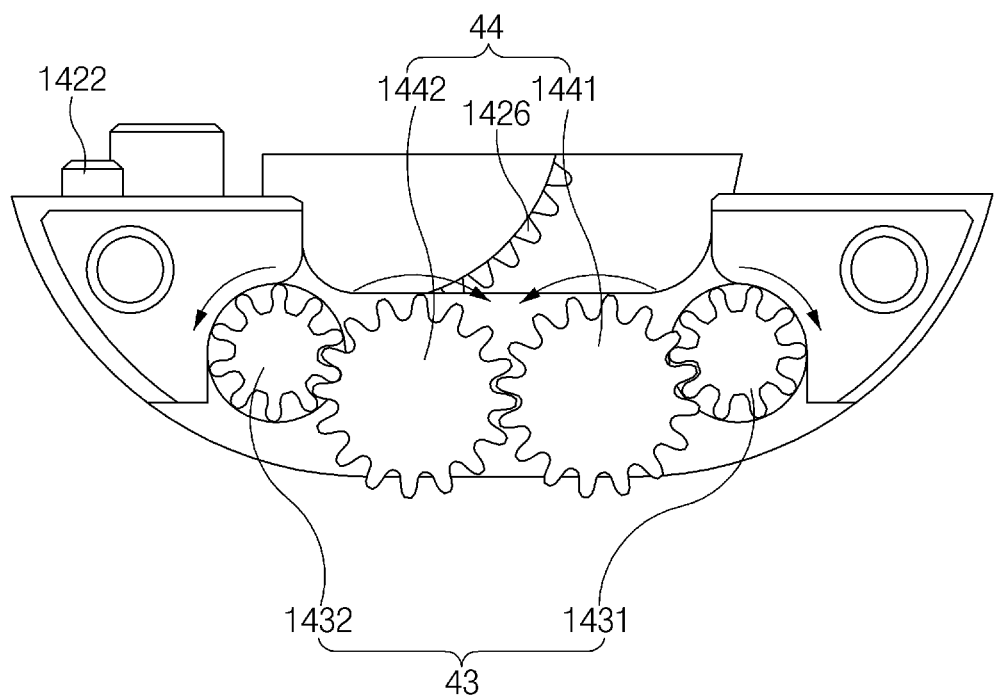
FIG. 18 is a sectional view of the third hinge structure taken along line B-B' of FIG. 16B, according to an embodiment.

FIG. 18 is a sectional view of the third hinge structure 40 taken along line B-B' of FIG. 16B, according to an embodiment.

Referring to FIGS. 16A to 18, when the first housing structure 121 rotates, the first inner bracket 1421 fixed to the first housing structure 121 through the first hinge plate 141 may rotate. The first main shaft 1431 may be rotated by the first internal gear 4241 of the first inner bracket 1421 that is engaged with the gear of the first main shaft 1431.

As illustrated in FIG. 18, the first main shaft 1431, the first idle gear 1441, the second idle gear 1442, and the second main shaft 1432 are sequentially engaged with each other. The rotary power of the first main shaft 1431 may be transmitted to the first idle gear 1441, the second idle gear 1442, and the second main shaft 1432.

When a user rotates the first housing structure 121 to fold the electronic device in an unfolded state, the first internal gear 4241 of the first inner bracket 1421 may rotate the first main shaft 1431 in the clockwise direction with respect to FIG. 18. The first main shaft 1431 may transfer the rotary power from the first internal gear 4241 to the first idle gear 1441 and may rotate the first idle gear 1441 in the counterclockwise direction with respect to FIG. 18. The first idle gear 1441 may transfer the rotary power from the first main shaft 1431 to the second idle gear 1442 and may rotate the second idle gear 1442 in the clockwise direction with respect to FIG. 18. The second idle gear 1442 may transfer the rotary power from the first idle gear 1441 to the second main shaft 1432 and may rotate the second main shaft 1432 in the counterclockwise direction with respect to FIG. 18.

The second main shaft 1432 may transfer the rotary power from the second idle gear 1442 to the second internal gear 4242 of the second inner bracket 1422. Accordingly, the second housing structure 122 fixed to the second inner bracket 1422 through the second hinge plate 142 may rotate.

Figure 19:
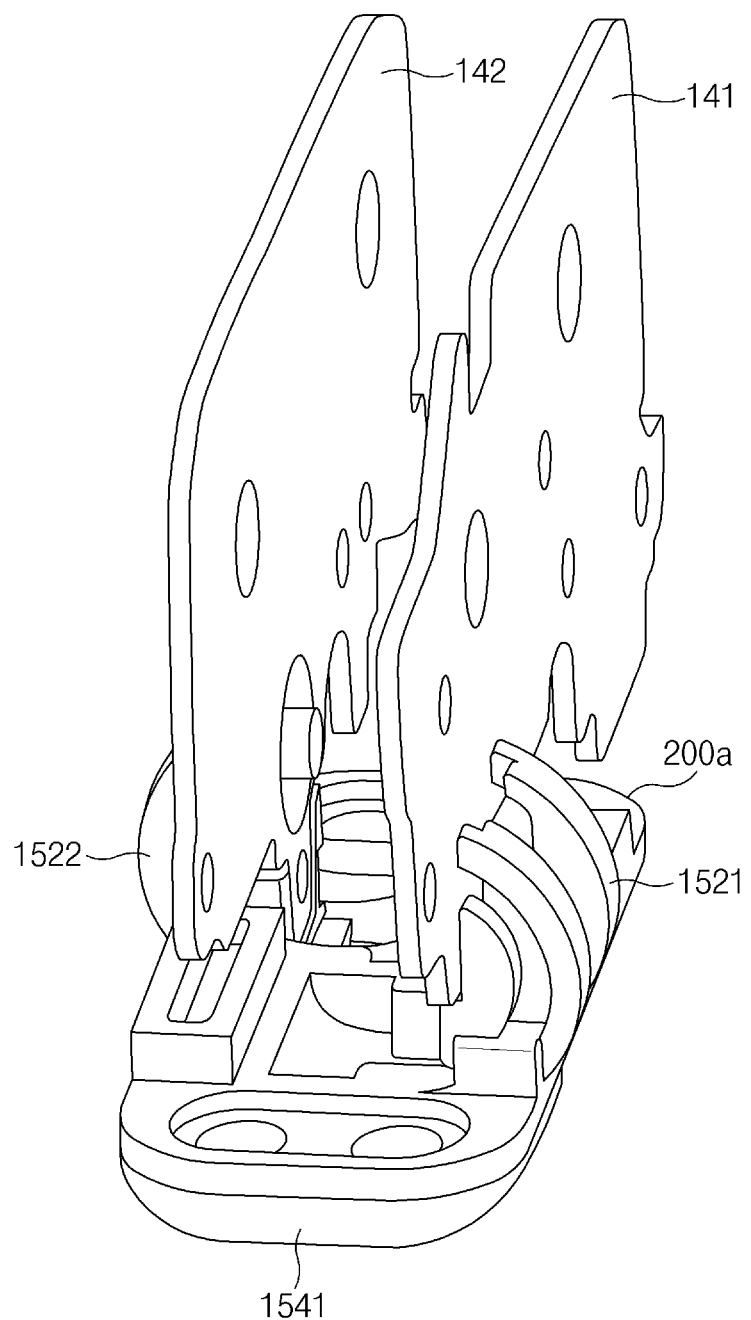
FIG. 19 is a view illustrating a first hinge structure or a second hinge structure of the foldable electronic device, according to an embodiment.
Figure 20A:
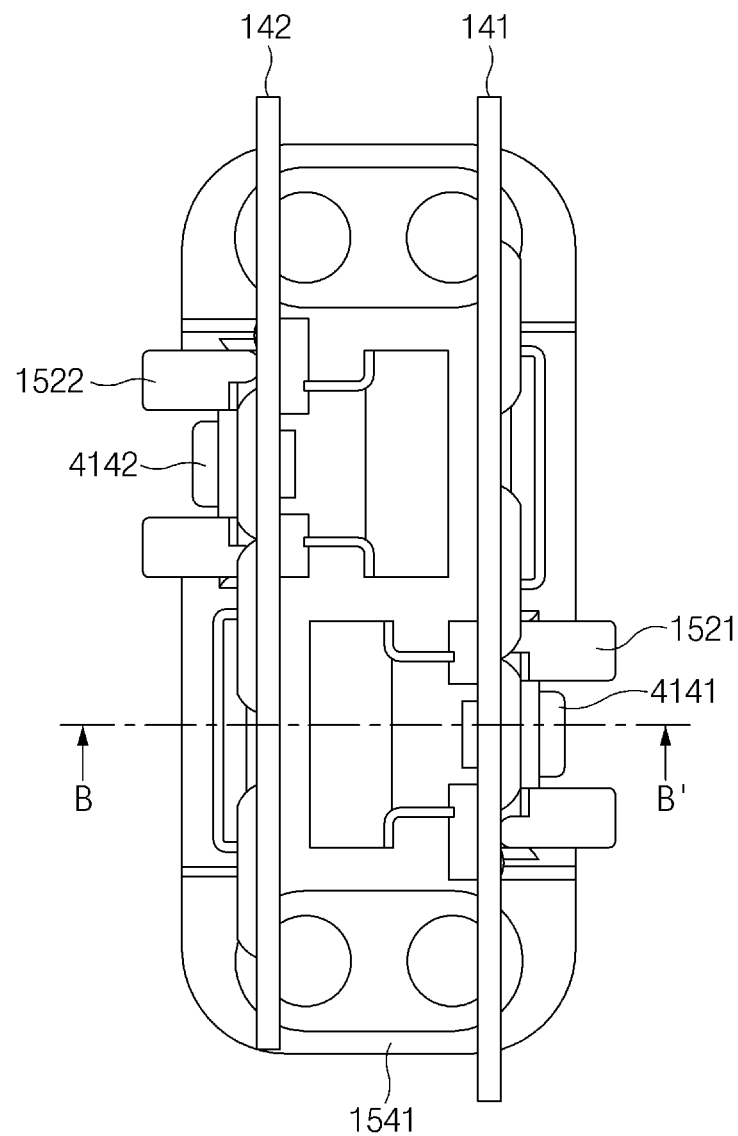
FIG. 20A is a top view of the hinge structure of FIG. 19, according to an embodiment.
Figure 20B:
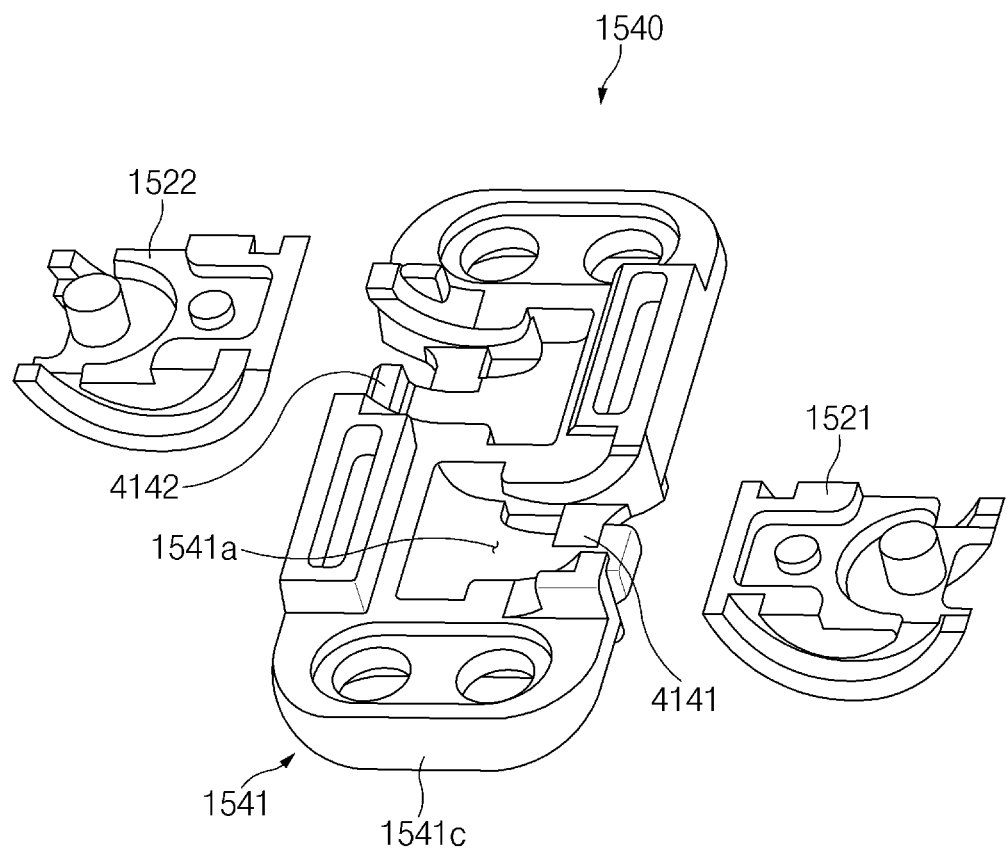
FIG. 20B is an exploded perspective view of the hinge structure of FIG. 19, according to an embodiment.
Figure 20C:
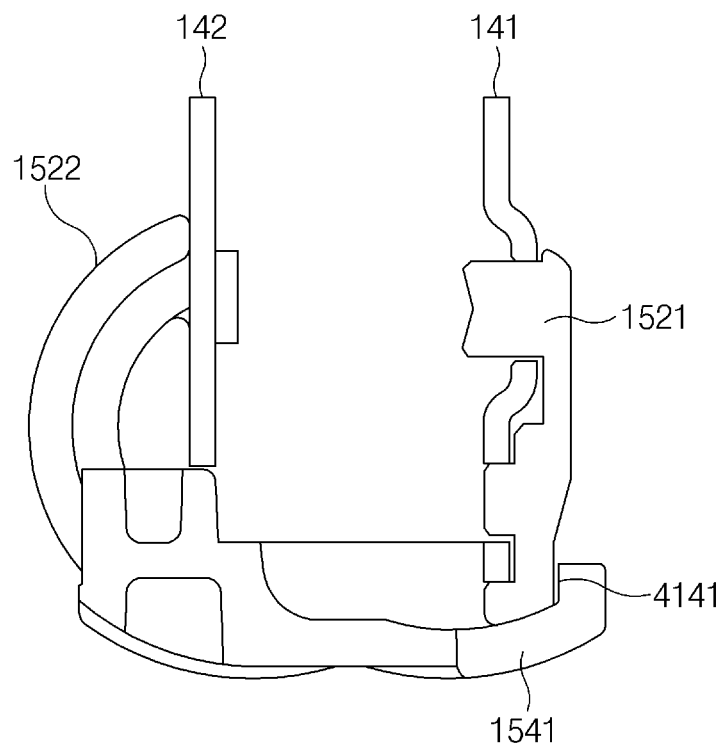
FIG. 20C is a sectional view illustrating a coupled state of the hinge structure and hinge plates of FIG. 19, according to an embodiment.

FIG. 19 is a view illustrating the first hinge structure or the second hinge structure of the foldable electronic device, according to an embodiment. FIG. 20A is a top view of the hinge structure of FIG. 19, according to an embodiment. FIG. 20B is an exploded perspective view of the hinge structure of FIG. 19, according to an embodiment. FIG. 20C is a sectional view illustrating a coupled state of the hinge structure and hinge plates of FIG. 19, according to an embodiment.

Referring to FIGS. 19-20C, the first hinge structure 200a (or the second hinge structure 200b) include a first hinge bracket 1521 connected to the first hinge plate 141, a second hinge bracket 1522 connected to the second hinge plate 142, and a center bracket 1541 on which the first hinge bracket 1521 and the second hinge bracket 1522 are mounted.

The center bracket 1541 may have a predetermined length and width so as to be mounted in the hinge housing 150, and at least part of the lower portion of the center bracket 1541 may include a curved surface to correspond to the inner surface of the hinge housing 150. The center bracket 1541 may include a first rail part 1541a in which the first hinge bracket 1521 is mounted and performs a hinge motion, a second rail part 1541b in which the second hinge bracket 1522 is mounted and performs a hinge motion, and a bracket body 1541c having the first rail part 1541a formed on one side thereof and the second rail part 1541b formed on an opposite side thereof.

The first hinge bracket 1521 may have a semicircular cross-section and may be inserted into the first rail part 1541a in a first rotational direction and thereafter disposed to perform hinge motion in the first rotational direction. A first stopper 4141 formed on the center bracket 1541 may prevent the first hinge bracket 1521 from rotating more than a specified angle in the first rotational direction, and thus the first hinge bracket 1521 may not be separated from the center bracket 1541.

The second hinge bracket 1522 may have substantially the same structure and size as the first hinge bracket 1521. The second hinge bracket 1522 may have a semicircular cross-section and may be inserted into the second rail part 1541b in a second rotational direction and thereafter disposed to perform hinge motion in the second rotational direction. A second stopper 4142 formed on the center bracket 1541 may prevent the second hinge bracket 1522 from rotating more than a specified angle in the second rotational direction, and thus the second hinge bracket 1522 may not be separated from the center bracket 1541.

An electronic device 100 according to an embodiment may include a hinge housing 150, a hinge structure 300 that is disposed in the hinge housing, a first housing structure 121 that rotates about a first axis A.R.I 2 that extends along the hinge structure, a second housing structure 122 that rotates about a second axis A.R.I 1 that is parallel to the first axis, a flexible display (e.g., the display 110) that includes a first area disposed on the first housing structure and a second area disposed on the second housing structure, and a first detent structure (e.g., the third detent structure 400c) that is disposed in the hinge housing. The first detent structure may include a first member (e.g., the second plate coupling part 420) that is connected to the first housing structure and includes a first through-hole (e.g., the first fixing hole 422_1) and a second through-hole (e.g., the second fixing hole 422_2) spaced apart from the first axis and the second axis and are arranged parallel to a third axis 601, a second member (e.g., the first plate coupling part 410) that is connected with the second housing structure and that has a structure for receiving part of the first member and includes a first recess or a first opening (e.g., the first mounting hole 431c) and a second recess or a second opening (e.g., the second mounting hole 432c) that face the first through-hole and the second through-hole, respectively, in an unfolded state, a first ball (e.g., the first mounting part 431) that is to coupled with the first through-hole and disposed between the first through-hole and the first recess or the first opening in the unfolded state, a second ball (e.g., the second mounting part 432) that is coupled with the second through-hole and disposed between the second through-hole and the second recess or the second opening in the unfolded state, and an elastic member (e.g., 430 that is located in the first member between the first ball and the second ball and that presses the first ball and the second ball outward.

The electronic device may further include a second detent structure (e.g., the fourth detent structure 400d) that is located in the hinge housing. The second detent structure may include a third member (e.g., the third plate coupling part 410_2) that is connected to the second housing structure and that includes a third through-hole (e.g., the third fixing hole 422_3) and a fourth through-hole (e.g., the fourth fixing hole 422_4) that are spaced apart from the first axis, the second axis, and the third axis and arranged parallel to a fourth axis 602 in a folded state, a fourth member (e.g., the fourth plate coupling part 420_2) that is connected with the first housing structure and that has a structure for receiving part of the third member and includes a third recess or a third opening (e.g., the third mounting hole 413_2) and a fourth recess or a fourth opening (e.g., the fourth mounting hole 414_2) that face the third through-hole and the fourth through-hole, respectively, in the unfolded state, a third ball (e.g., the third mounting part 431_2) that is coupled with the third through-hole and disposed between the third through-hole and the third recess or the third opening in the unfolded state, a fourth ball (e.g., the fourth mounting part 432_2) that is coupled with the fourth through-hole and disposed between the fourth through-hole and the fourth recess or the fourth opening in the unfolded state, and a second elastic member 430_2 that is located in the third member between the third ball and the fourth ball and that presses the third ball and the fourth ball outward.

A foldable electronic device 100 may include a foldable housing (e.g., the hinge module 200) that includes a hinge structure (e.g., the third hinge structure 300), a first housing structure 121 that is connected to the hinge structure and that includes a first surface 121 and a second surface 121*b* that is opposite to the first surface, a second housing structure 122 that is connected to the hinge structure and that includes a third surface 122*a* and a fourth surface 122*b* that is opposite to the third surface, and a hinge housing 150, in which the first housing structure is foldable about the hinge structure with the second housing structure, the first surface faces the third surface in a folded state, the first surface and the third surface face the same direction in an unfolded state, and between the folded state and the unfolded state, the first housing structure is rotatable about a first axis (e.g., the axis of rotation A.R.I 1) that extends along the hinge structure and the second housing structure is rotatable about a second axis (e.g., the axis of rotation A.R.I 2) parallel to the first axis, a flexible display (e.g., the display 110) that includes a first area 51 that is disposed on the first housing structure and a second area 52 that is disposed on the second housing structure, in which the first area and the second area form the first surface and the third surface together, and a first detent structure (e.g., the detent structure 400*c*) that is disposed in the hinge housing 150, the first detent structure including a first member (e.g., the second plate coupling part 420) that is connected to the first housing structure and that includes a first through-hole (e.g., the first fixing hole 422_1) and a second through-hole (e.g., the second fixing hole 422_2) that are aligned along a third axis (e.g., the virtual axis 601) that is spaced apart from and parallel to the first axis and the second axis, a second member (e.g., the first plate coupling part 410) that is connected with the second housing structure and formed to receive part of the first member in the unfolded state and that includes a first recess or a first opening (e.g., the first mounting hole 413*c*) that faces the first through-hole and a second recess or a second opening (e.g., the second mounting hole 414*c*) that faces the second through-hole, a first ball (e.g., the first mounting part 431) that is coupled with the first through-hole and is disposed between the first through-hole and the first recess or the first opening in the unfolded state, a second ball (e.g., the second mounting part 432) that is coupled with the second through-hole and is disposed between the second through-hole and the second recess or the second opening in the unfolded state, and a first elastic member (e.g., the elastic member 430) that is located in the first member between the first ball and the second ball and that presses the first ball and the second ball outward.

The foldable electronic device may further include a second detent structure (e.g., the detent structure 400*d*) that is located in the hinge housing. The second detent structure may include a third member (e.g., the fourth plate coupling part 420_2) that is connected to the second housing structure and that includes a third through-hole (e.g., the third fixing hole 422_3) and a fourth through-hole (e.g., the fourth fixing hole 422_4) that are aligned along a fourth axis (e.g., the virtual axis 602) that is spaced apart from and parallel to the first axis, the second axis, and the third axis in the folded state, a fourth member (e.g., the third plate coupling part 410_2) that is connected with the first housing structure and is formed to receive part of the third member in the unfolded state and that includes a third recess or a third opening (e.g., the third mounting hole 413*c*_2) that faces the third through-hole and a fourth recess or a fourth opening (e.g., the fourth mounting hole 414_2) that faces the fourth through-hole, a third ball (e.g., the third mounting part 431_2) that is coupled with the third through-hole and is disposed between the third through-hole and the third recess or the third opening in the unfolded state, a fourth ball (e.g., the fourth mounting part 432_2) that is coupled with the fourth through-hole and is disposed between the fourth through-hole and the fourth recess or the fourth opening in the unfolded state, and a second elastic member 430_2 that is located in the third member between the third ball and the fourth ball and that presses the third ball and the fourth ball outward.

A hinge module 200 to which a first housing structure 121 and a second housing structure 122 are connected to perform hinge motion may include a hinge housing 150 and at least portion of a first detent structure (e.g., the detent structure 400*c*) that is mounted in the hinge housing. The first detent structure may include a first plate coupling part (e.g., the first plate coupling part 410) that is connected with the first housing structure and a second plate coupling part (e.g., the first plate coupling part 420) that is connected with the second housing structure. The first plate coupling part may include a first coupling body 411 and support portions 413 and 414 that are connected with the first coupling body and spaced apart from each other by a predetermined distance and that have mounting areas formed in predetermined positions. The second plate coupling part may include a second coupling body 421, a mounting body 422 that is connected to the second coupling body, fixing holes 422_1 and 422_2 that are formed on opposite sides of the mounting body, mounting parts 431 and 432 that are mounted in the fixing holes, and at least portion of an elastic member 430 that is mounted in the mounting body and that presses the mounting parts toward the mounting areas when the first housing structure and the second housing structure are in an unfolded state.

The hinge module may further include a second detent structure 400*d*. The second detent structure may include a third plate coupling part 410_2 that has the same structure as the first plate coupling part and that is connected to the second housing structure and a fourth plate coupling part 420_2 that has the same structure as the second plate coupling part and that is connected to the first housing structure.

The first plate coupling part may further include a bridge 412 that extends from the first coupling body, and the support portions may include a first support portion 413 that extends from the bridge in a first direction and a second support portion 414 that extends from the bridge in a second direction.

An end of the first support portion may be formed to be bent with a predetermined curvature in the first direction, and an end of the second support portion may be bent with a predetermined curvature in the second direction.

Each of the mounting parts may include at least portion of a column 432*c* that is mounted on one end of the elastic member, a protrusion 432*a* that extends from the column and has at least a portion mounted on the mounting area, and a flange 432*b* that is disposed between the column and the protrusion and that prevents the mounting part from being separated from the fixing hole.

At least a partial area of the protrusion opposite the mounting area may be formed in a cam or ridge shape.

The mounting area may be formed in the shape of a raised part protruding from the support portion.

At least a partial area of the protrusion opposite the mounting area may be formed in a ball shape.

The mounting area may be formed in the shape of a hole formed through the front and the back of the support portion.

The mounting area may be formed in a recess shape in which at least a portion of a surface of the support portion is formed with a step.

A hinge module 200 to which a first housing structure 121 and a second housing structure 122 are connected to perform hinge motion may include a hinge housing 150, at least portion of a plurality of detent structures 400a, 400b, 400c, and 400d that are mounted in the hinge housing and that provide a feeling of detent in a specified angle range in the hinge motion of the first housing structure and the second housing structure, at least portion of a first hinge structure 200a and at least portion of a second hinge structure 200b that are mounted in the hinge housing and are driven independently of each other, in which each of the first hinge structure and the second hinge structure is independently connected with the first housing structure and the second housing structure, and at least portion of a third hinge structure 300 that is mounted in the hinge housing and is connected with the first housing structure and the second housing structure and that includes an interlocking gear.

The first hinge structure may be disposed at one edge of the hinge housing, and the second hinge structure may be disposed at an opposite edge of the hinge housing.

The third hinge structure may be disposed between the first hinge structure and the second hinge structure.

At least one of the plurality of detent structures may be disposed between the first hinge structure and the third hinge structure, and at least one remaining detent structure may be disposed between the third hinge structure and the second hinge structure.

A second detent structure adjacent to the first detent structure among the plurality of detent structures may include a third plate coupling part that has the same structure as the first plate coupling part and that is connected to the second housing structure and a fourth plate coupling part that has the same structure as the second plate coupling part and that is connected to the first housing structure.

The first hinge structure or the second hinge structure may include a center bracket 1541, a first hinge bracket 1521 that is connected with the first housing structure and that rotates through a specified angle in a first direction, and a second hinge bracket 1522 that is connected to the second housing structure and that rotates through a specified angle in an opposite direction to the first direction. The first hinge bracket and the second hinge bracket may be disposed to be driven independently of each other.

The third hinge structure may include a first bracket 1421 that is connected to the first housing structure, a second bracket 1422 that is connected to the second housing structure, and a plurality of gears 43 and 44 that are disposed in relation to gear interlocking between the first bracket and the second bracket.

Each component (e.g., a module or a program) according to various embodiments may be composed of single entity or a plurality of entities, some of the above-described sub-components may be omitted, or other sub-components may be further included in various embodiments. Additionally or alternatively, after being integrated in one entity, some components (e.g., modules or programs) may identically or similarly perform the function executed by each corresponding component before integration. According to various embodiments, operations executed by modules, program, or other components may be executed by a successive method, a parallel method, a repeated method, or a heuristic method, or at least one part of operations may be executed in different sequences or omitted. Alternatively, other operations may be added.

According to the various embodiments, the hinge module including the detent structure and the foldable electronic device including the hinge module enable the housing structures to be more stably coupled to the hinge module.

Furthermore, according to the various embodiments, the hinge module including the detent structure and the foldable electronic device including the hinge module may provide a stable and firm feeling of detent to a user.

In addition, according to the various embodiments, the hinge module including the detent structure and the foldable electronic device including the hinge module enable a user to rapidly and easily implement a desired specific mounting angle.

While the disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:

1. An electronic device comprising: a foldable housing including: a hinge structure, a first housing structure connected to the hinge structure, the first housing structure including a first surface and a second surface opposite to the first surface, a second housing structure connected to the hinge structure, the second housing structure including a third surface and a fourth surface opposite to the third surface, and wherein the first housing structure is foldable about the hinge structure with the second housing structure, wherein in a folded state, the first surface faces the third surface, and in an unfolded state, the first surface and the third surface face the same direction, and wherein between the folded state and the unfolded state, the first housing structure is rotatable about a first axis extending along the hinge structure, and the second housing structure is rotatable about a second axis parallel to the first axis; a flexible display including a first area disposed on the first housing structure and a second area disposed on the second housing structure, wherein the first area and the second area form the first surface and the third surface; and a first detent structure, wherein the first detent structure includes: a first member connected to the first housing structure, the first member including a first through-hole and a second through-hole that are aligned along a third axis that is spaced apart from and parallel to the first axis and the second axis, a second member connected with the second housing structure and formed to receive part of the first member in the unfolded state, the second member including a first recess or a first opening configured to face the first through-hole and a second recess or a second opening configured to face the second through-hole, a first ball coupled with the first through-hole and disposed between the first through-hole and the first recess or the first opening in the unfolded state, a second ball coupled with the second through-hole and disposed between the second through-hole and the second recess or the second opening in the unfolded state, and a first elastic member located in the first member between the first ball and the second ball and configured to press the first ball and the second ball outward, wherein each of the first ball and the second ball includes: a column mounted on one end of the elastic member; a protrusion extending from the column and having at least a portion mounted on a mounting area; and a flange disposed between the column and the protrusion and configured to prevent each of the first ball and the second ball from separating from the first through-hole and the second through-hole, respectively.

2. The electronic device of claim 1, further comprising a second detent structure, wherein the second detent structure includes: a third member connected to the second housing structure, the third member including a third through-hole and a fourth through-hole that are aligned along a fourth axis that is spaced apart from and parallel to the first axis, the second axis, and the third axis in the folded state, a fourth member connected with the first housing structure and formed to receive part of the third member in the unfolded state, the fourth member including a third recess or a third opening configured to face the third through-hole, and the fourth member further including a fourth recess or a fourth opening configured to face the fourth through-hole, a third ball coupled with the third through-hole and disposed between the third through-hole and the third recess or the third opening in the unfolded state, a fourth ball coupled with the fourth through-hole and disposed between the fourth through-hole and the fourth recess or the fourth opening in the unfolded state, and a second elastic member located in the third member between the third ball and the fourth ball and configured to press the third ball and the fourth ball outward.

3. A hinge module to which a first housing structure and a second housing structure are connected to perform a hinge motion, the hinge module comprising: a first detent structure, wherein the first detent structure includes: a first plate coupling part connected with the first housing structure, and a second plate coupling part connected with the second housing structure, wherein the first plate coupling part includes: a first coupling body, and support portions connected with the first coupling body and spaced apart from each other by a predetermined distance, the support portions having mounting areas formed in predetermined positions, wherein the second plate coupling part includes: a second coupling body, a mounting body connected to the second coupling body, fixing holes formed on opposite sides of the mounting body, mounting parts mounted in the fixing holes, and an elastic member mounted in the mounting body and configured to press the mounting parts toward the mounting areas when the first housing structure and the second housing structure are in an unfolded state, wherein the first plate coupling part further includes a bridge extending from the first coupling body, wherein the support portions include a first support portion extending from the bridge in a first direction and a second support portion extending from the bridge in a second direction, and wherein an end of the first support portion is formed to be bent with a first predetermined curvature, and wherein an end of the second support portion is formed to be bent with a second predetermined curvature.

4. The hinge module of claim 3, further comprising a second detent structure, wherein the second detent structure includes:
a third plate coupling part having the same structure as the first plate coupling part, the third plate coupling part being connected to the second housing structure, and
a fourth plate coupling part having the same structure as the second plate coupling part, the fourth plate coupling part being connected to the first housing structure.

5. The hinge module of claim 3, wherein each of the mounting parts includes:
a column mounted on one end of the elastic member;
a protrusion extending from the column and having at least a portion mounted on the mounting area; and
a flange disposed between the column and the protrusion and configured to prevent the mounting part from separating from the fixing hole.

6. The hinge module of claim 5, wherein at least a partial area of the protrusion opposite to the mounting area is formed in a cam or ridge shape.

7. The hinge module of claim 6, wherein the mounting area is formed in the shape of a raised part protruding from at least one of the support portions.

8. The hinge module of claim 5, wherein at least a partial area of the protrusion opposite to the mounting area is formed in a ball shape.

9. The hinge module of claim 8, wherein the mounting area is formed in a shape of a hole formed through a front and a back of the support portion.

10. The hinge module of claim 8, wherein the mounting area is formed in a recess shape in which at least a portion of a surface of the support portion is formed with a step.

11. A hinge module to which a first housing structure and a second housing structure are connected to perform a hinge motion, the hinge module comprising: a plurality of detent structures configured to provide a feeling of detent to a user in a specified angle range in the hinge motion of the first housing structure and the second housing structure; a first hinge structure and a second hinge structure driven independently of each other, wherein each of the first hinge structure and the second hinge structure is independently connected with the first housing structure and the second housing structure; and a third hinge structure connected with the first housing structure and the second housing structure, the third hinge structure including an interlocking gear, wherein a first detent structure of the plurality of detent structures includes: a first plate coupling part connected with the first housing structure; and a second plate coupling part connected with the second housing structure, wherein the first plate coupling part includes: a first coupling body, and support portions connected with the first coupling body and spaced apart from each other by a predetermined distance, the support portions having mounting areas formed in predetermined positions, and wherein the second plate coupling part includes: a second coupling body, a mounting body connected to the second coupling body, fixing holes formed on opposite sides of the mounting body, mounting parts mounted in the fixing holes, and an elastic member mounted in the mounting body and configured to press the mounting parts toward the mounting areas when the first housing structure and the second housing structure are in an unfolded state.

12. The hinge module of claim 11, further comprising a hinge housing in which at least portion of the third hinge structure is mounted, wherein the first hinge structure is disposed at one edge of the hinge housing, wherein the second hinge structure is disposed at an opposite edge of the hinge housing, wherein the third hinge structure is disposed between the first hinge structure and the second hinge structure, wherein at least one of the plurality of detent structures is disposed between the first hinge structure and the third hinge structure, and wherein at least one remaining detent structure is disposed between the third hinge structure and the second hinge structure.

13. The hinge module of claim 11, wherein a second detent structure adjacent to the first detent structure among the plurality of detent structures includes: a third plate coupling part having the same structure as the first plate coupling part, the third plate coupling part being connected to the second housing structure; and a fourth plate coupling part having the same structure as the second plate coupling part, the fourth plate coupling part being connected to the first housing structure.

14. The hinge module of claim 11, wherein the first hinge structure or the second hinge structure includes:
- a center bracket;
- a first hinge bracket connected with the first housing structure and configured to rotate more than a first specified angle in a first direction; and
- a second hinge bracket connected to the second housing structure and configured to rotate more than a second specified angle in an opposite direction to the first direction,
- wherein the first hinge bracket and the second hinge bracket are disposed to be driven independently of each other.

15. The hinge module of claim 11, wherein the third hinge structure includes:
- a first bracket connected to the first housing structure;
- a second bracket connected to the second housing structure; and
- a plurality of gears disposed to interlock the first bracket and the second bracket.

16. The hinge module of claim 11, further comprising shock-absorbing members disposed between the fixing holes and the mounting parts, respectively.

17. The hinge module of claim 16, wherein the shock-absorbing members include at least one ring mounted on the mounting parts, or
- wherein the shock-absorbing members include members formed to at least partially surround balls protruding outside the fixing holes.

* * * * *